United States Patent [19]

Kajiwara

[11] Patent Number: 5,733,136
[45] Date of Patent: Mar. 31, 1998

[54] SOCKET ASSEMBLY

[75] Inventor: Yasushi Kajiwara, Kawaguchi, Japan

[73] Assignee: Enplas Corporation, Saitama, Japan

[21] Appl. No.: 330,089

[22] Filed: Oct. 26, 1994

[30] Foreign Application Priority Data

| Oct. 27, 1993 | [JP] | Japan | 5-058105 |
| Apr. 7, 1994 | [JP] | Japan | 6-069679 |
| Apr. 7, 1994 | [JP] | Japan | 6-069680 |
| Apr. 7, 1994 | [JP] | Japan | 6-069681 |
| Apr. 21, 1994 | [JP] | Japan | 6-107925 |
| May 20, 1994 | [JP] | Japan | 6-130919 |
| Aug. 30, 1994 | [JP] | Japan | 6-205561 |
| Sep. 1, 1994 | [JP] | Japan | 6-208825 |
| Sep. 14, 1994 | [JP] | Japan | 6-219968 |

[51] Int. Cl.$^6$ .................................. H10R 13/193
[52] U.S. Cl. .................................. 439/259; 439/264
[58] Field of Search .................. 434/259–265, 434/330, 331, 525, 526

[56] References Cited

U.S. PATENT DOCUMENTS

| 3,329,926 | 7/1967 | Aksu et al. | 439/260 |
| 3,475,717 | 10/1969 | Lane | 439/260 |
| 3,899,234 | 8/1975 | Yeager et al. | 439/260 |
| 3,920,302 | 11/1975 | Cutchaw | 439/260 |
| 4,270,826 | 6/1981 | Narozny | 439/260 |

Primary Examiner—Hien Vu
Attorney, Agent, or Firm—Fish & Richardson P.C.

[57] ABSTRACT

A socket assembly for accommodating an IC chip or package (IC) provided with a socket body having a generally rectangular configuration. A plurality of flat plate-like contact pins are arranged forming rows in parallel with each other so as to form rows along four sides of the socket body, respectively. Each contact pin has a base portion and an arm which extends curved upward from the base portion. An upward contact portion for coming into contact with a terminal of an IC is formed on one end of the base portion of the contact pin, and a connecting portion for the connection to the printed circuit board is formed on the other end of the base portion. Four sliders are arranged along the four sides of the socket body, respectively. Each slider is supported by the base portions and arms of the row-forming contact pins and can move between an open position for accommodating the IC and a pressing position for pressing against the IC by an elastic force of the arms to bring the terminals of the IC into press-contact with the contact portions of the contact pins.

11 Claims, 46 Drawing Sheets

SOCKET ASSEMBLY

BACKGROUND OF THE INVENTION

1. Field of the Invention

The present invention relates to an improved socket assembly for accommodating an electronic or electrical component such as an integrated circuit chip or a package (IC) or a chip-on-board module etc. and for electrically connecting an electrical component to a printed circuit board.

2. Description of the Related Art

In general, an electronic or electrical component such as an integrated circuit chip or package (IC) or a chip-on-board module etc. is connected and affixed by directly soldering terminals such as leads or pads arranged along the sides of the electrical component onto the printed circuit board. On the other hand, where it is mounted on a printed circuit board for testing or the like in a manner enabling the electrical component to be easily replaced or where an electrical component in which the heat caused when soldering is liable to exert an adverse influence upon the internal circuits is mounted on a printed circuit board etc., generally use is made of a socket of a top loading type to accommodate the electrical component. As disclosed in Japanese Unexamined Patent Publication (Kokai) No. 64-3977 and Japanese Unexamined Patent Publication (Kokai) No. 2-51882, a conventional typical top load socket is provided with a generally rectangular configuration support frame or socket body made of a plastic. The socket body has a plurality of contact pins disposed in a row in parallel on each of the sides thereof. Each contact pin is provided with an external connecting portion for connection to a conductor pattern on the printed circuit board and a contact portion for coming into contact with a terminal of the electrical component. The socket body is further provided with a cap or a cover pressing against an upper surface of the electrical component mounted on the contact portions of the contact pins and an engagement piece for engaging the cover with the socket body at a position where the cover presses against the upper surface of the electrical component. The row-forming contact pins are defined in their intervals by partition walls or ribs provided in a row in parallel on the socket body. Further, the contact portions of the contact pins pass through a base plate of the socket body disposed on the printed circuit board and project beneath the same.

In the above-mentioned conventional socket, all terminals of the electrical component and all contact portions of all contact pins on the socket body are simultaneously brought into press-contact with each other by the pressing force of the cover and therefore when the number of the contact pins is increased, a very large pressing force becomes necessary so as to give a required contact pressure to the contact portions of the contact pins. Accordingly, an operation such as attachment, engagement, etc. of the cover becomes difficult. Accordingly, it is difficult to deal with higher density terminals in an electrical component such as an IC. Also, the electrical component is pressed from the top by a large force, and therefore this has become a cause of causing excessive stress in the electrical component or socket body. Also, if the strength of the socket body or cover is not sufficient, warping is produced in them, and as a result, the contact pressure of the contact pins becomes small, which becomes a cause of inducing poor contact. Particularly, in a high temperature environment, the plastic of the socket body undergoes stress relaxation, which further increases the warping.

Further, in the above-mentioned conventional socket, since the terminals of the electrical component and the contact portions of the contact pins are electrically connected by the contact pressure, poor conduction is apt to occur due to dirt, oxide film, etc. deposited on the terminals or contact portions. Accordingly, desirably, when the terminals of the electrical component come into contact with the contact portions of the contact pins, they should cause a so-called wiping action to remove the dirt, oxide film, etc. In the above-mentioned conventional socket, however, the electrical component positioned by the socket body is pressed in its thickness direction by the cover, and therefore it is difficult for a wiping action to occur between the electrical component and contact pins. Accordingly, it is difficult to enhance the reliability of the electrical connection between the electrical component and the contact pins.

A top load socket disclosed in U.S. Pat. No. 4,993,955 is provided with a plurality of contact pins arranged so as to form rows in parallel respectively along the sides of the support frame or the socket body and cams arranged along the sides of the socket body. Each contact pin has a curved arm portion and a contact portion formed at the free end of the arm portion for coming into contact with the upper surface of a terminal of the IC. In this socket, the contact pin can be operated by a cam for each row. However, the contact portions of the contact pins are brought into press-contact with the upper surface of the terminals of the IC due to the elastic force of the contact pins, and therefore the contact pressure between the contact portions of the contact pins and the IC depends on the spring constant of the contact pins. Also, since the contact pins press against the terminals of the IC from the top, hardly any wiping action occurs between the contact portions of the contact pins and the terminals of the IC.

Further, in the above-mentioned conventional socket, the partition walls or ribs defining the intervals in the row-forming contact pins are provided in the socket body so as to be aligned in a row. In this case, so as to reduce the pitch of the contact pins, it is necessary to use thin ribs. However, if the ribs are made thin, the strength thereof is lowered, and the shaping becomes difficult. Accordingly, there is a limit to making the pitch of the contact pins narrower.

Further, in the above-mentioned conventional socket, the socket body is placed on the printed circuit board and sandwiched between a part of the contact pins and the printed circuit board, and therefore in a state where the contact pins are soldered on the printed circuit board, the socket body cannot be detached from the printed circuit board. Also, the contact portions of the contact pins are positioned above the base plate of the socket body and the electrical component is mounted on the contact portions of the contact pins. Accordingly, there is a limit in suppression of the height of the electrical component mounted on the printed circuit board via the socket.

SUMMARY OF THE INVENTION

An object of the present invention is to provide a socket assembly which enables easy attachment and detachment of an electrical component without application of excessive stress to the electrical component or the printed circuit board and, in addition, can prevent variations in the electrical connection with the terminals of the electrical component.

Another object of the present invention is to provide a socket assembly which can ensure the electrical connection with the terminals of the electrical component.

Still another object of the present invention is to provide a socket assembly which can deal with the reduction of the terminal pitch of an electrical component.

A further object of the present invention is to provide a light weight and thin socket assembly.

According to the present invention, there is provided a socket assembly for accommodating an electrical component having a plurality of terminals and for electrically connecting the said electrical component to a printed circuit board, comprising:

a socket body having a generally rectangular configuration;

a plurality of flat plate-like contact pins which are arranged forming rows in parallel respectively along at least opposite sides of the said socket body, each of the said contact pins having a base portion and an arm which extends curved upward from the said base portion, the said base portion having at one end thereof an upward contact portion for contact to a terminal of the said electrical component and at the other end thereof a connecting portion for connection to the said printed circuit board; and a plurality of sliders each of which is supported by the said base portions and the said arms of the said row-forming contact pins and is movable between an open position for accommodating the said electrical component and a pressing position for pressing against the said electrical component by an elastic force of the said arms to bring the terminals of the said electrical component into contact with the said contact portions of the said contact pins.

In a socket assembly having the above-described configuration, after the electrical component is mounted on the contact portions of the contact pins, the sliders are moved from the respective open positions to the pressing positions, whereby at least opposite sides of the electrical component can be individually brought into press-contact with the contact portions of the contact pins. Accordingly, it is not necessary for one slider to ensure a pressing force enough to bring all terminals of the electrical component into contact with the contact portions of all contact pins by a required contact pressure. It is enough so far as it is a pressing force that can bring a row of terminals of the electrical component and the contact portions of a row of contact pins into contact with each other by a required contact pressure. Accordingly, it is possible to reduce the force necessary for the movement of the respective sliders, and therefore the attachment and detachment work of the electrical component becomes easy. Also, the electrical component is pressed by the sliders by the elastic force of the arms of the contact pins in the rows, and therefore even if there is a variation in the spring force of arms of the contact pins, the contact portions of the contact pins in the rows and the terminals of the electrical component will come into contact with each other by a uniform contact pressure.

Preferably, the slider has an upper surface pressing portion pressing against an upper surface of the electrical component and a side surface pressing portion pressing against a side surface of the electrical component. In this structure, the slider presses against the upper surface and side surface of the electrical component at the pressing position, and therefore it is possible to reliably produce a wiping action between the terminals of the electrical component and the contact portions of the contact pins by moving at least two sliders arranged on the opposite sides of the socket body in order from the open position to the pressing position. Accordingly, electrical connection between the contact pins and electrical component becomes reliable.

Further preferably, a plurality of ribs which are slidably fitted between the arms and the base portions of the contact pins in the row are formed on the upper surfaces and lower surfaces of the sliders.

It is also possible even if the socket body has a jig guide means which is engaged with the opposite end portions of the sliders and guides a jig for moving the sliders between the open position and the pressing position in a vertical direction. In this case, preferably the jig guide means has guide holes at four corners of the socket body and guide groove holes which are adjacent to the guide holes and formed along the opposite ends of the rows of the contact pins, pins positioned above the guide groove holes are provided at both ends of the sliders, and the jig has guide posts inserted into the guide holes and leg portions inserted into the guide groove holes, and inward or outward inclined surfaces are formed at the tips of the leg portions.

Further preferably, a plurality of ribs respectively fitted between the base portions of the row of the contact pins are formed on at least opposite sides of the socket body so as to form rows.

Further preferably, engagement grooves extending along the rows of the contact pins are formed in the at least opposite sides of the socket body and projection portions engaged with the engagement grooves are formed at the base portions of the rows of the said contact pins.

Also, according to the present invention, there is provided a socket assembly for accommodating an electrical component having a plurality of terminals and for electrically connecting the said electrical component to a printed circuit board, comprising:

a socket body having a generally rectangular configuration;

a plurality of flat plate-like contact pins which are arranged forming rows in parallel respectively along at least opposite sides of the said socket body, each of the said contact pins having a base portion and an arm which extends curved upward from the said base portion, the said base portion having at one end thereof an upward contact portion for contact to a terminal of the said electrical component and at the other end thereof a connecting portion for connection to the said printed circuit board; and a plurality of sliders which are respectively arranged along the said at least opposite sides of the said socket body, wherein each of the said slides has a movable member which is positioned on an upper side between the said base portions and the said arms of the said row-forming contact pins and which is movable between an open position for accommodating the said electrical component and a pressing position for pressing against the said electrical component by the elastic force of the said arms to bring the terminals of the said electrical component into press-contact with the said contact portions of the said contact pins, a stationary member which is positioned on an upper side between the said base portions and the said arms of the said row of contact pins and fixed on the said lower arms, and a driving member which is engaged with opposing surfaces of the said movable member and the said stationary member, the said driving member being rotatable to move the said movable member between the said open position and the said pressing position.

In the socket assembly having the above-described configuration, the movable member of the slider can be moved to the open position or the pressing position by pivoting the driving member of the slider.

Preferably, the stationary member of the slider has an upper surface pressing portion for pressing against an upper surface of the electrical component and a side surface pressing portion for pressing against a side surface of the electrical component.

Further preferably, the stationary member of the slider has an upper surface which comes into sliding contact with the arms of the row of contact pins and a lower surface which comes into sliding contact with the base portions, and a plurality of ribs which are respectively slidably fitted between the arms of the row of contact pins are formed on the upper surface of the stationary member so as to form a row.

Further preferably, a lever for pivotally operating the drive pinion is provided on both end portions of the driving member.

Further preferably, the driving member is a pinion engaging with racks formed on the opposing surfaces of the movable member and the stationary member.

Also, according to the present invention, there is provided a socket assembly for accommodating an electrical component having a plurality of terminals and for electrically connecting the said electrical component to a printed circuit board, comprising:

- a socket body having a generally rectangular configuration;
- a plurality of flat plate-like contact pins which are arranged forming rows in parallel respectively along at least opposite sides of the said socket body, each of the said contact pins having a base portion and an arm which extends curved upward from the said base portion, the said base portion having at one end thereof an upward contact portion for contact to a terminal of the said electrical component and at the other end thereof a connecting portion for connection to the said printed circuit board; and
- a plurality of sliders each of which is supported by the said base portions and the said arms of the said contact pins forming a row and is movable between an open position for accommodating the said electrical component and a pressing position for pressing against the said electrical component by an elastic force of the said arms to bring the terminals of the said electrical component into contact with the said contact portions of the said contact pins,
- wherein each slider has one end portion pressing against the electrical component and another end portion on an opposite side to the one end portion, a plurality of arm insertion holes for accommodating tip portions of the said arms of the said row-forming contact pins are formed on the said another end portion of the said slider, and the upper surface of the said slider covers the said arms of the said row-forming contact pins.

In the socket assembly having the above-described configuration, the slider is held by the arms so as to cover the upper surfaces of the arms of the row of contact pins, and therefore the slider is useful as a cover for protection of the upper surfaces of the contact pins. Also, it is possible to directly operate the slider from the top of the arms to easily slide the slider, and therefore a jig or an operating mechanism for performing the sliding operation of the slider from an external portion becomes unnecessary. Accordingly, the configuration of the socket assembly can be simplified.

Preferably, recesses for lowering the slider reaching near the pressing position are formed in the upper surfaces of the base portions in the vicinity of the contact portions of the contact pins, and the tip portions of the arms of the contact pins extend inclined toward the contact portions so that the spring force given to the slider is increased as the slider approaches the recesses.

Further preferably, a notch for abutting against the side surface and the upper surface of the electrical component is formed in one end portion of the slider.

Further preferably, the slider has an upper thick portion along the upper surfaces of the tip portions of the arms of the contact pins and a lower thick portion along the lower surfaces of the arms, the upper thick portion of the slider extends longer than the lower thick portion of the slider toward the other end portion side of the slider, insertion holes for the arms of the slider are opened in the end surface of the lower thick portion of the slider, and arm guide grooves continuing with the respective arm insertion holes are formed in the lower surface of the upper thick portion of the slider.

Further preferably, the slider has a slide contact portion projecting from the lower surface of one end portion thereof, and only the slide contact portion of the slider comes into sliding contact with the upper surface of the base portions of the contact pins.

Further preferably, guide ribs slidably engaged between the base portions of a row of contact pins are formed on and projected from the lower surface of the slider.

Also, according to the present invention, there is provided a socket assembly for accommodating an electrical component having a plurality of terminals and for electrically connecting the said electrical component to a printed circuit board, comprising:

- a socket body having a generally rectangular configuration; and
- a plurality of flat plate-like contact pins which are arranged forming a row in parallel along at least one side of the said socket body, each of the said contact pins having a base portion and a leg portion projected downward from the said base portion, the said base portion having at one end thereof an upward contact portion for contact to a terminal of the said electrical component and also having at the other end thereof a connecting portion for connection to the said printed circuit board,
- wherein two rows of slits into which the said leg portions of the said row of contact pins are inserted are arranged in a zigzag manner in the said socket body, first ribs for defining the intervals of contact pins inserted into one of the rows of the said slits and second ribs for defining the interval of the contact pins inserted into the said slits which form the other row are alternately arranged in a zigzag manner so as to form two rows, and contact pins inserted into the said slits forming the other row are disposed on the said first ribs.

As mentioned above, by dividing ribs for preventing the contact between the contact pins and adjoining contact pins into two groups and alternately arranging the contact pins and ribs of the respective groups, it is possible to reduce the pitch of the contact pins to a half of the pitch of the ribs.

Preferably, the first and second ribs are arranged in the vicinity of the contact portions of the contact pins in the row.

Further preferably, each of the contact pins has an arm which extends curved upward from the base portion, and the slider is supported by the base portions of the said row of contact pins and the arms and is movable between an open position for accommodating the electrical component and a pressing position for pressing against the upper surface and the side surface of the electrical component by the elastic force of the arms and bringing the terminals of the electrical component into press-contact with the contact portions of the contact pins.

It is also possible for the socket assembly to provide a pressing cap which is detachably engaged with the socket body so as to press against the upper surface of the electrical component to bring the terminals of the electrical component into press-contact with the contact portions of the contact pins.

Also, according to the present invention, there is provided a socket assembly for accommodating an electrical component having a plurality of terminals and for electrically connecting the electrical component to a printed circuit board, comprising:

a socket body;

a plurality of contact pins which are implanted on the said socket body and arranged forming a row in parallel along at least one side of the said socket body, each of the said contact pins having a contact portion for the contact with a terminal of the said electrical component;

a slider which is arranged along at least one side of the said socket body and movable between the open position for accommodating the said electrical component and the pressing position for pressing against the said electrical component to bring the terminals of the said electrical component into press-contact with the said contact portions of the said contact pins; and a spring means which is arranged along at least one side of the said socket body and gives a pressing force with respect to the said electrical component to the said slider, wherein the said row-forming contact pins have bent portions projected to one side thereof, the said slider has a pressing portion for pressing against an upper surface of the said electrical component and a plurality of engagement members engageable with the said bent portions, and the said engagement members are adapted to pass the said bent portions while resiliently displacing the said contact pins laterally during a period when the pressing portion of the said slider further advances along the upper surface of the electrical component after reaching the upper surface of the electrical component from the open position at which it retracts from the upper surface of the electrical component, whereby the said contact portions of the said contact pins are slid with respect to the said terminals of the said electrical component.

In the socket assembly having the above-described configuration, after the electrical component is mounted on the socket body and the terminals of the electrical component are brought into contact with the top of the contact portions of the contact pins, the sliders are moved from the open position and the pressing portions thereof are brought into press-contact with the upper surface of the electrical component by the spring force of the spring means, whereby it is possible to hold and secure the electrical component by the contact pins and the sliders and, at the same time, electrically bring the terminals of the electrical component into contact with the contact portions of the contact pins by a desired contact pressure. In this case, the vicinity of the top edge of the electrical component is held and secured by the contact pins and the sliders, and therefore it is possible to prevent an undesirable stress other than the compression stress in the vertical thickness direction, for example a bent moment etc. from acting upon the electrical component, and damage of the electrical component due to these undesirable stresses can be prevented.

In addition, bent portions projected to one side of the contact pins are provided in a part of the respective contact pins, a plurality of engagement members engageable with the bent portions of the contact pins are provided in the sliders, and the engagement members pass through the bent portions while resiliently displacing the contact pins to the side during a period when the pressing portions of the sliders further advance along the upper surface of the electrical component after reaching the upper surface of the electrical component from the open position, and therefore it is possible to produce a wiping action in a direction substantially orthogonal to the movement direction of the sliders (horizontal direction) between the contact portions of the contact pins and the terminals of the electrical component under a desired contact pressure during a period when the engagement member passes through the bent portions. This wiping can be reliably executed by a stroke determined in advance irrespective of the degree of standard difference of positioning of the electrical component with respect to the socket body, and therefore an electrical connection having a high reliability can be realized between the terminals of the electrical component and the contact portions of the contact pins.

Also, when the slider returns from the pressing position to the open position, the bent portions of the contact pins abut against the engagement members of the slider, thereby to serve in the role of a stopper with respect to the return thereof, and therefore it is possible to prevent the electrical component from carelessly being dropped from the socket body.

Preferably, the engagement members of the socket are arranged on opposite side surfaces of each aforesaid contact pin.

Further preferably, the bent portions of the contact pins are alternately projected in opposing directions in the order of arrangement of the contact pins.

Further preferably, each aforesaid contact pin is provided with a support portion extended downward from a space between the contact portion and the bent portion and the lower end portion of the same is supported by the socket body.

Also, according to the present invention, there is provided a socket assembly for accommodating an electrical component having a plurality of terminals and for electrically connecting the said electrical component to a printed circuit board, comprising:

a socket body having a generally rectangular configuration;

a plurality of flat plate-like contact pins which are arranged forming rows in parallel respectively along at least opposite sides of the said socket body, each of the said contact pins having a base portion and an arm which extends curved upward from the said base portion, the said base portion having at one end thereof an upward contact portion for contact to a terminal of the said electrical component and at the other end thereof a connecting portion for connection to the said printed circuit board; and pivot cams, each of which is supported by tip portions of the said arms of the said row-forming contact pins and which can pivot between a position of a standing state and a position of a substantially horizontal state, wherein each of the said pivot cams retracts from an insertion region for the said electrical component in the standing state and presses against the said electrical component by an elastic force of the said arms of the said contact pins in the horizontal state to bring the said terminals of the said electrical component into contact with the said contact portions of the said row-forming contact pins.

Preferably, each of the pivot cams has a standing contact portion which comes into contact with the upper surfaces of the base portions of the contact pins at the time of the standing state described before and a horizontal contact portion which comes into contact with the upper surfaces of the base portions of the contact pins at the time of the substantially horizontal state described before, the elastic force of the arms of the contact pins is imparted to the slider from the tip portions of the arms in a direction substantially perpendicular to the standing contact portion, and a distance from the horizontal contact portion to the electrical component is larger than the distance from the tip portion of the arms to the electrical component.

Further preferably, an extension piece for pivoting the pivot cam is provided in the pivot cam.

Also, according to the present invention, there is provided a socket assembly for accommodating an electrical component having a plurality of terminals and for electrically connecting the electrical component to a conductor pattern on a printed circuit board, comprising:

- a support frame having a generally rectangular configuration which surrounds the periphery of the said electrical component;
- a plurality of flat plate-like contact pins which are arranged forming rows in parallel respectively along at least opposite sides of the said socket body, each of the said contact pins having a base portion and an arm which extends curved upward from the base portion, the said base portion having at one end thereof an upward contact portion for contact to the terminals of the said electrical component and at the other end thereof a connecting portion for connection to the said conductor pattern of the said printed circuit board; and
- a plurality of sliders each of which is supported by the said base portions and the said arms of the said row-forming contact pins and is movable between an open position for accommodating the said electrical component and a pressing position for pressing against the said electrical component by an elastic force of the said arms to bring the terminals of the said electrical component into contact with the said contact portions of the said contact pins,
- wherein the said contact pins are detachably engaged with the said support frame so that after the said connecting portions of the said contact pins are connected and secured to the said conductor pattern of the said printed circuit board by solderings, the said support frame can be detached from the said contact pins.

In the socket assembly having the above-described configuration, the contact pins are detachably engaged with the support frame so that the support frame can be detached from the contact pins after the external connecting portions of the contact pins are secured to the conductor pattern of the printed circuit board by soldering, and therefore the mounting height of the contact pins per se with respect to the circuit board becomes small, and the mounting height of the electrical component mounted on the contact pins with respect to the circuit board can be made small. Further, since the support frame may be detached from the contact pins according to need after the external connecting portions of the contact pins are secured to the conductor pattern of the printed circuit board by soldering, it is possible to realize a light weight mounting construction of the electrical component. In addition, the contact pins in the rows are soldered to the circuit board in a state where they are supported by the support frame, and therefore it is possible to prevent the lowering of the efficiency of the soldering work and the positional precision of the contact pins with respect to the printed circuit board.

Preferably, a plurality of ribs are provided inside and outside of the support frame so as to form rows, and the contact pins in the rows are detachably engaged between the adjoining ribs inside and outside the support frame.

Further preferably, an upper cap covering the upper surface of the electrical component is detachably attached to the support frame or an upper cap covering the upper surface of the electrical component is integrally provided with the support frame. In this case, ribs defining the intervals of the arms of the contact pins in the rows and an opening portion for visually confirming the contact portions of the contact pins from above are formed.

Further preferably, with respect to the circuit board, the upper surface of the support frame has the same height as that of the contact pins or a lower height than that of the contact pins.

Further preferably, the contact pins in the rows are arranged in a rectangular configuration and the sliders held by the contact pins in the rows are formed so that the end portions abut against each other at the pressing position.

Further preferably, partition walls for defining the intervals of the contact pins in the row are formed in the sliders. In this case, preferably, the sliders are formed by a substance having a bad wetting property with respect to solder, and at least one part of the partition walls of the sliders is formed so as to cover a section positioned above the soldering section among the sliding regions of the contact pins with respect to the partition walls of the sliders. It is also possible even if the section positioned above the soldering section among the sliding regions of the contact pins sliding along the partition walls of the sliders is covered by a substance having a bad wetting property with respect to solder.

Further preferably, at least one part of the pitch and width of the external connecting portions of the contact pins in the rows is made larger than the pitch and width of the contact portions, respectively.

Further preferably, the contact pins of the respective rows are formed by simultaneous punching and simultaneous bending of one conductive plate.

Also, according to the present invention, there is provided a socket assembly comprising a plurality of contact pins each of which has at one end thereof an external connecting terminal and at the other end thereof a contact portion which can come into contact with a terminal of an electrical component at the time of attachment of the electrical component, and between them, is formed with a first spring portion beside the said external connecting terminal and a second spring portion beside the said contact portion, the said contact pins being disposed in parallel on a base plate while mutually insulated from each other, and

- a slide member which has a first position defining portion and a second position defining portion which are respectively brought into contact with the said first spring portion at a detachable position and a loading position for the said electrical component and receiving a position restriction by its urging force and has an engagement portion which moves the said contact portion to the said detachable position by pushing the said second spring portion toward the first spring portion from its elastic neutral position.

Preferably, the urging force of the first spring portion acts in a substantially vertical direction of the attached aforesaid electrical component, and the urging force of the second spring portion acts in a substantially side surface direction of the attached aforesaid electrical component. Also, at the time of attachment of the electrical component, the engagement portion pushes the second spring portions from the neutral position to a second direction, whereby the contact portions come into sliding contact with the terminals of the electrical component.

Further preferably, the structure is made so that, at the time of attachment of the electrical component, a slide member can push the side surface of the electrical component.

Further preferably, the slide portion is held from the vertical direction by an extension portion extended from between the external connecting terminals and the first spring portions and the first spring portions so that it can move to the side.

Further preferably, at the loading position of the electrical component, the electrical component is held from the vertical direction by the contact portions and the tip portions of the extension portions, and at least one of the contact portions and the tip portions is used as electrically conductive terminals with the electrical component.

Further preferably, in the slide member, engagement and contact portions are provided on both end portions in a direction orthogonal to its movement direction, and the slide member is moved by an external device via the engagement and contact portions.

Further preferably, a plurality of ribs are disposed in parallel on the slide member, and the contact pins in the rows are isolated from each other by the ribs.

In the socket assembly having the above-described configuration, when the slide members are moved to the outside in the horizontal direction of the socket using a jig etc., the engagement portions of the slide members warp the second spring portions of the contact pins and make the contact portions of the contact pins retract to the side, thereby to enable the accommodation of the electrical component. The slide members are positioned at that position by the urging force of the first spring portions of the contact pins. When the electrical component is placed in the accommodating portion in this state and the slide members are moved inward in the horizontal direction, the engagement portions of the contact pins restore the second spring portions to the neutral positions, so that the contact portions of the contact pins push against the electrical component from above and, at the same time, come into contact with the terminals of the electrical component. The slide members are held in this state by the first spring portions. In a final stage of the attachment action of the electrical component, the engagement portions enable a further pushing of the second spring portions from the neutral position in the same direction, or the slider members push against the side surfaces of the electrical component, whereby wiping between the terminals of the electrical component and the contact portions of the contact pins is carried out and the conductivity can be improved. Also, extension portions are provided in a space between the same and the external connecting terminals of the contact pin, and the electrical component is held by the contact portions and the extension portions, whereby it becomes possible to apply the same also to electrical components having terminals provided on the upper surface side thereof or electrical components having terminals provided on the lower surface side.

Also, according to the present invention, there is provided a socket assembly comprising: a plurality of contact pins arranged in parallel on a base plate in such a manner that a spring portion is formed between a contact portion that can come into contact with a terminal of a loaded electrical component and an external connecting terminal and an engagement portion is formed between the said contact portion and the said spring portion; and an actuation shaft member arranged along the parallel arrangement direction of the said contact pins and given a rotation force by a spring member, the said actuation shaft member having an arm at at least one end thereof and being formed at a circumferential surface thereof with engagement portions which are engaged with the engagement portions of the said respective contact pins, wherein either one of the engagement portion of the said contact pin and engagement portion of the said activation shaft member being made convex and the other being made concave, whereby the said actuation shaft member sequentially effects two engagements in its rotation direction with respect to the said contact pins so that the said contact portions are brought into contact with or separated from the said electrical component by one of the engagements portions and are slid with respect to the said electrical component at the time of loading by the other engagement.

Preferably, the engagement portion of the actuation shaft member has a concave shape and the engagement portion is formed so as to push against the side surface of the electrical component at the time of loading of the electrical component.

Further preferably, an extension portion extended from a space between an external connecting terminal and a spring portion is formed on a contact pin, and the actuation shaft member is sandwiched by the engagement portions and the extension portions of the contact pins.

Further preferably, the electrical component is sandwiched by the contact portions and the tip portions of the extension portions at the loading position, and at least one of the contact portions and the tip portions act as electrical conductive terminals with the electrical component.

Further preferably, a spring portion is constituted by a first spring portion provided on the contact portion side and a second spring portion provided on the external connecting terminal side.

Further preferably, a plurality of ribs are disposed in parallel on the actuation shaft member, and the contact pins are isolated by the ribs, respectively.

Further preferably, a means for suppressing the rotation of the actuation shaft member by the spring member at a predetermined angular position is provided in the base plate.

Further preferably, a cover member for rotating the actuation shaft member against the force of the spring member via the arm is attached to the base plate so that it can vertically move.

BRIEF DESCRIPTION OF THE DRAWINGS

Below, the present invention will be explained in detail referring to the attached drawings. In the figures.

DESCRIPTION OF THE PREFERRED EMBODIMENTS

Figure 1A:
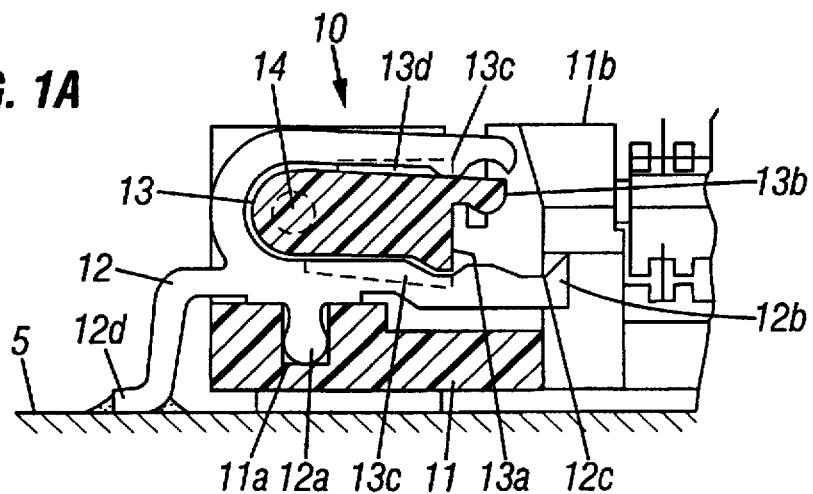
FIG. 1 shows a first embodiment of a socket assembly of the present invention, in which (a) is a vertical cross-sectional view of a principal part of the socket in a state before an IC chip substrate is inserted as an electrical component, (b) is a vertical cross-sectional view of a principal part of the socket in a state where the slider is moving, and (c) is a vertical cross-sectional view of a principal part of the socket in a completed insertion state.
Figure 1B:
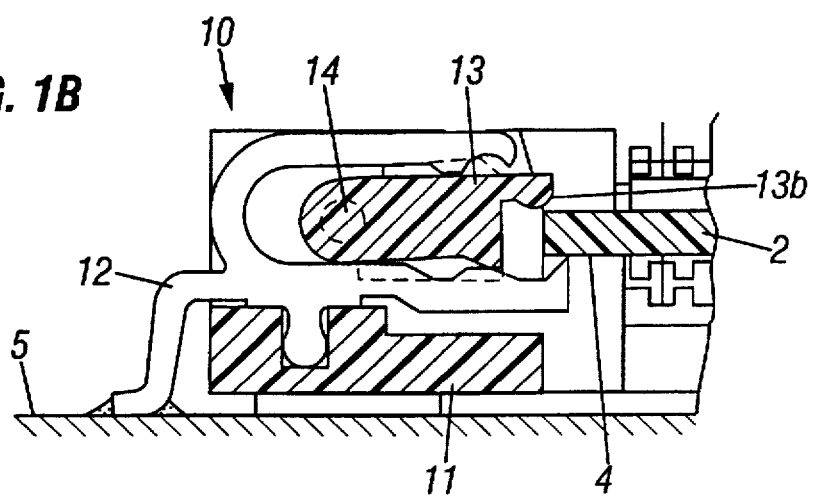
Figure 1C:
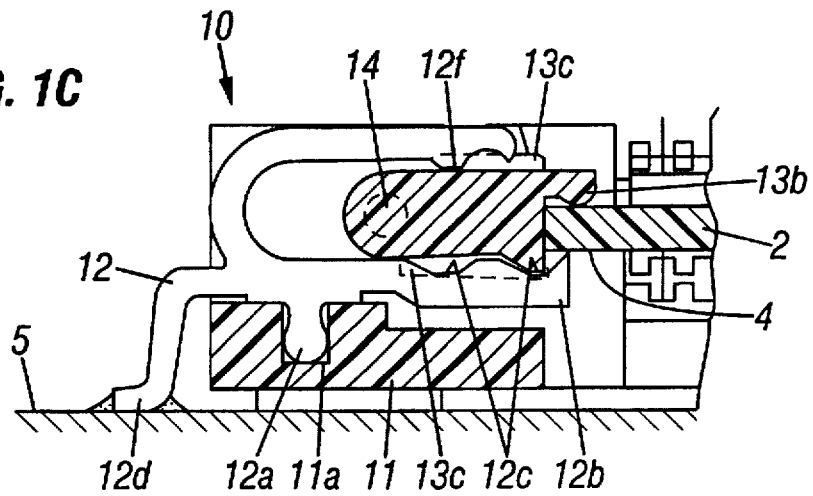
Figure 2:
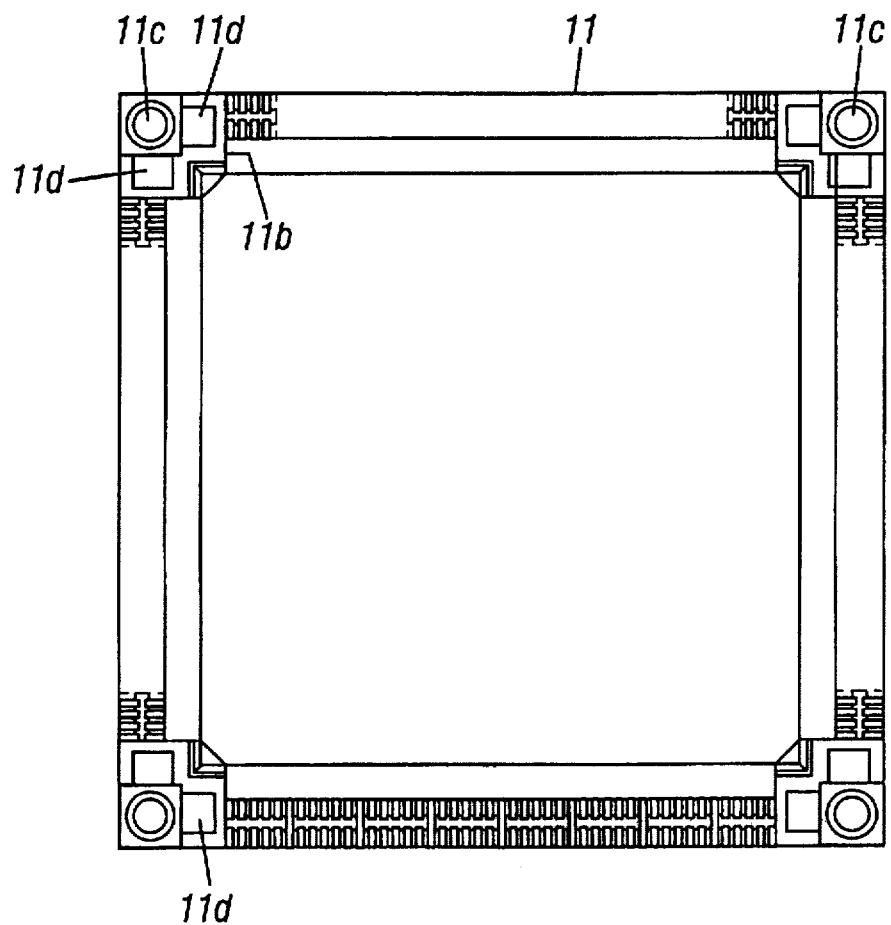
FIG. 2 is a schematic plan view of a socket body of the first embodiment.
Figure 3A:
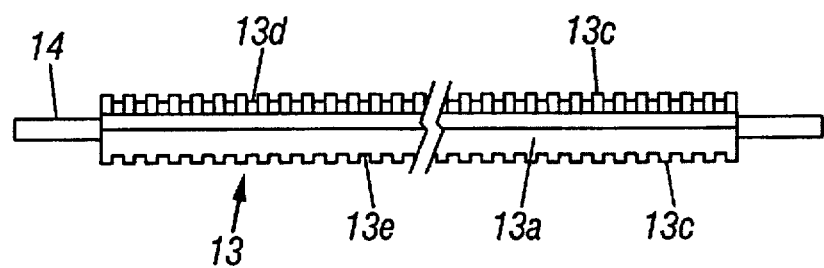
FIGS. 3(a) and 3(b) are a side view and an end surface view of the slider of the first embodiment, respectively.
Figure 3B:
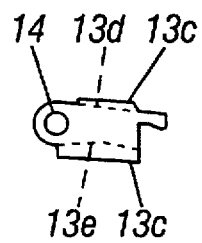
Figure 9:
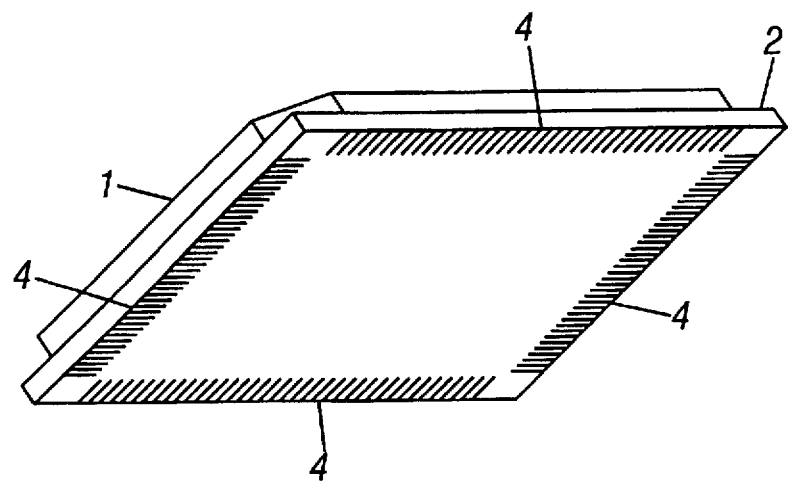
FIG. 9 is a perspective view of an IC chip mounted on the socket assembly.

Referring to FIG. 1 through FIG. 3, a socket assembly (IC socket) according to the first embodiment of the present invention is mounted on a printed circuit board 5 and is constituted so as to accommodate a leadless. IC chip 1 shown in FIG. 9. In this IC chip 1, an LSI (illustration is omitted) etc. is mounted on the upper surface of a rectangular multiple layer substrate 2 formed by a glass epoxy resin or the like, protected by the resin and formed into a module. A plurality of terminals (pads or lands) 4 are arranged on the the bottom surface of the substrate 2 along the respective sides of the substrate 2.

The IC socket 10 is provided with a socket body 11 having a generally rectangular configuration seen from above. Contact pins 12 respectively arranged in parallel and at predetermined intervals in directions perpendicular to the respective sides are implanted in the respective sides of this socket body 11. Also, guides 11b for positioning, located inside of the rows of the contact pins 12 with each same distance are provided along a diagonal of a rectangle in the socket body 11. In this positioning guide 11b, the upper surface has an L-shape, the bent inside of the L is directed to a central direction of the diagonal, and an upper half of the inside surface of the L is constituted by an inclined plane inclined outward, an interval of vertical planes of the lower half of the inside surfaces of the L's of the respective opposed positioning guides 11b is slightly larger than that of the substrate 2 of the IC chip 1 mounted on the socket body 11, and the movement of the substrate 2 of the IC chip 1 to an extent where the wiping effect is obtained is possible in a state where it is positioned only by the positioning guide 11b.

Also, guide holes 11c are respectively provided at positions substantially intersecting the rows of the contact pins 12 on the outside of the positioning guides 11b on the diagonals, and square holes 11d are made at the positions respectively adjoining the row sides of the contact pins 12 with respect to these guide holes 11c.

The contact pin 12 having a base portion 12A and an arm 12B is a horizontal U-shape and is formed with a contact portion 12b which faces upward at the tip portion of the lower side base portion 12A. Recesses 12c are provided in succession at two portions on the deep side of the U after this contact portion 12b. Also, a circular portion 12a having a disk-like tip is projected outward at a position near the curved portion of the U, an external connecting portion 12d is projected outward at a root position of the U, and a sliding portion 12f projected inward is formed in the vicinity of the tip of the arm 12B of the upper side of the U.

In the socket body 11, the circular portion 12a of the contact pin 12 is implanted by press-fitting into a slit 11a made at a position where the contact pin 12 should be implanted, and as a result, a slight inclination of the contact pin 12 is possible on the flat plane of the contact pin 12 with respect to the socket body 11.

For this reason, due to a variation of shapes of contact pins 12a due to error in manufacturing and a variation of the press-fit state when the contact pins 12 are inserted into the slits 11a of the socket body 11, the positions in the height directions of the external connecting portions 12d of the contact pins 12 end up off. When the socket body 11 is placed on the circuit board 5, even in a state where some of the external connecting portions 12d can not come into contact with the electrode portions or conductive pattern of the circuit board 5, by pushing the IC socket against the circuit board, it is possible to incline the contact pins 12 and to bring all external connecting portions 12 into close contact with the conductive pattern of the circuit board 5, and in addition, even if the pushing against the IC socket is released, a tight contact state of the external connecting portions 12d and the conductive pattern of the circuit board 5 is kept, and therefore soldering work of the external connecting portions 12d of the contact pins 12 to the conductive pattern of the circuit board 5 can be reliably carried out.

A straight slider 13 having a cross-section of a shape substantially resembling the character U is inserted into a space having a horizontal U-shape constituted by a row of the contact pins 12. At both ends of this slider 12, pins 14 which can be positioned at upper sides of the square holes 11d of the socket body 11 project longitudinally outward beyond the row of contact pins, ribs 13c and upper grooves 13d on an upper side and ribs 13c and lower grooves 13e on the lower side are alternately formed at the intermediate portion with the same pitch as that of the row of the contact pins 12, respectively, and the front end side of the lower groove 13e forms a shape that can be engaged with the recess 12c. Also, a pressing portion 13b is formed at an upper end of a part facing the center of the socket body 11 so as to project therefrom, and an abutment portion 13a which abuts against the side surface of the substrate 2 of the IC chip 1 is formed substantially at the lower side of the pressing portion 13b. Further, the bottom surface of the upper groove 13d forms an inclined plane so that the pressing portion 13b side becomes lower when the slider 13 is inserted into the contact pin 12s.

With respect to the above-mentioned IC socket, in the insertion jig 16d for inserting the IC chip 1, guide posts 16a which can be inserted into the guide holes 11c at the four positions of the above-mentioned socket body and leg portions 16c which can be inserted into the square holes 11d are provided. The tips of the leg portions 16c form inward tapered portions 16b.

In a detachment jig 17, similar to the insertion jig 16, guide posts 17a which can be inserted into the guide holes 11c at the four positions and leg portions 17c which can be inserted into the square holes 11d are provided. The tips of the leg portions 17c form outward tapered portions 17b.

Figure 6:
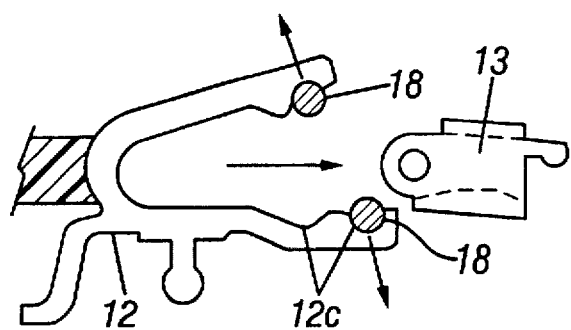
FIG. 6 is a view explaining an insertion method of a slider of the first embodiment.

Note that, in a method of inserting the above-mentioned slider 13 into the contact pins 11 one by one (not a row, since a large force is necessary for simultaneously opening all contact pins 12 and the pins cannot be opened easily), as shown in FIG. 6, rods 18 are made to abut against the recess 12c of the tip of the lower side of the contact pin 12 and the recess 12c between the sliding portion 12f of the upper side and the projection portion of the tip, respectively, the side:s are are vertically opened by these two rods 18, and the slider 13 is inserted therein. Also, after the slider 13 is inserted into the row of the contact pins 12, desirably the inclination angle of the bottom surface of the upper groove 13d is set so that the elastic deformation of the contact pins 12 can be reduced as much as possible. If performing this, when the IC socket is not used, it is possible to prevent a load from being applied on the contact pins 12.

Next, the operation of the above-mentioned IC socket will be explained. First, when the IC chip 1 is inserted, at the part of the contact pin 12 in the state before the insertion, as shown in FIG. 1(a), the slider 13 is located in a state where the tip part of the lower portion of the slider 13 is inserted into the recess 12c at the deep side of the U-shaped space and merely the contact portion 12b of the contact pin 12 is located at the position where the substrate 2 of the IC chip 1 is to be placed. The slider 13 is completely retracted. When the substrate 2 of the IC chip 1 is placed along the guides 11 for the positioning at the four corners in this state, the substrate 2 of the IC chip 1 enters a state where the terminals 4 thereof are placed on the contact portions 12b in contact with the same.

Figure 4:
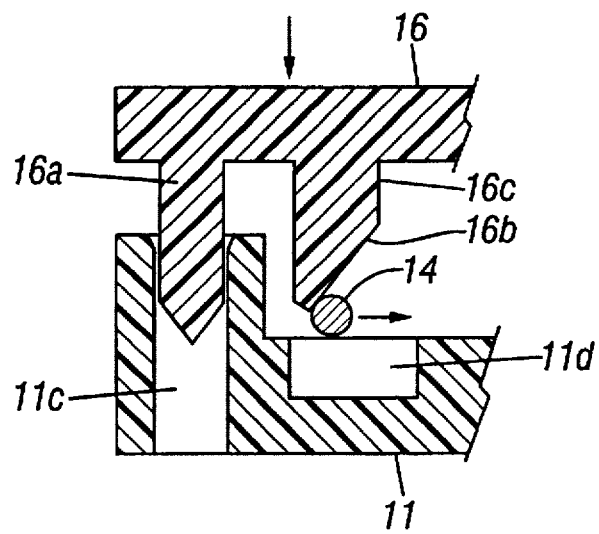
FIG. 4 is an explanatory view of an operation of an insertion jig used in the socket assembly of the first embodiment.

Next, the guide posts 16a of the insertion jig 16 are inserted into the guide holes 11c of the socket body 11 as shown in FIG. 4 and pushed down, whereby the tapered portions 16b of the leg portions 16c push against the pin 14 of the slider 13 inward and moves the slider 13 to a state of FIG. 1(c).

In the process of moves to this state, as shown in FIG. 1(b), the pressing portion 13b side of the slider 13 once rises so that the tip portion of the lower groove 13e goes over the adjoining portion of the recess 12c of the contact pin 12 and moves to the upper side of the substrate 2 of the IC chip 1.

In a state where the move is completed, as shown in FIG. 1(c), the abutment portion 13a of the slider 13 presses against the side surface of the substrate 2 of the IC chip 1, the substrate 2 of the IC chip 1 is completely positioned by the pressing by the abutment portions 13a of the four sliders 13 and, at the same time, the bottom portion of the upper groove 13d of the slider 13 is pressed downward by the elastic force of the contact pins 12 via the sliding portions 12f of the contact pins 12 and the pressing portion 13b presses against the substrate 2 of the IC chip 1 from the upper side to bring the terminals 4 thereof into complete contact with the contact portion s12b of the contact pins 12.

Figure 5:
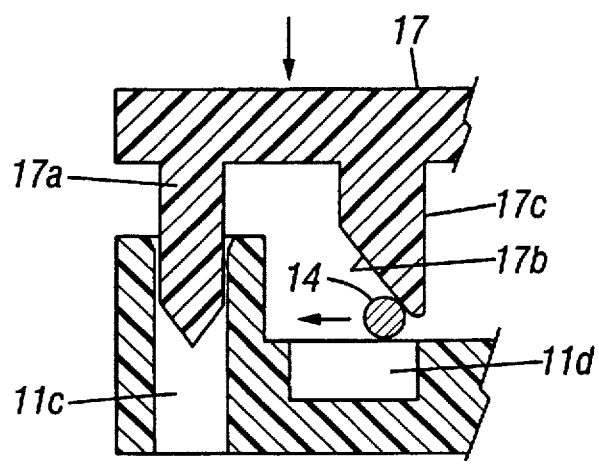
FIG. 5 is an explanatory view of the operation of a detachment jig used in the socket assembly of the first embodiment.

In this case, the pressing point of the substrate 2 of the IC chip 1 by the pressing portion 13b of the slider 13 shifts to a position further in than the contact portions 13b of the contact pins 12, and therefore even if a lop-sided pressing state of the substrate 2 of the IC chip 1 occurs due to a time difference of the respective sliders 13 which may occur when pressing against the insertion jig 16, there will never be a case where an inclination of the substrate 2 of the IC chip 1 is produced and the other sliders 13 abut against the side surfaces of the substrate 2 of the IC chip 1 to cause defective operation. Note that, the insertion jig 16 is removed from the socket body 11 after the completion of insertion of the substrate 2 of the IC chip 1.

Where detaching the substrate 2 of the IC chip 1, as shown in FIG. 5, the guide posts 17a of the detachment jig 17 are inserted into the guide holes 11c of the socket body 11 and pushed down, whereupon the tapered portions 17b of the leg portions 17c press the pins 14 of the sliders 13 to the outside and move the sliders 13 to the state of FIG. 1(a). In this state, the substrate 2 of the IC chip 1 is merely sitting on the contact portions 12b of the contact pins 12, and therefore the substrate 2 of the IC chip 1 may be detached in this state. Then, after the substrate 2 of the IC chip 1 is detached, the jig is detached from the socket body 11 similar to the case of the insertion jig 16.

Figure 7:
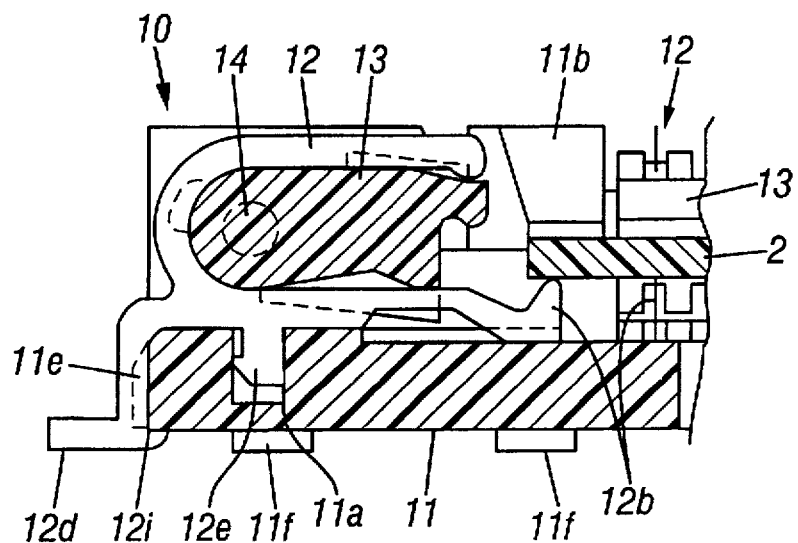
FIG. 7 is a vertical cross-sectional view of a part of the socket assembly showing a second embodiment of the present invention.

FIG. 7 is a vertical cross-sectional view of a part of the IC socket according to the second embodiment of the present invention. In this embodiment, no recesses 12c are provided in the contact pin 12, a hook-like portion 12e is provided in place of the circular portion 12a, and further an engagement portion 12i is provided on the socket body 11 side of the external connecting portion 12d. Furthermore, a groove portion 11e is provided in the end surface of the socket body 11, and a convex portion 11f is provided at the bottom surface, respectively.

A contact pin 12 is attached to the socket body 11 by press-inserting the hook-like portion 12e into the slit 11a made in the socket body 11 and, at the same time, the engagement portion 12i is made to abut against the bottom surface of the socket body 11 while engaging the external connecting portion 12d with the groove portion 11e provided in the end portion of the socket body 11.

At this time, the lower end of the contact portion 12b of the contact pin 12 abuts against the socket body 11. In the bottom surface of the socket body 11, a gap is formed between the same and the circuit board 5 to which the IC socket is attached by the convex portion 11f.

When adopting the configuration as mentioned above, even if a strong force is applied to the external connecting portion 12b of a contact pin 12, the lower end abuts against the socket body 11, and therefore there is no risk of warping in the downward direction, and it is possible to prevent a situation wherein, when the substrate 2 of the IC chip 1 is placed on the contact portions 12b of the contact pins 12 and the sliders 13 are moved, the external connecting portions 12b warp in the downward direction, the pressing portions 13b of the sliders 13 catch on the side surfaces of the substrate 2 of the IC chip 1, and it becomes impossible to move the sliders 13 to the predetermined position.

Also, since no recesses 12c are provided in the contact pins 12, when a slider 13 is moved, it can be moved with a weaker force than that of the case shown in FIG. 1. Further, the contact pins 12 are attached to the socket body 11 by the external connecting portions 12d, the hook-like portions 12e and the engagement portions 12i, and therefore no variation of position of the external connecting portions 12d in the height s direction occurs, and the work of soldering the external connecting portions 12d to the circuit board 5 becomes easy.

Figure 8:
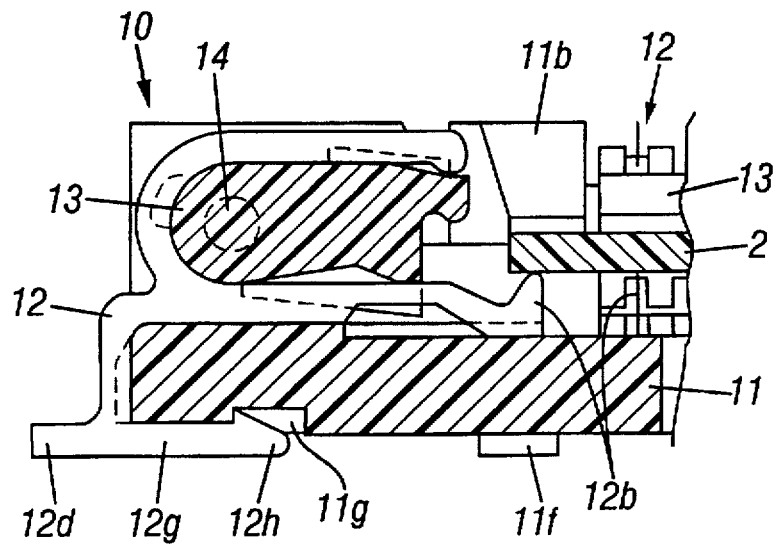
FIG. 8 is a vertical cross-sectional view of a part of the socket assembly showing a third embodiment of the present invention.

FIG. 8 is a cross-sectional view showing a contact pin part of the IC socket according to a third embodiment of the present invention. In this embodiment, no slit 11a is made in the socket body 11, a leg portion 12g is extended to the bottom surface side of the socket body 11 from the external connecting portion 12d of the contact pin 12, and a pawl portion 12h is provided at the tip of the leg portion 12g. The pawl portion 12h is engaged with the step portion 11g provided at the bottom surface of the socket body 11 while engaging the external connecting portion 12d with the groove portion 11e of the socket body 11 similar to a case shown in FIG. 7, whereby the contact pin is attached to the socket body 11.

Note that, also in this case, a convex portion 11f is provided at the bottom surface of the socket body 11, the lower end of the contact portion 12b of the contact pin 12 abuts against the socket body 11, and no recesses 12c are provided.

In the first through third embodiments mentioned above, the manufacturing of a thin socket is possible. For example, even in a case where the width of the substrate 2 of the IC chip 1 is 25 mm and the thickness is 0.4 to 0.5 mm, sockets having a width of 32 mm and a thickness of not more than 3 mm can also be manufactured.

Also, the pressing force between a terminal 4 of the substrate 2 of the IC chip 1 and a contact portion 12b of a contact pin 12 is caused only by the resiliency of the contact pin 12 in a state sandwiching in the slider 13 and the substrate 2 of the IC chip 1. No load is applied on the socket body 11 made of the plastic, therefore this socket has a high reliability at the time of high temperature and can be utilized also in a burn-in test, and a reflow for soldering to the substrate 2 of the IC chip 1 after that test can be passed, and thus a waste-free production process can be realized.

Further, even if the number of the contact pins 12 is large, an electrical component such as a substrate 2 of an IC chip etc. can be attached by an automatic machine.

Further, when the abutment portion 13a of the slider 13 comes into contact with the side: surface of the substrate 2 of the IC chip 1, the substrate 2 of the IC chip 1 is slightly moved with respect to the contact portions 12b of the contact pins 12, and therefore a wiping effect is reliably obtained and poor contact does not occur.

Further, in this system, the substrate 2 of the IC chip 1 is placed on the contact portions 12b of the fixed contact pins 12, and the substrate 2 of the IC chip 1 etc. are pressed from above by the sliding portions 12f of the contact pins 12 via the sliders 13, and therefore an intended contact pressure is easily obtained also by fine pitch contact pins 12.

Note that, in the above-mentioned embodiments, only an example in which the substrate 2 of the IC chip 1 is attached is shown, but by changing the size of respective elements of the socket, it is also possible to handle an IC package or a chip-on-board module.

Further, when adopting a configuration wherein the lead terminal is sandwiched instead of sandwiching the substrate 2 of the IC chip 1 by the pressing portion 13b of a slider 13 and the contact portions 12b of the contact pins 12, it is also possible to handle an IC package in which the lead terminals are projected to the side.

Figure 11:
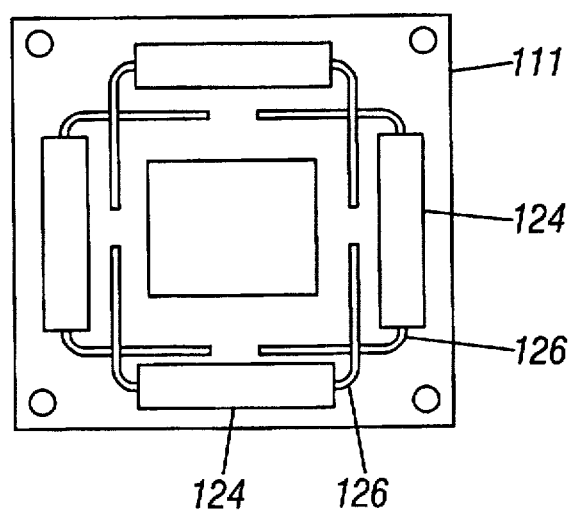
FIG. 11 is a schematic plan view showing the arrangement of sliders of the fourth embodiment.
Figure 12:
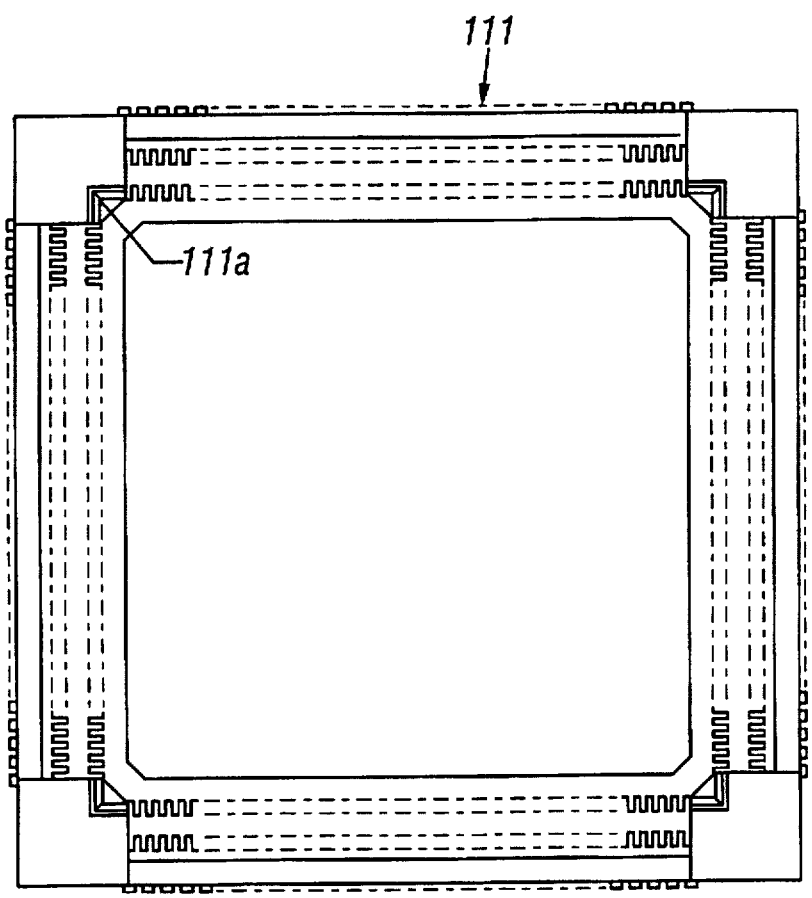
FIG. 12 is a schematic plan view of a socket body of a fourth embodiment.

Next, referring to FIG. 10 through FIG. 12, an IC socket 110 according to a fourth embodiment of the present invention comprises a socket body 111 having a generally rectangular configuration, a plurality of contact pins 121 having a horizontal U-shape which are arranged in parallel to the respective sides of this socket body 111 so as to form rows and sliders 122 inserted into the internal spaces of the horizontal U-shaped spaces formed by the rows of these contact pins 121.

In the socket body 111, positioning guides 111a positioned inside of the rows of the contact pins 121 at identical distances are provided along the diagonals thereof.

A contact pin 121 is constituted by a base portion 121a which is the lower side of the U, an inclined plane 121i inward with respect to the upper surface of the center of the socket of this base portion 121a, a contact portion 121b which is provided upward on the tip of the further inside thereof, a step portion 121c provided on the upper side of the base portion 121a in the vicinity of this contact portion 121b, a leg portion 121d which is projected to the lower side of the base portion 121b and implanted in the socket body 111, an external connecting portion 121e which is projected at the outside end portion of the base portion 121a so as to be connected to the external circuit, a curved portion 121f which has an arm extended curved upward from the attachment portion of this external connecting portion 121e, in which the arm being curved inward to the upper portion from the attachment portion of the external connecting portion 121e, a horizontal portion 121g extended inward from the tip of this curved portion 121f, and a securing portion 121h provided downward at the tip of this horizontal portion 121g.

The slider in the fourth embodiment comprises a movable member 122, a stationary member 123 and a driving member 124.

The stationary member 123 is arranged so that the bottom surface is in contact with the upper sides of the leg portions 121d of the contact pins 121, the center side of the socket abuts against the step portions 121c, and the outside abuts against the inside of the curved portions 121f to be affixed.

Further, a rack 123a is formed on the upper surface of the stationary member 123, and an inward inclined plane 123b is formed on the upper surface on the center of the socket.

The upper surface of the movable member 122 is in contact with the lower surfaces of the horizontal portions 121g of the contact pins 121, the tip portion on the center of the socket reduces the elastic force from the elastic portions 121h of the contact pins 121 to the movable member 122, and an inward first inclined plane 122d reducing the bending of the contact pins 121 and further this tip form a downward pressing portion 122a.

On the other hand, a rack 122c is formed on the lower surface of the movable member 122, an outward second inclined plane 122d is formed on the center side of the socket of this rack 122c, and further this tip side becomes the guide portion 122e and the vertical abutment portion 122b connected to this.

The driving member 124 has a pinion 125 engaged with the racks 122c and 123a of the above-mentioned movable member 122 and the stationary member 123, drive levers 126 respectively projecting in the same direction are provided on the opposite end portions of this pinion 125, and the movable member 122, the stationary member 123 and the driving member 124 operate in association An explanation will be made next of the operation of the slider.

Figure 10A:
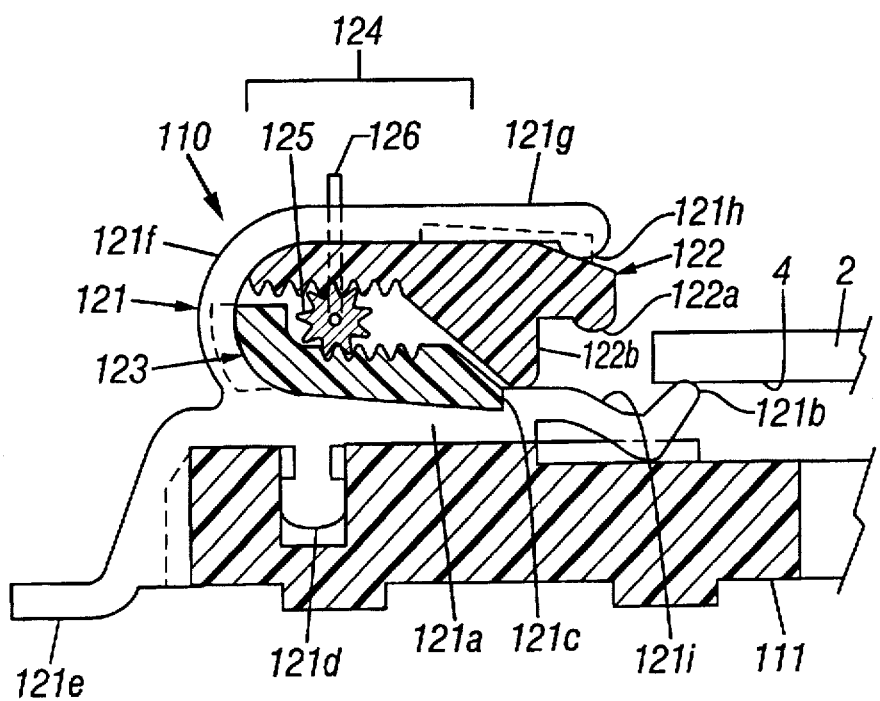
FIG. 10 shows a part of the socket assembly according to a fourth embodiment of the present invention, in which (a) is a vertical cross-sectional view in a state where the IC chip is not mounted and (b) is a vertical cross-sectional view in a state where the IC chip is mounted.
Figure 10B:
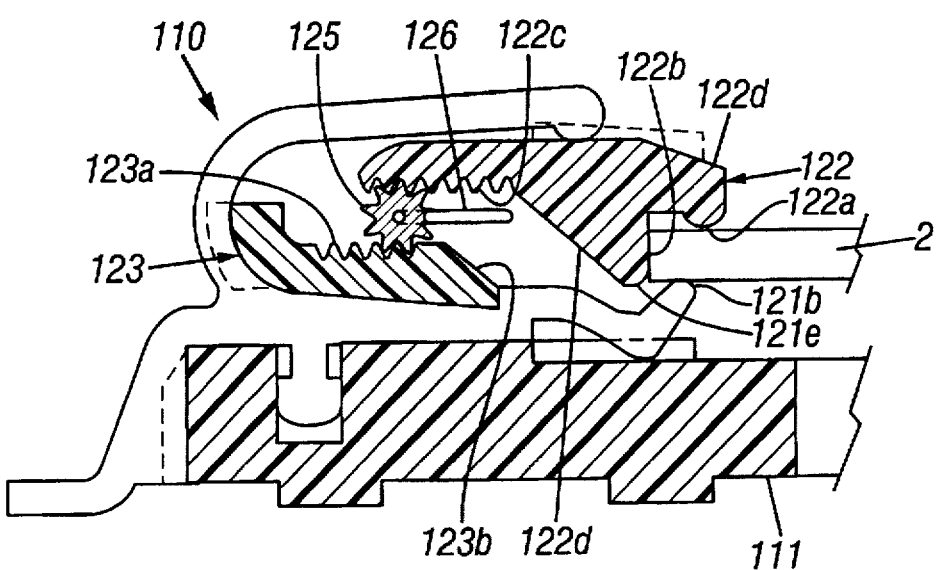

First, when the drive lever 126 is raised from a substantially horizontal position shown in FIG. 10(b) to substantially a vertical position shown in FIG. 10(a), the pinion 125 rotates in a counterclockwise direction in the figure. At this time, the pinion 125 is engaged with the rack 123a of the stationary member 123, and therefore pivots to the outside (left side in the figure). Along with this pivoting, the rack 122c of the movable member 122 engaged with the pinion 125 shifts to the outside (left side in the figure) with only a distance two times the pivoting distance of the pinion 125. Along with this movement, the guide portion 122e of the movable member 122 abuts against the inclined planes 121i of the contact pins 121, the movable member 122 is then pushed upward, the press contact against the IC package by the pressing portion 122a of the movable member 122 is released, and a state enabling insertion of the IC package is established.

When the IC package is inserted from the upper side along the positioning guide 111a in this state, and the drive lever 126 is thrown down toward the inside of the socket, the pinion 125 rotates in the clockwise direction in FIG. 10(a) to pivot toward the inside of the socket on the rack 123a of the stationary member 123 and, at the same time, move the rack 122c of the movable member 122 exactly a distance of two times toward the inside of the socket.

Along with the movement of the movable member 122, the guide portion 122e of the movable member 122 abuts against the inclined planes 121i of the contact pins 121, and thereafter the movable member 122 is guided by the inclined planes 121i of the contact pins 121 and gradually shifts forward and downward. As a result, the abutment portion 122b of the movable member 122 pushes against the side surface of the substrate 2 of the inserted IC package to correctly position the substrate 2 and, at the same time, a state where the arm sliding portions 121g of the contact pins 121 in contact with the first inclined plane 122d are pushed upward is established. Therefore, as a reaction thereof, the pressing portion 122a at the tip of the movable member 122 presses against the upper surface of the substrate 2 of the IC package by the elastic force of the arms of the contact pins 121, and acts so that the electrodes of the bottom surface of that substrate 2 come into complete contact with the contact portions 121b of the contact pins 121.

Where the IC package is to be removed, it is sufficient if an operation reverse to that mentioned above is carried out, so an explanation will be omitted.

Also, even in a case where an engagement portion of the stationary member, movable member and the driving member is a friction surface of not illustrated serrations, the operation is exactly the same, and therefore an explanation will be omitted.

As mentioned above, in the IC socket of the fourth embodiment, the state of the contact pins can be changed just by operating the drive lever, and therefore special equipment such as an insertion jig, removal jig, etc. are unnecessary.

Further, it is possible to move the slider by exactly the same distance over the entire length, and in addition the sliding member is the movable member of the slider, and therefore it very lightly actuates. Also, the operation of the slider is just to raise or lower the drive lever, and therefore even in a case where a pressing force from the top is not imparted to the socket and it is mounted on a large size printed circuit board or a thin printed circuit board, there is no danger of warping or damage of the printed circuit board.

Figure 13:
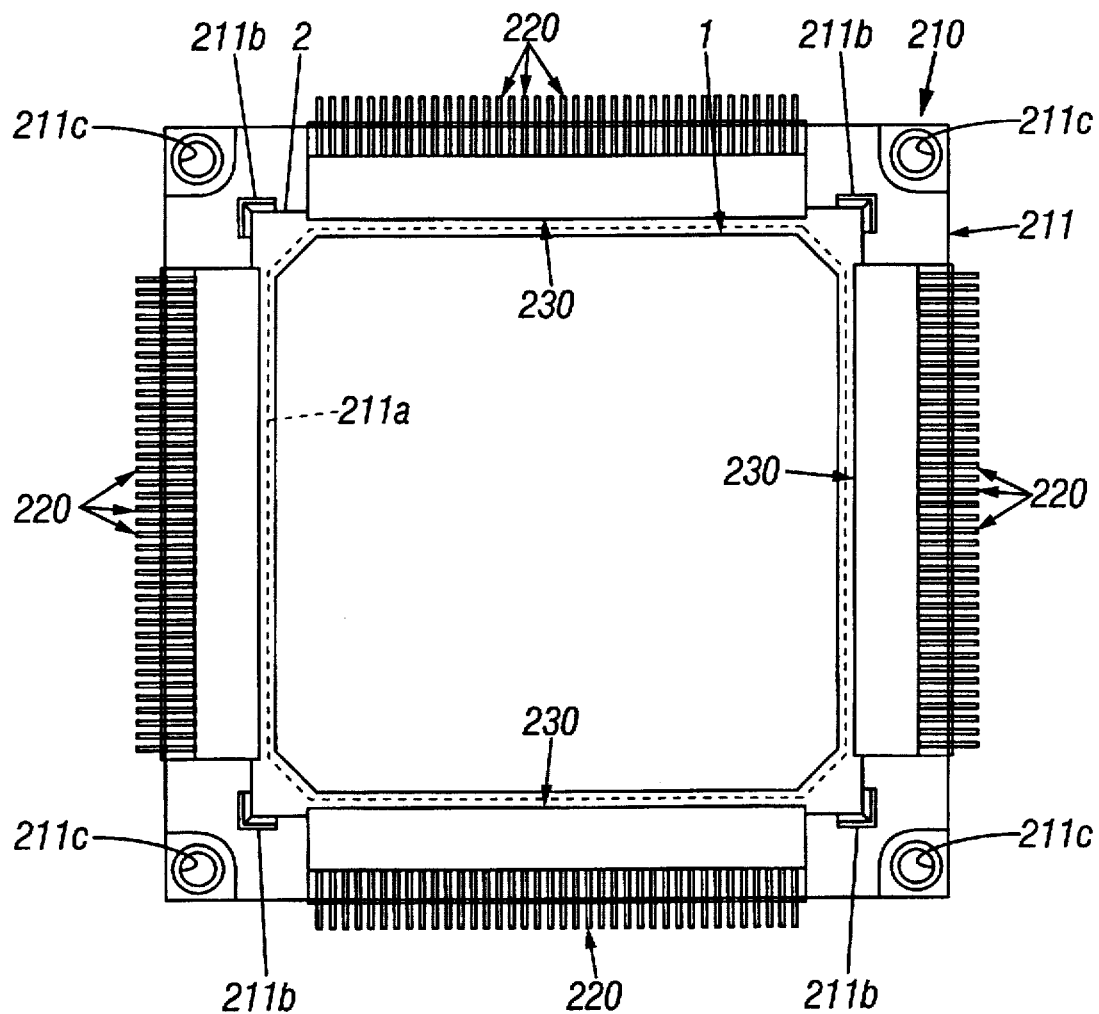
FIG. 13 is a plan view showing a state where an IC chip is mounted on an IC socket according to a fifth embodiment of the present invention.
Figure 14:
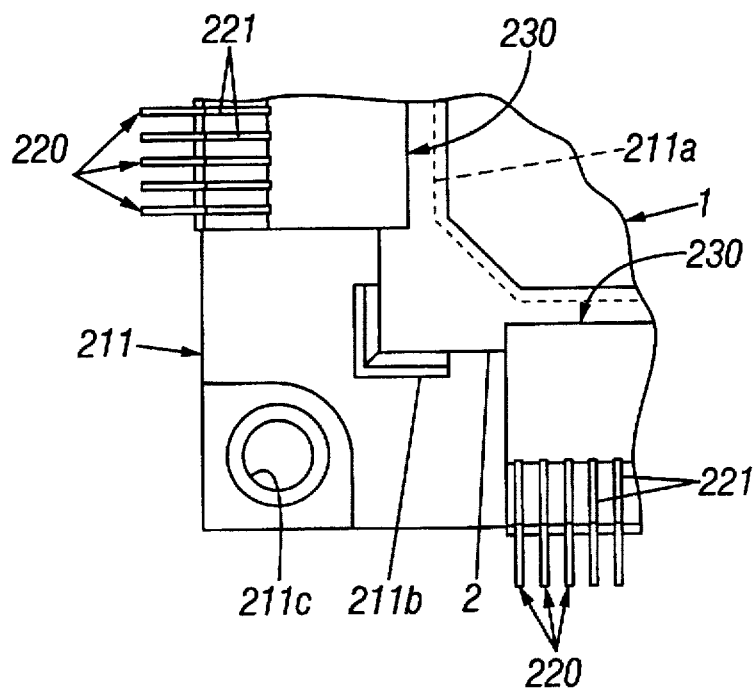
FIG. 14 is an enlarged view of a principal part of the socket shown in FIG. 13.

Next, referring to FIG. 13 through FIG. 18, the IC socket 210 according to a fifth embodiment of the present invention is provided with a socket body 211 having a generally rectangular configuration made of a plastic. At the center of this socket body 211, an opening 211a having a generally rectangular configuration smaller than the outer dimensions of the substrate 2 of the IC chip 1 is provided. As shown in FIG. 13 and FIG. 14, corner engagement pieces 211b for positioning the IC chip 1 on the socket body by engaging with each of the four corner portions of the IC chip 1 are formed at the upper surface of the socket body 211 so as to project therefrom. Note that, so as to enable the wiping action mentioned later, the corner engagement pieces 211b position the IC chip 1 to an extent enabling a slight free movement of the IC chip. Also, positioning holes 211c for positioning the socket body 211 on the printed circuit board 5 (refer to FIG. 17), temporarily holding, or affixing the same are formed at the four corner portions of the socket body 211.

Figure 17A:
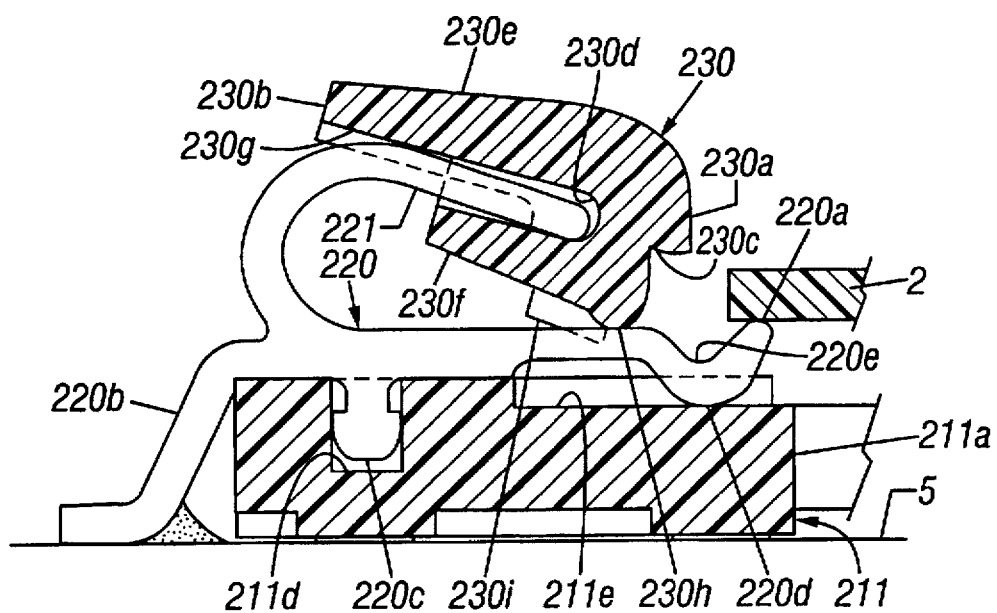
FIGS. 17(a) and 17(b) are cross-sectional views for explaining the operation of the IC socket of the fifth embodiment, respectively.

A plurality of contact pins 220 made of metal are arranged and affixed on the side portions of the socket body 211 corresponding to the arrangement of the electrodes or terminals 4 along the sides of the substrate 2 of the IC chip 1. As shown in FIG. 17(a), each contact pin 220 has a base portion having a contact portion 220a formed thereon, which comes into contact with an electrode 4 of the bottom surface of the IC chip 1, on one end. An external connecting portion 220b projected to the external portion of the socket body 211 is formed at the other end of the base portion. The external connecting portion 220b of the contact pin 220 can be soldered onto the conductive pattern (illustration is omitted) formed on the printed circuit board 5 on the outside of the socket body 211. A downward projection portion 220c is formed on the base portion of each contact pin 220. By press-fitting this projection portion 220c into a slit 211d formed in the upper surface of the socket body 211, the contact pin 220 is implanted in the upper surface of the socket body 211. Also, on one end portion of each contact pin 220, an engagement portion 220d for engaging with a guide groove 211 formed in the upper surface of the socket body 211 is projected downward. By an engagement of this engagement portion 220d with the guide groove 211e, one end portion 220a of the contact pin 220 is positioned on the socket body 211.

Figure 15:
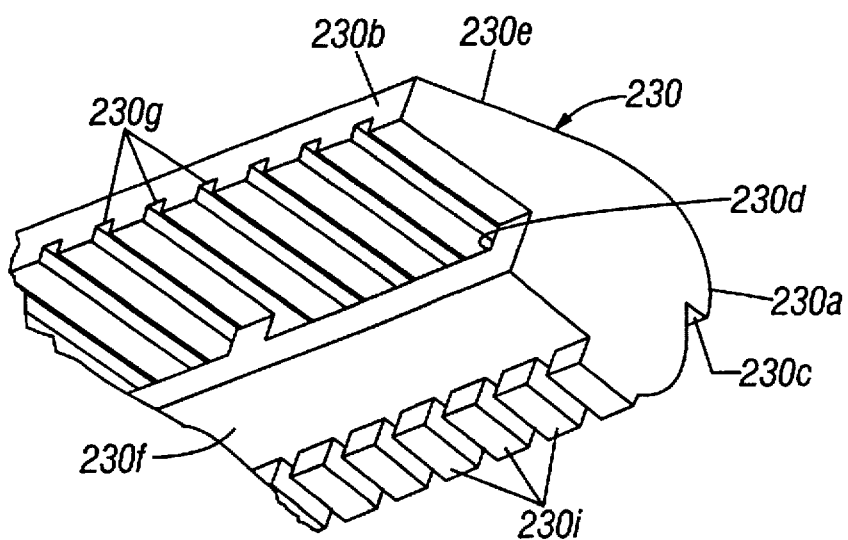
FIG. 15 is a partial perspective view seeing the slider used in the IC socket of FIG. 13 from below.
Figure 16C:
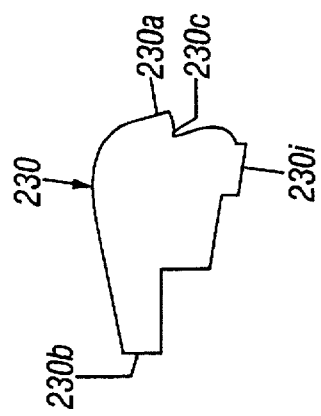
FIG. 16 shows a slider used in the IC socket of FIG. 13, in which (a) is a partial front view of a slider, (b) is a partial bottom view of the slider, (c) is a side view of the slider, and (d) is a cross-sectional view taken along a line 16(d)—16(d)
Figure 16D:
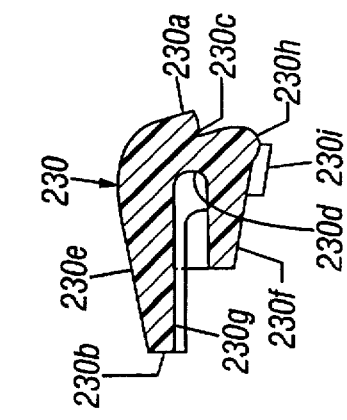
Figure 16A:
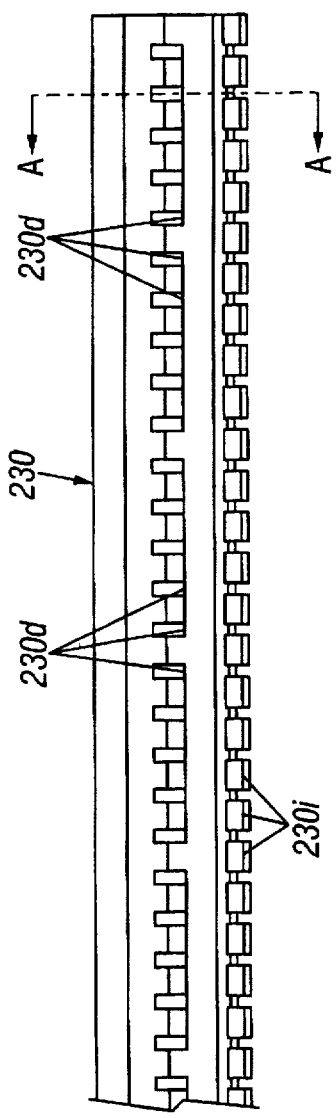
Figure 16B:
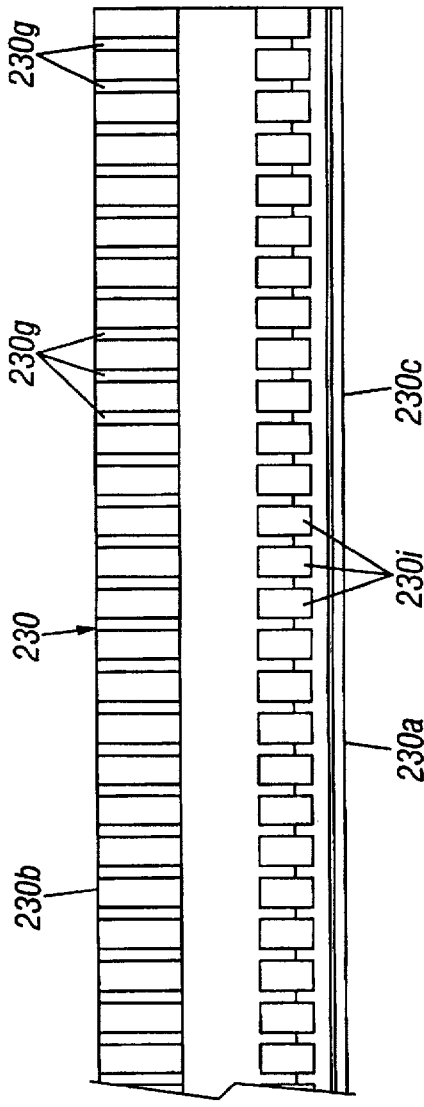

As shown in FIG. 13, the IC socket 210 is further provided with a plurality of (here, four) sliders 230 which individually press against the respective sides of the substrate 2 of the IC chip 1 to bring the electrodes 4 of the IC chip 1 into press-contact with the contact pins 220 at each side. The sliders 230 are made of a plastic. Referring to FIG. 15 through FIG. 17, each slider 230 has one end portion 230a pressing against the substrate 2 of the IC chip 1 and another end portion 230b on an opposite side thereof. A notch 230c for abutting against the side surface and upper surface of the substrate 2 of the IC chip 1 is formed in the one end portion 230a of each slider 230. Also, a plurality of arm insertion holes 230d opened on the other end portion 230b side are formed in each slider 230.

On the other hand, an arm 221 for insertion into an arm insertion hole 230d of the slider 230 is integrally formed on each contact pin 220. The arms 221 hold the slider 230 and, at the same time, impart a spring force to the slider 230 and guide the slider 230 so that it can move from an open position or retracted position away from the IC chip 1 (FIG. 17(a)) to a pressing position for pressing against the upper surface of the substrate 2 of the IC chip 1 (FIG. 17(b)) along the upper surface of the contact pins 220. The contact pins 220 can be easily formed by punching of a metal plate.

Figure 17B:
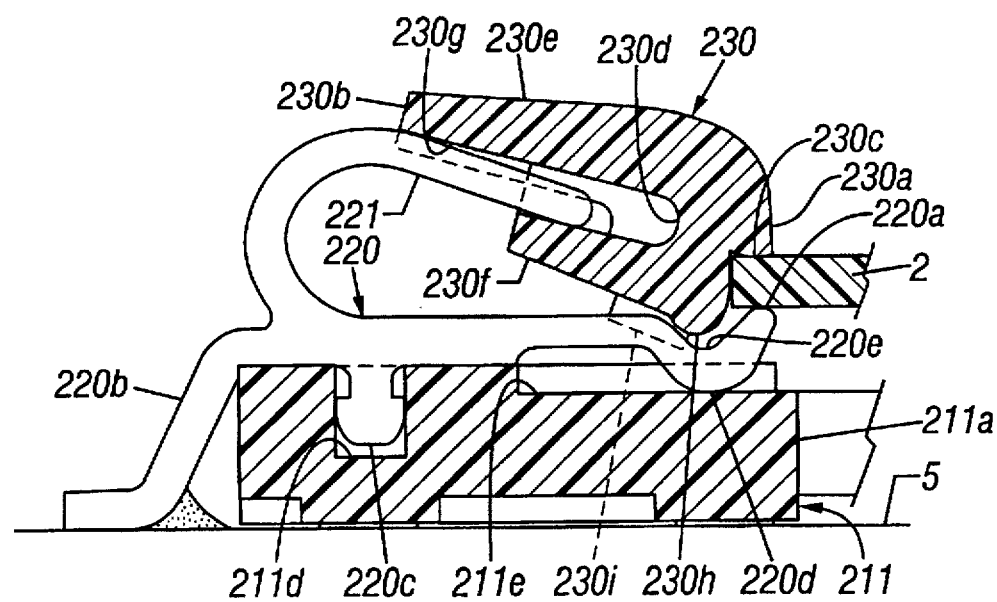

As shown in FIGS. 17(a) and 17(b), in the upper surface in the vicinity of the contact portion 220a of each contact pin 220, a recess 220e which moves the slider 230 reaching near the IC chip 1 downward under the spring force of the arm 221 is formed. Each arm 221 is extended inclined downward from above in the vicinity of the other end of the contact pin 220 toward the contact portion 220a of the contact pin 220 so that the spring force given to the slider 230 is increased as the slider 230 approaches the recess 220e of the upper surface of the contact pin 220. The base portion side of the arm 221 is formed to be bent so as to form an arc so as to impart a spring property to the arm 221.

Further, as shown in FIG. 17(a), the slider 230 has an upper thick portion 230e covering the upper surface of the arm 221 and a lower thick portion 230f covering the lower surface of the arm 221, and the upper thick portion 230e of the slider 230 is extended to the other end portion 230b side of the slider 230 longer than the lower thick portion 230f. The arm insertion holes 230d of the slider 230 are opened at the end surface of the lower thick portion 230f. Also, arm guide grooves 230g continuous to the arm insertion holes 230d are formed in the lower surface of the upper thick portion 230e of the slider 230. Further, in this embodiment, as seen from FIGS. 16(a) and 16(d), each five arm insertion holes 230d are mutually communicated on the lower side of the upper thick portion 230f. By such a shape, it becomes possible; to ensure the strength of the slider 230 and it becomes possible to ensure the strength of the mandrel (not illustrated) for forming the arm insertion holes 230d at the shaping of the slider 230.

Further, a slide contact portion 230h which is in sliding contact with the upper surfaces of the contact pins 220 is formed at the lower surface of one end portion 230a of the slider 230 so as to project therefrom. The slider 230 is formed so that only the slide contact portion 230h comes into sliding contact with the upper surfaces of the contact pins 220. Also, as shown in FIG. 15 and FIGS. 17(a) and 17(b), guide ribs 230i which are engaged so that they can slide between mutually adjoining contact pins 220 are formed on the lower surface of the slider 230 so as to project therefrom.

In the IC socket 210 having the above-described configuration, when a plurality of sliders 230 held by the arms 221 integral with the contact pins 220 are individually slid after placing the substrate 2 of the IC chip 1 on the contact portions 220a of the contact pins 220, when the sliders 230 move downward along the recess 220e of the upper surfaces of the contact pins 220 by the spring force of the arms 221, they individually push the sides of the substrate 2 of the IC chip 1 and bring the electrodes 4 of the IC chip 1 into press-contact with the contact portions 220a of the contact pins 220 for each side by their pressing force. In this case, it is necessary to ensure a desired contact pressure between the electrodes 4 of the IC chip 1 and the contact pins 220, but the electrodes 4 of the IC chip 1 can be individually brought into press-contact with the contact pins 220 at each of the sides by the sliders 230, and therefore the pressing force by the sliders 230 can be reduced. Accordingly, the sliding operation of the sliders 230 can be easily carried out with a light force. Moreover, also the pressing force applied to the IC chip 1 becomes small, and therefore it is possible to prevent an unnecessary stress from being applied to the IC chip 1 or the socket body 211. Particularly, since the portion pressing the IC chip by the sliders 230 and the portion supporting the IC chip by the contact pins 220 are located at positions almost opposite to each other and only a compression stress in the thickness direction is substantially produced in the IC chip 1, it is possible to prevent unnecessary stress from being applied upon internal circuits of the IC chip 1.

Also, it is possible to individually slide the sliders 230 to sequentially press against the sides of the substrate 2 of the IC chip 1, and therefore it is possible to move the IC chip 1 in the sliding direction of a slider 230 within a range of the clearance between the IC chip 1 and the socket body 211 in a state where the IC chip 1 is pressed by the slider 230. Accordingly, a wiping action can be produced between the electrodes 4 of the IC chip 1 and the contact portions 220a of the contact pins 220, and the reliability of the electrical connection can be improved.

Further, the sliders 230 are held at the arms 221 so as to cover the upper surfaces of the arms 220 on each side portion of the socket body 211, and therefore the sliders 230 are useful as covers protecting the upper portions of the contact pins 220 and arms 221. Also, it is possible to easily slide the sliders 230 by directly operating the sliders 230 from above the arms 221, and therefore a jig for sliding the sliders 230 etc. can be omitted, so the construction of the IC socket 210 can be simplified and, at the same time, the reduction of size and weight and particularly the reduction of thickness thereof becomes possible.

Here, explaining the operation of the arms 221 and the sliders 230 in further detail, when a slider 230 held at the arms 221 is located at the retracted position, as shown in FIG. 17(a), the slider 230 is in press-contact with the upper surfaces of the contact pins 220 at the position of the contact portions 230h by receiving the spring force of the arms 221. At this time, the spring force of the arms 221 acts on the slider 230 with the upper thick portion in the vicinity of the base portion of the arm 221 as a support point and with the lower surface of the tip portion of the arm 221 as the power point.

Figure 18:
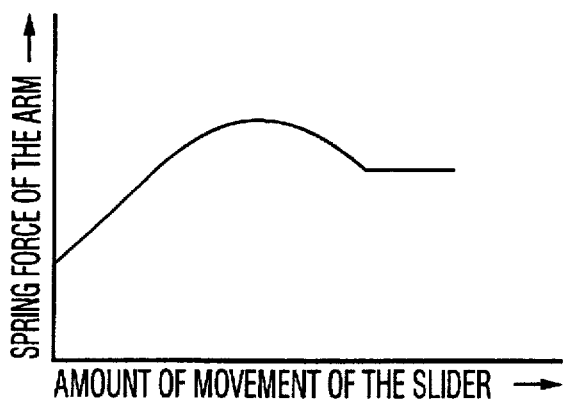
FIG. 18 is a graph schematically showing the change of the spring force of the arm when the slider of the IC socket of the fifth embodiment is moved.

Next, when the slider 230 is pushed from the retracted position to the direction of the IC chip 1, the slider 230 moves along the upper surfaces of the contact pins 220 while elastically deforming the downward inclined arms 221 upward. Accordingly, as the contact portion 230h of the slider 230 approaches the recesses 220e of the upper surfaces of the contact pins 220, the spring force of the arms 221 is increased. FIG. 18 shows the situation of change of the spring force of the arms 221 according to the movement of the slider 230. As shown in the same figure, when the slider 230 reaches the recesses 220e of the upper surfaces of the contact pins 220 and starts to move downward, the spring force of the arms 221 starts to fall from the peak value. As shown in FIG. 17(b), however, by a slight downward movement of the slider 230, the notch 230c of one end portion 230a of the slider 230 abuts against the upper surface of the substrate 2 of the IC chip 1, and therefore the spring force of the arms 221 becomes constant at a value slightly lower from the peak value.

In this way, the spring force of the arms 221 is increased as the slider approaches the recesses of the upper surfaces of the contact pins, and therefore when the slider 230 is slid against the spring force of the arms 221, that slider 230 can reach the upper surface of the substrate 2 of the IC chip 1.

Further, in an IC socket 210 having the above-described configuration, when a slider 230 is slid to press against one side of the substrate 2 of the IC chip 1, the side surface and upper surface of the substrate 2 of the IC chip 1 can be pressed by the notch 230c of the slider 230. Therefore, by sequentially pressing against the opposed two sides of the substrate 2 of the IC chip 1 by two sliders 230, a further effective wiping action can be produced between the electrodes 4 of the IC chip 1 and the contact portions the contact pins 220.

Also, since the upper thick portion 230e of the slider 230 covering the upper surfaces of the arms 221 is extended longer than the lower thick portion 230f of the slider 21, the upper portions of the arms 221 can be widely protected. Also, each arm insertion hole 230d of the slider 230 is formed short so as to open at the end surface of the lower thick portion 230f shorter than the upper thick portion 230e of the slider 230, and therefore the shaping of the slider 230, particularly the shaping of the arm insertion hole 230d becomes easy. Further, an arm guide groove 230g continuous to each arm insertion hole 230d is formed in the lower surface of the upper thick portion 230e of the slider 230, and therefore even if the slider 230 is slid, the slider 230 can be stably held on the arm 221 and, at the same time, mutually adjoining arms 221 can be stably held in a separated state by the arm guide groove 230g.

Also, when the slider 230 is slid, only the slide contact portion 230h of lower surface of one end portion 230a of the slider 230 can be brought into sliding contact with the upper surfaces of the contact pins 220, and therefore it is possible to reduce the sliding resistance of the slider 230 to facilitate the sliding operation thereof.

Further, it is possible to slide the slider 230 to the pressing position while maintaining mutually adjoining contact pins 220 at a constant interval by the guide ribs 230i of the slider 230, and therefore poor contact between electrodes 4 of the IC chip 1 and contact pins 220 due to the position deviation of the contact pins 220 can be reliably prevented, and the reliability of electrical contact between the electrodes 4 and the contact pins 220 can be further improved.

Figure 19:
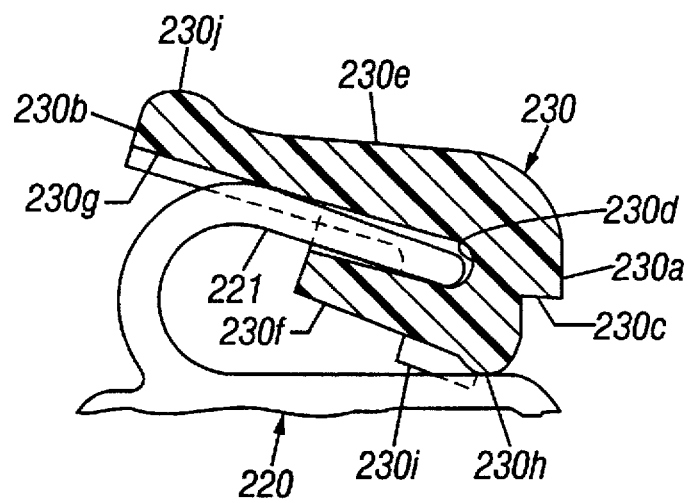
FIG. 19 is a partial cross-sectional view of the IC socket showing an example of a modification of the slider of the fifth embodiment.

FIG. 19 shows an example of a modification of the slider 230. In the same figure, constituent elements similar to those of the above-described fifth embodiment are given the same references. In this embodiment, the upper thick portion 230e of the slider 230 is extended longer than the slider 230 of the above-described embodiment. Also, a projection portion 230j provided with unevenness at the surface is formed on the upper surface of the other end portion 230b of the slider 230. Accordingly, by making the finger tip or the like abut against this projection portion 230j when sliding the slider 230, the slider 230 can be further easily pushed.

Figure 20:
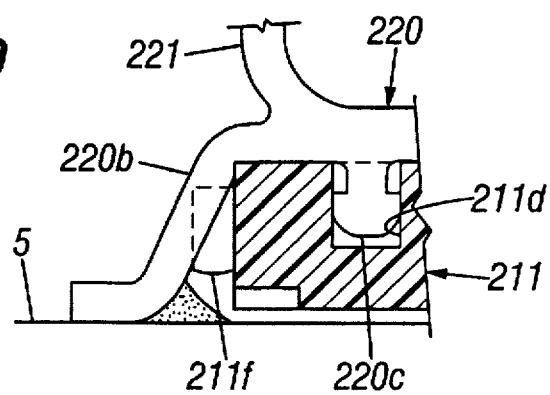
FIG. 20 is a partial cross-sectional view of the IC socket showing an example of a modification of an attachment of the contact pins of the fifth embodiment.
Figure 21A:
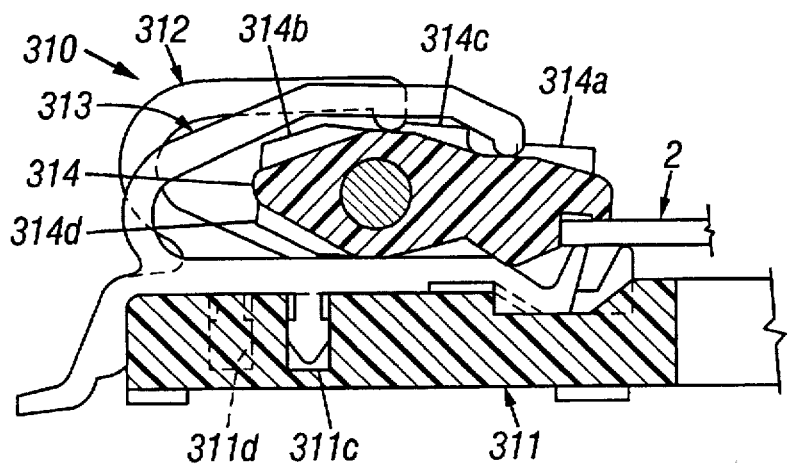
FIG. 21 shows an IC socket according to a sixth embodiment of the present invention which enables the manufacture of an ultrahigh density IC socket, in which (a) is a vertical cross-sectional view of a principal part of socket taken along a line 21(a)—21(a) of FIG. 22(a) in parallel to the first and second contact pins, (b) is similarly a vertical cross-sectional view taken along a line 21(b)—21(b) in FIG. 22(a) in contact with the surface of the first contact pin and from which the second contact pin on a rear side is omitted, and (c) is similarly a vertical cross-sectional view taken along a line 21(c)—21(c) in FIG. 22(a) in contact with the surface of the second contact pin and from which the first contact pin on the rear side is omitted.
Figure 21B:
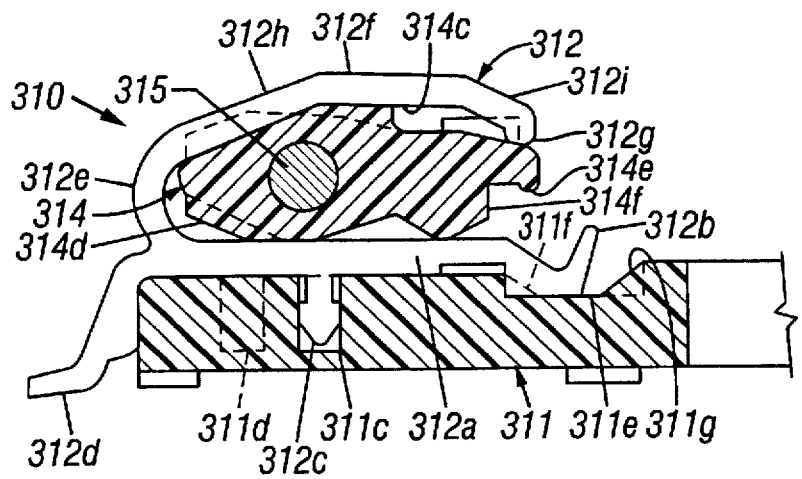
Figure 21B:
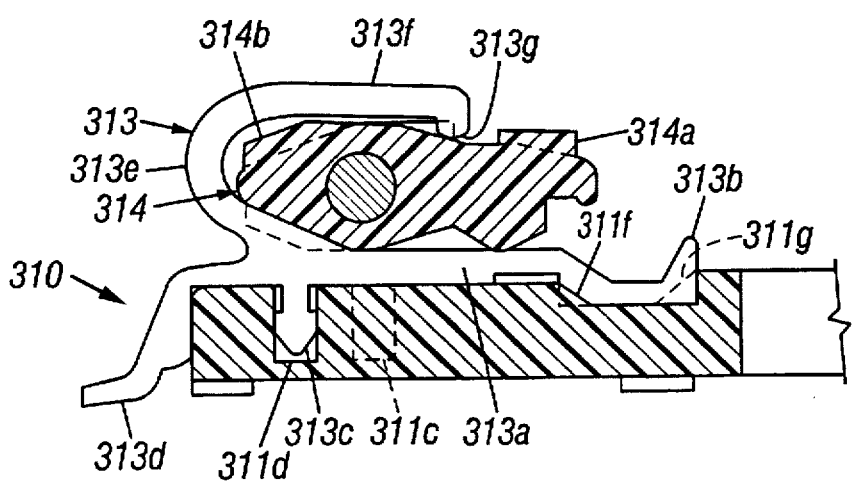
Figure 22A:
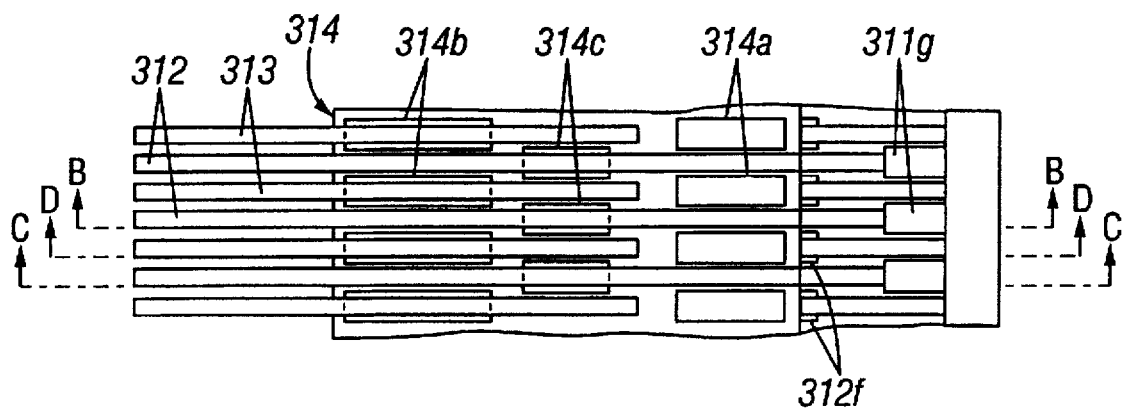
FIG. 22 is a rib arrangement view on a slider of the sixth embodiment, in which (a) is an explanatory view of a relationship with the first and second contact pins, (b) is a rib arrangement view of the upper surface, and (c) is a rib arrangement view of the lower surface.
Figure 22B:
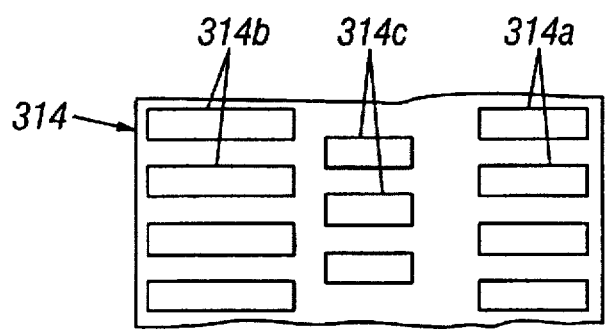
Figure 22C:
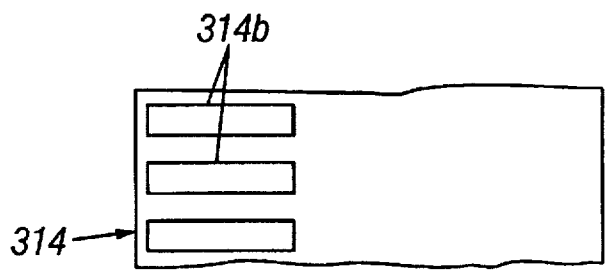
Figure 23:
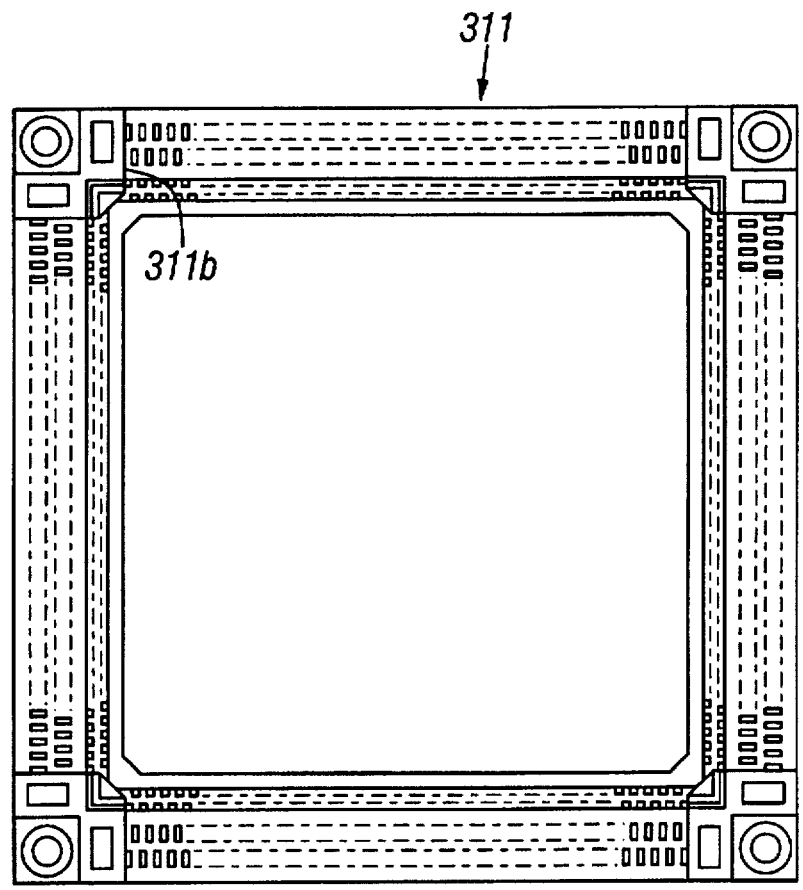
FIG. 23 is a schematic plan view of the socket body of the sixth embodiment.
Figure 24:
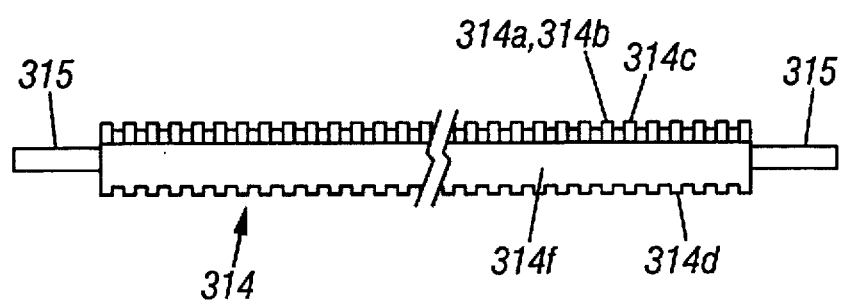
FIG. 24 is a side view of the slider of the sixth embodiment.

FIG. 20 shows an example of a modification of the attachment structure of the contact pins 220. In the figure, constituent elements similar to those of the fifth embodiment are given the same references. In this modified example, the guide ribs 211f sandwiching the external connection portion 220b of each contact pin 220 are formed on the outer surface of the socket body 211 so as to project therefrom. Accordingly, the external connection portions 220b of the contact pins 220 can be held at the predetermined pitch.

FIG. 21 through FIG. 24 show an IC socket 310 according to a sixth embodiment of the present invention by which an ultrahigh density arrangement of the contact pins is possible.

Referring to these figures, the IC socket 310 of the sixth embodiment is provided with a socket body 311 having a generally rectangular configuration. First contact pins 312 and second contact pins 313 are alternately arranged in parallel to each other so as to form rows on respective sides of the socket body 311. The socket body 311 is provided with positioning guides 311b positioned inside the rows of the first and second contact pins 312 and 313. The first and second contact pins 312 and 313 have lower side base portions 312a and 313a having a horizontal U-shape and upper continuous curved portions 313e and 313e constituting the arm and horizontal portions 312f and 313f. Upward contact portions 312b and 313b are provided on one end of the base portions 312a and 313a of the first and second contact pins 312 and 313, and external connection portions 312d and 313d projected downward to the outside of the socket body 311 are provided on the other end of the base portions 312a and 313a. Also, leg portions 312c and 313c projected downward are provided at substantially the centers of the base portions 312a and 313a. A slider 314 is arranged so that it can slide in a lateral direction in an inner space of the U-shape formed by an arrangement of the first and second contact pins 312 and 313.

In the contact pin arrangement section of the socket body 311, provision is made of first slits 311c and second slits 311d arranged in two rows so as to fit the leg portions 312c and 313c of the first and second contact pins 312 and 313, respectively, and first socket body ribs 311f and second socket body ribs 311g alternately arranged so that the first and second contact pins 312 and 313, inserted in the recesses 311e provided for insertion of the contact portions 312b and 313b, are inserted in the recesses 311e at the outside and inside positions of the socket body 311. The first and second slits 311c and 311d and the first and second socket body ribs 311f and 311g are arranged with same pitch, respectively, as the first and second pitches deviated from each other by a half pitch, so are overall arranged in a zigzag manner.

The leg portions 312c of the first contact pins 312 are inserted into the first slits 311c, the lower sides of the contact portions 312b are inserted between the first socket body ribs 311f of the recess 311e of the socket body 311, the tips of the curved portions 312e constitute oblique upward first inclined portions 312h, the tips thereof becomes horizontal portions 312f, and the further tips thereof become oblique downward second inclined portions 312i. The tips of these constitute the downward elastic portions 312g which resiliently press against the upper surface of the slider 314.

The leg portions 313c of the second contact pins 313 are inserted into the second slits 311d, the lower sides of the contact portions 313b are extended long and inserted between the second socket body ribs 311g of the recess 311e, the tips of the curved portions 312e immediately become horizontal portions 312f, and the tips of the horizontal portions 313f constitute the downward elastic portions 313g.

Ribs holding the intervals of the first and second contact pins 312 and 313 arranged at a constant interval are alternately arranged at the same intervals as that for the first and second slits 311c and 311d in the slider 314.

On the upper surface inside the socket, first ribs 314a arranged at the same pitch as that for the first or second contact pins 312 or 313, third ribs 314c arranged at the same pitch on the upper surface of an internal portion, second ribs 314b arranged at the same pitch on the upper surface on the outside of the socket, and fourth ribs 314d arranged on the lower surface of the outside of the socket are provided at the same pitch.

Also, the tip portion of the inside of the socket is constituted by a downward pressing portion 314e pressing against the IC chip, an abutment portion 314f defining the side surface position of the placed IC package and a pin 315 passed through in a longitudinal direction slightly outside from the center position.

The above-mentioned first and second ribs 314a and 314b are arranged at the same pitch as that for the second contact pins 313 and, at the position on the same vertical plane, and the third and fourth ribs 314c and 314d are arranged at the same pitch as that for the first contact pins 312 and on the same vertical plane.

In this case, the third ribs 314c are constituted so that the horizontal portions 312f of the first contact pins 312 pass above them, and the fourth ribs 314d are constituted so that they do not reach the part of the curved portions 312e, and therefore the first contact pins 312 are arranged at a position where they are not in contact with the third and fourth ribs 314c and 314d.

Also, the curved portions 313e and the horizontal portions 313f of the second contact pins 313 are directly connected, and therefore the second ribs 314b are constituted so as to be located on lower sides of this external connection parts. With respect to the first ribs 314a, the elastic portions 313g are constituted so as to be located at a rear position than the elastic portions 312g of the first contact pins 312, and therefore they do not come into contact with each other.

Where the IC chip is mounted on the above-mentioned IC socket, first, by both end portions of the contact pins 315, the slider 314 is slid to the outside direction of the socket by an exclusive detachment jig to expose the contact portions 312b and 313b, and the IC chip is placed on this.

In this case, where the positioning guides 311b separately exist, the IC chip is placed along them, whereby it is possible to bring the respective contact portions 312b and 313b and the terminals of the IC chip into coincidence with each other in their positions in advance.

When the sliders 314 are slid to the center direction of the socket by the exclusive insertion jig after mounting the IC chip, the pressing portions 314e are slid to the positions above the contact portions 312b and 313b, the IC chip is pressed against the contact portions 312b and 313b from the upper side by the elastic portions 312g and 313g of the contact pins 312 and 313 and, at the same time, the abutment portions 314f abut against the side surface of the IC chip, so the positioning is correctly executed.

Note that, where the IC chip is to be removed, it is sufficient if an operation reverse to that mentioned above is carried out.

FIG. 25 through FIG. 28 show the IC socket 310 according to a seventh embodiment of the present invention with which an ultrahigh density arrangement of the contact pins resembling the sixth embodiment is possible. In these figures, constituent elements similar to those of the sixth embodiment are given the same references.

Referring to these figures, the third contact pin 315 of the seventh embodiment is a contact pin having a short dimension, the leg portion 315c thereof is projected downward from the substantial center of the base portion 315a, the tip portion inside the socket is constituted by a part inserted into the recess 311e of the socket body 311, an upward contact portion 315b is formed at the center portion inside the recess 311e at a further tip portion thereof, and an insertion portion 315j formed with a right angle so as to be inserted between the socket body ribs 311f is formed on the leg portion 315c side of the insertion part.

An external connecting portion 315d for connection to the external circuit outside of the socket is formed at an end portion on the outside of the third contact pin 315.

The fourth contact pin 316 is a contact pin having a long dimension, the leg portion 316c thereof is projected downward on the external connecting portion 316d side on the outside from the center of the base portion 316a, the tip portion inside the socket is constituted by a part fully inserted into the recess 311e of the socket body 311, and at a further tip portion thereof, an upward contact portion 316b is formed. An insertion portion 316j formed with a right angle so as to be inserted between the socket body ribs 311g is formed on the lower side of this contact portion 316b.

Also, the leg portion side of the insertion part is formed so as to form an inclined plane portion 316h and pass above the socket body ribs 311f.

Figure 25:
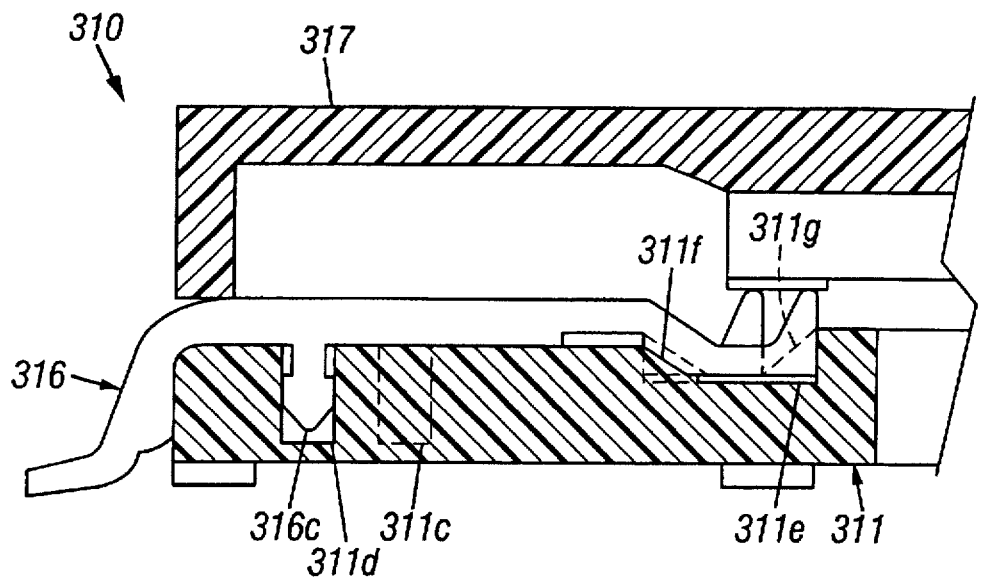
FIG. 25 is a vertical cross-sectional view of a part of the IC socket according to a seventh embodiment of the present invention.
Figure 26A:
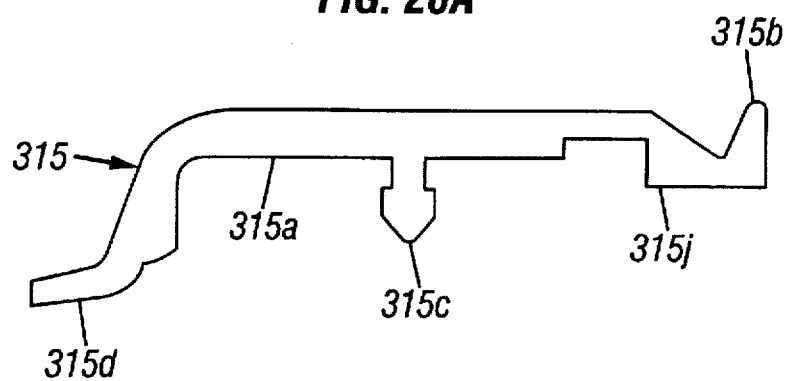
FIG. 26 shows contact pins of a seventh embodiment, in which (a) is a side view of a third contact pin, and (b) is a side view of a fourth contact pin.
Figure 26B:
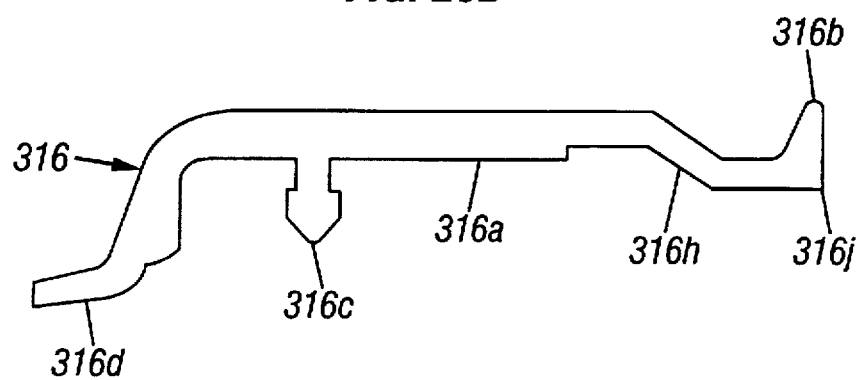
Figure 27:
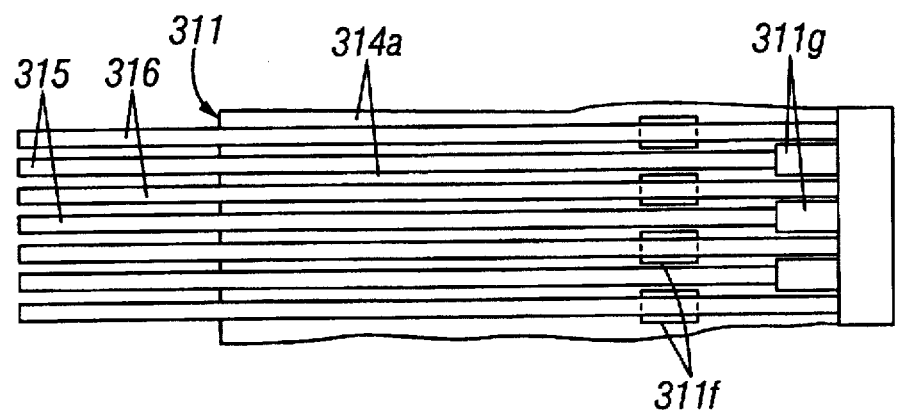
FIG. 27 is a plan view of a part of a socket viewing the contact pins of the seventh embodiment from above.

In the above-mentioned socket body ribs 311f and 311g, as shown in FIG. 25 and FIG. 27, both of the 311g on the inside of the socket of the recesses 311e and 311f on the outside thereof are formed in a triangle shape over a part of the side surface and lower surface, the 311g are positioned on an extension of the third contact pin 315, and the 311f are positioned on the lower side of the inclined plane portion 316k of the fourth contact pin 316.

Figure 28:
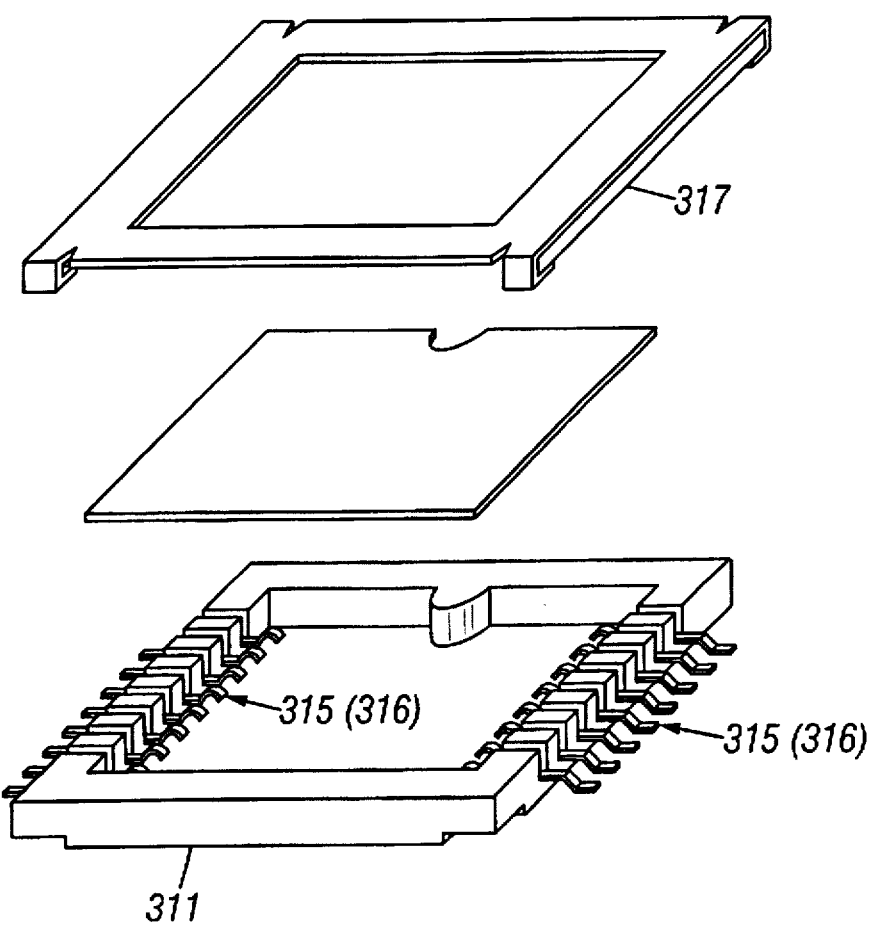
FIG. 28 is a schematic perspective view of an overall configuration of the IC socket of the seventh embodiment.
Figure 29:
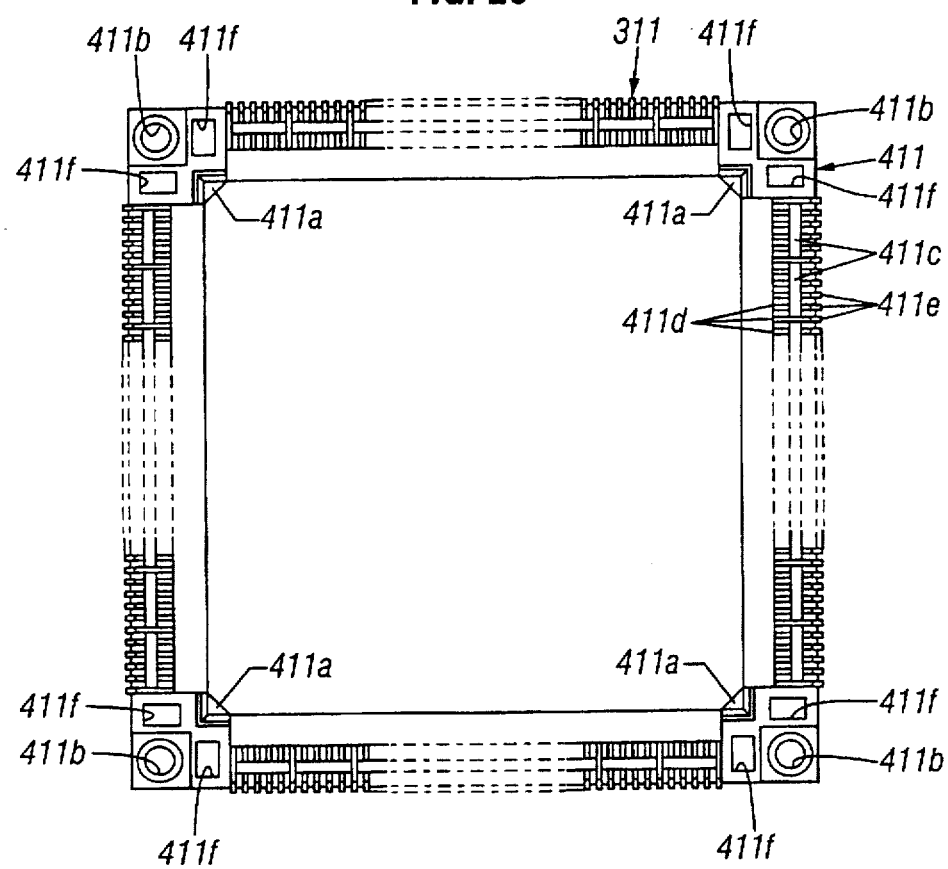
FIG. 29 is a schematic plan view of the socket body of the IC socket showing an eighth embodiment of the present invention.
Figure 30A:
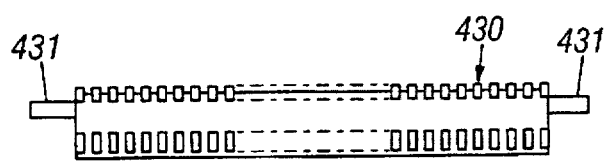
FIGS. 30(a), 30(b), 30(c) and 30(d) are a plan view, a front view, a right side view and a bottom view schematically showing the slider of the eighth embodiment, respectively.
Figure 30B:
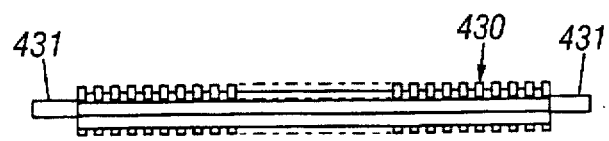
Figure 30D:
Figure 30C:
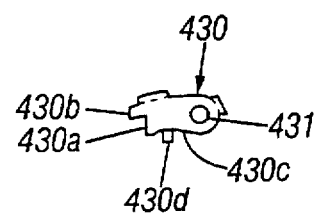

As one schematic example of an overall configuration of this socket, there is the one shown in FIG. 28. In this example, the IC chip is placed on the contact pins 315 and 316 arranged in the socket body 311, a pressing cap 317 is pushed from the upper side, and the pressing cap 317 is engaged with the socket body 311 to press the downward electrodes of the IC chip against the contact portions of the contact pins 315 and 316.

As mentioned above, in the sixth and seventh embodiments of the present invention, in the contact pin arrangement portion, at least one set of two ribs for maintaining the intervals of the contact pins and arranged at constant intervals on the left and right of a contact pin are disposed for each contact pin, one rib for mutually adjoining contact pins is placed at a substantially intermediate position of the arrangement of the set of the other ribs and one of the mutually adjoining contact pins is on the arrangement of the other ribs for the contact pins, and therefore it is possible to suppress an influence of thickness of the ribs, which limited making the arrangement intervals of the contact pins as narrower as possible, and so contact pins can be arranged with a very high density.

Also, by this, an ultrahigh density IC chip which has been conventionally impossible can be mounted on a printed board or the like in a manner enabling replacement.

FIG. 29 to FIG. 34 show an eighth embodiment of the present invention.

Referring to FIG. 29 through FIG. 32 at first, the IC socket indicated overall by the reference numeral 410 is provided with a socket body 411 having a generally rectangular configuration frame-like shape; made of a plastic. Corner engagement pieces 411a for engagement with for example the respective four corner portions of the substrate 2 of the IC chip 1 shown in FIG. 9 and for positioning the substrate 2 of the IC chip 1 on the socket body 411 are formed on the upper surface of the socket body 411 so as to project therefrom. Note that, so as to enable the wiping action in the front and rear direction mentioned later, the respective corner engagement pieces 411a position the IC chip 1 to an extent that allows a slightly free movement of the substrate 2 of the IC chip 1. Also, at the four corner portions of the socket body 411, positioning holes 411b for positioning the socket body 411 on the printed circuit board (not illustrated), temporarily stopping or fixing the same are formed at the four corner portions of the socket body 411. The positioning holes 411b can be used for guiding the jig for moving the slider mentioned later.

A large number of contact pins 420 are arranged on the upper surface of the respective side portions of the socket body 411 at constant intervals in directions orthogonal to the plate thickness direction thereof. Each contact pin 420 has a base portion 421 extended in an inward and outward direction of the side portion of the socket body 411 and an arm 422 constituting a spring means mentioned later, an upward contact portion 421a which is in contact with a terminal 4 of the IC chip 1 in the vicinity of the inner edge of the side portion of the socket body 411 and supports the bottom surface of the IC chip 1 is formed on one end of the base portion 421, and a surface mounting type lead terminal or external connecting portion 421b extended to the outside of the frame piece portion of the socket body 411 is formed at the other end of the base portion 421. This external connecting portion 421b is connected onto the circuit pattern of a printed circuit board (not illustrated) by for example soldering, etc. Between the contact portion 421a of the base portion 421 of the contact pin 420 and the external connecting portion 421b, a fitting portion 421c projected downward is formed in the vicinity of the external connecting portion 421b, and a fitting groove 411c accommodating the fitting portion 421c is formed in the upper surface of the socket body 411. Also, ribs 411d and 411e sandwiching in the base portion 421 of the contact pin 420 by the inside (front side) and the outside (rear side), respectively are provided on the upper surface of the socket body 411 so as to project therefrom. As seen from FIG. 31(a), the contact portion 421a of the contact pin 420 acts as a free end of the base portion 421 of the contact pin 420, and therefore the contact portion 421a of the contact pin 420 can warp and resiliently displaces in a thickness direction, that is, in an arrangement direction of the contact pins 420 with the fitting portion 421c or the rib 411d on the front side (inner side) thereof as the support point.

Figure 31A:
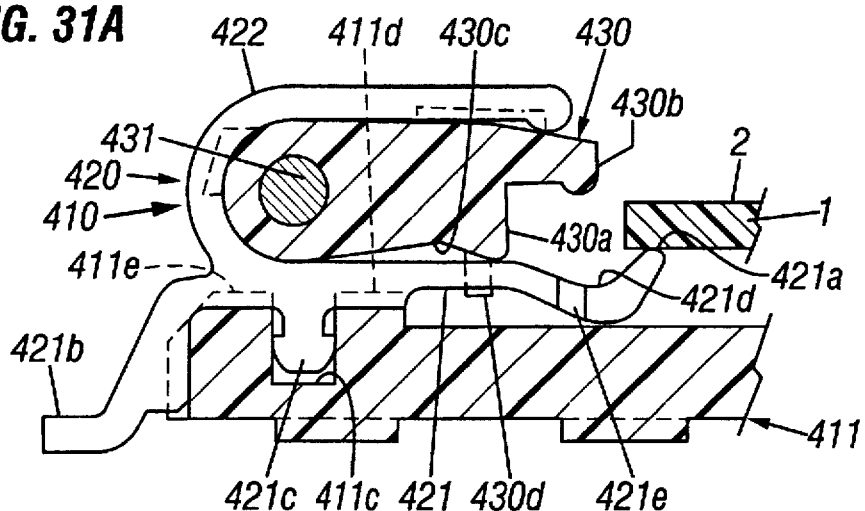
FIGS. 31(a), 31(b) and 31(c) are vertical cross-sectional views of a principal part for explaining a method of use of the IC socket of the eighth embodiment, respectively.

A slider 430 extended along the arrangement direction of the contact pins 420 is provided on the respective side portions of the IC socket 410 so that it can move along the length direction of the base portions 421 of the contact pins 420. As shown in FIG. 31(a), a side surface abutment portion 430a which can abut against the side surface of the substrate 2 of the IC chip 1 and a pressing portion 430b which can abut against the upper surface of the substrate 2 are formed on one end of the slider 430. A shaft 431 passing through the slider 430 in the length direction is integrally provided at the other end portion of the slider 430 by for example insert shaping, etc., and both ends of this shaft 431 are projected outward from the opposite end portions of the slider 430, respectively. The slider 430 is held between the base portions 431 of the contact pins 420 and the arms 422. By this, the slider 430 can move between an open position at which the pressing portion 430b opens the mounting region of the IC chip 1 (refer to FIG. 31(a)) and a clamp position at which the pressing portion 430b comes into press-contact with the upper surface of the substrate 2 of the IC chip 1, and one end surface 430a abuts against the side surface of the substrate 2 (refer to FIG. 31(c)) along the upper surface of the base portion 421. The vicinities of the contact portions 421a of the base portions 421 are bent downward to exhibit a convex shape, whereby recesses 421d are formed in the upper surfaces in the vicinity of the contact portions 421a of the base portions 421. Then, corresponding to the recesses 421d, recesses 430c are formed in the lower surface of the slider 430. Accordingly, when the pressing portion 430b of the slider 430 approaches the upper surface of the substrate 2 of the IC chip 1 from the open position, one end of the lower surface of the slider 430 moves downward along the recesses 421d, and therefore also the pressing portion 430b of the slider 430 moves downward while advancing accompanied with this, and abuts against the upper surface of the substrate 2 of the IC chip 1 (refer to FIG. 31(b)). Then, thereafter the slider 430 can further advance while making the pressing portion 430b abut against the upper surface of the substrate 2, and the side surface abutment portion 430a of the slider 430 abuts against the side surface of the substrate 2 in the end (refer to FIG. 31(c)), but when there is a clearance between the substrate 2 of the IC chip 1 and the corner portion 411a of the socket body 411, it is possible to make the slider 430 further advance exactly by an amount of that clearance and push the side surface of the substrate 2 of the IC chip 1 by the side surface abutment portion 430a.

The contact pin 420 is made of a metal which is rich in a spring property, and the slider 430 is formed so as to gradually open the arms 422 upward with respect to the base portions 421 when the slider 430 moves from the open position to the clamp position. Therefore as the slider 430 approaches the substrate 2 of the IC chip 1 from the open position, a spring force accumulated in the arms 422 rises. This spring force reaches a peak immediately before the pressing portion 430b reaches the upper surface of the substrate 2 and adds a spring force which is slightly smaller than the peak value but greatly increased than that at the time of the open position to the upper surface of the slider 430. Accordingly, the pressing portion 430b of the slider 430 is brought into press-contact with the upper surface of the substrate 2 by its spring force, and simultaneously the terminals 4 of the bottom surface of the substrate 2 are brought into press-contact with the contact portions 421a of the contact pins 420. Then, after the pressing portion 430b reaches the upper surface of the substrate 2, the slider 430 further advances while holding the arms 422 at almost a constant degree of opening, and therefore the pressing force applied to the slider 430 is held almost constant.

As mentioned above, when there is a clearance between the substrate 2 of the IC chip 1 and a corner portion 411a of the socket body 411, after the side surface abutment portion 430a abuts against the side surface of the substrate 2 of the IC chip 1, the slider is further advanced exactly by an amount of that clearance and the side surface of the substrate 2 of the IC chip 1 can be pushed by the side surface abutment portion 430a. Accordingly, it is possible to produce a wiping action in the movement direction, that is the front to rear direction of the slider 430 between the terminals 4 of the IC chip 1 and the contact portions 421a of the contact pins 420. This wiping action in the front to rear direction can be caused by reciprocation once each in the front and rear direction by individually moving the opposed two sliders 430. Accordingly, a more effective wiping action is obtained. Also, it is possible to individually move the sliders 430 on the respective side portions of the socket body 411, and therefore the operating force required for the movement of the individual sliders 430 can be made small. Accordingly, it is possible to reduce the stress acting on the IC chip 1 and, at the same time, easily perform the attachment work of the IC chip 1 by a small force.

Further, in an IC socket 410 of the eighth embodiment, as shown in FIG. 31 and FIG. 32, bent portions 421e projected to one side thereof are provided in the base portions 421 of the contact pins 420, and a plurality of engagement members 430d engageable with the bent portions 421e are provided on the lower surface of the slider 430. In this embodiment, as shown in FIG. 32, the bent portions 421e of the contact pins 420 are alternately projected in opposite directions in an order of the arrangement of the contact pins 420. Also, engagement members 430d are arranged on both side surfaces of the base portions 421 of the contact pins 420. The engagement members are determined to pass the bent portions 421e while resiliently displacing the base portions 421 of the contact pins 420 to the side during a period when the pressing portion 430b of the slider 430 reaches the upper surface of the IC chip 1 from the open position separated from the IC chip 1, and further advances along the upper surface, whereby the contact portions 421a of the contact pins 421 and the terminals 4 of the IC chip 1 rub each other in a direction orthogonal to the movement direction of the slider 430, and therefore a so-called wiping action of a left and right direction can be produced between the contact portions 421e and the terminals 4.

Figure 31B:
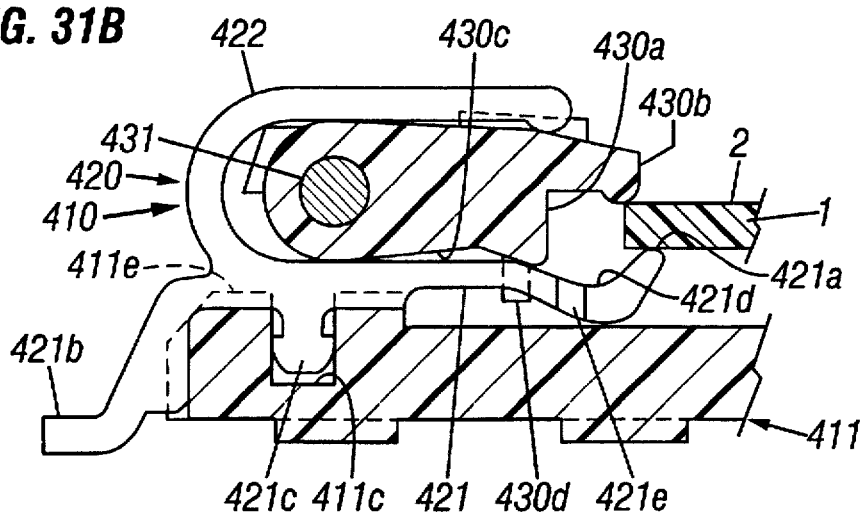
Figure 31C:
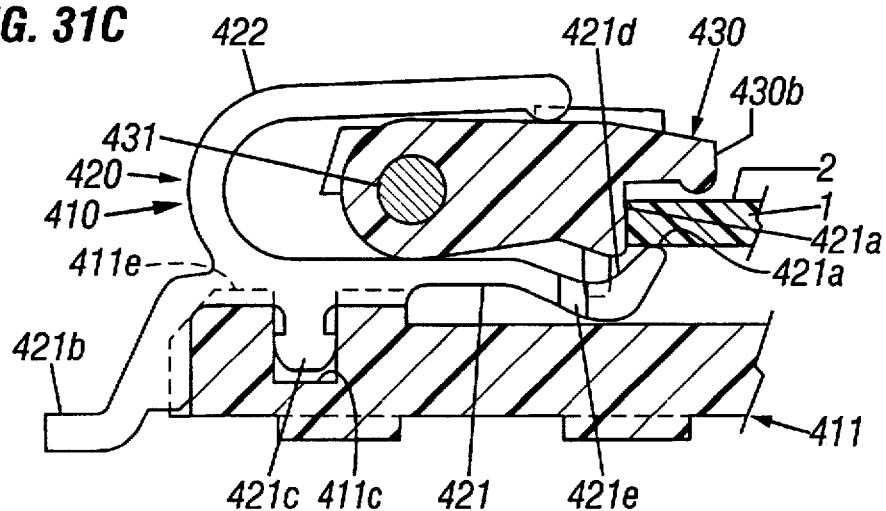
Figure 32A:
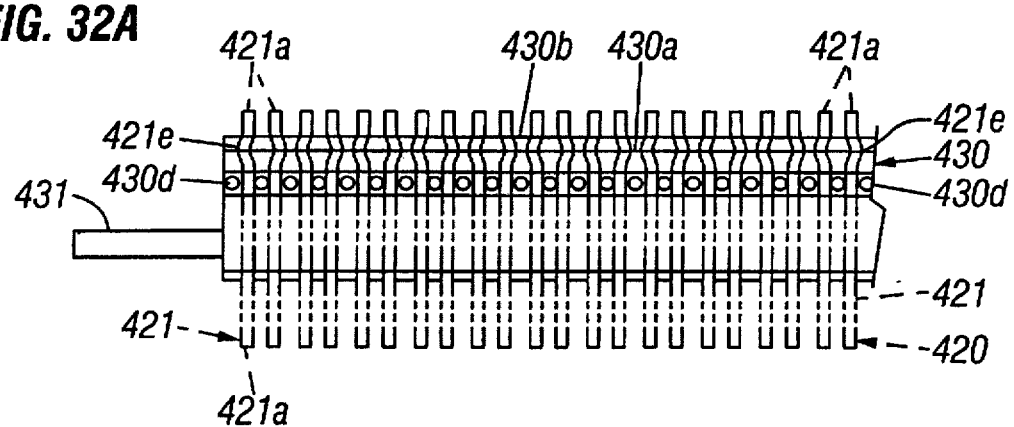
FIGS. 32(a), 32(b), 32(c) and 32(d) are schematic bottom views of a principal part for explaining the operation of the slider and the contact pins in the IC socket of the eighth embodiment, respectively.
Figure 32B:
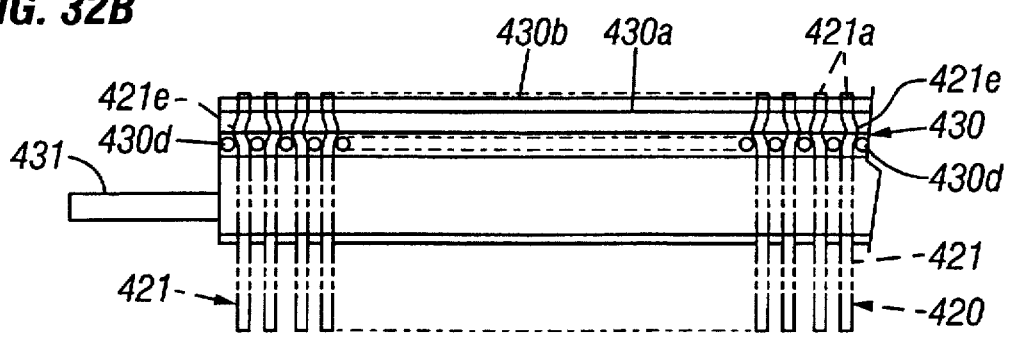
Figure 32C:
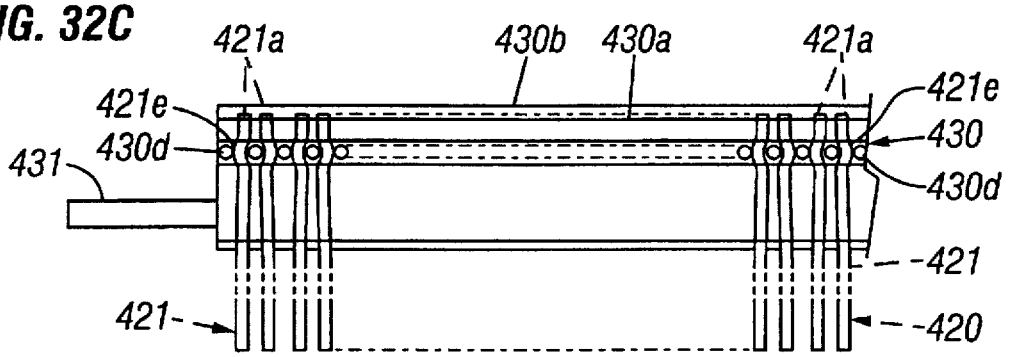
Figure 32D:
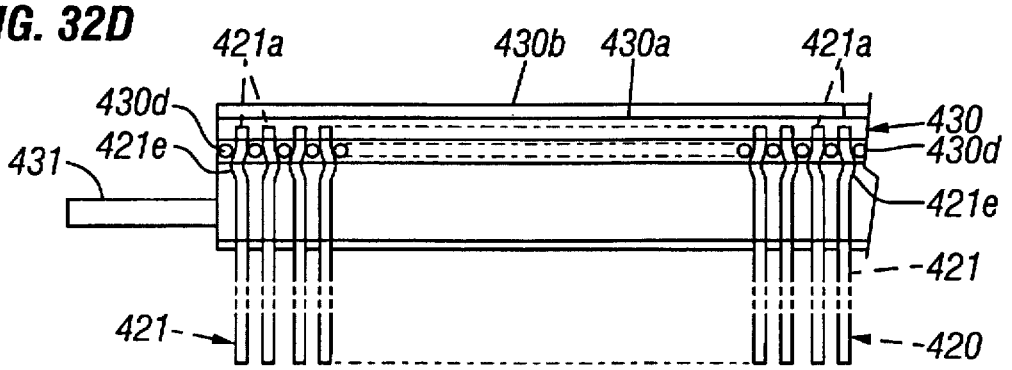

Explaining in further detail the function of the engagement members 430d and the bent portions 421e, when the slider 430 is at the open position, as shown in FIG. 31(a) and FIG. 32(a), the engagement members 430d exist before the bent portions 421e. When the slider 430d advances from the open position and the pressing portion 430b reaches the upper surface of the substrate 2 of the IC chip 1, as shown in FIG. 31(b) and FIG. 32(b), the engagement members 430d reach the bent portions 421e. Thereafter, when the slider 430 further advances, as shown in FIG. 32(c), the engagement members 430d are engaged with the bent portions 420e of the contact pins 420 and press the projection portion side thereof in the thickness direction, thereby to warp and resiliently displace the contact pins 420 and displace the contact portions 421a of the contact pins 420 in the left and right direction, that is, in a direction substantially orthogonal to the movement direction of the slider 430. Then, as shown in FIG. 31(c) and FIG. 32(d), when the side surface abutment portion 430a of the slider 430 abuts against the side surface of the substrate 2 of the IC chip 1, since the engagement members 430d have passed the bent portions 421e, the contact portions 421a of the contact pins 421 return to the position before the displacement. In this way, it is possible to resiliently displace the base portions 421 of the contact pins 420 in the direction substantially orthogonal to the movement direction of the slider 430 to make the contact portions 421a reciprocate one time during a period when the side surface abutment portion 430a of the slider 430 abuts against the side surface of the substrate of the IC chip 1 after the pressing portion 430b of the slider 430 reaches the upper surface of the substrate 2 of the IC chip 1. Then, during this time, the spring force of the arms 422 of the contact pins 420 act on the upper surface of the substrate 2 of the IC chip 1 via the slider 430, and therefore the terminals 4 of the IC chip 1 and the contact portions 421a of the contact pins 420 can be rubbed against each other effectively under a required contact pressure in a direction orthogonal to the movement direction of the slider 430, and a so-called wiping action in a left to right direction can be obtained. The amount of mutual rubbing between the contact portions 421a and the terminals 4 of the IC chip 1 differs depending upon the contact pressure between the terminals 4 and the contact portions 421a, the shape of the tips of the contact portions 421a, etc., but desirably it is about 0.05 mm or more.

Also, in the IC socket having the above-described configuration, the engagement members 430d of the slider 430 move in a state where they sandwich the base portions 421 of the contact pins 420 between two engagement members 430d and pass through the bent portions 421e, and therefore it is possible to warp and resiliently displace the base portions 421 while defining the twist displacement of the base portions 421 by two engagement members 430d. Accordingly, it is possible to further reliably produce a wiping action in a direction orthogonal to the movement direction of the slider 430 between the contact portions 421a of the contact pins 420 and the terminals 4 of the IC chip 1.

Also, the contact portions 421a of the contact pins 420 alternately displace in opposite directions in an order of arrangement of the contact pins 420 when the engagement members 430d pass through the bent portions 421e of the contact pins 420, and therefore it is possible to reliably prevent the IC chip 1 from moving following the movement of the contact portions 421a of the contact pins 420. Accordingly, it is possible to further reliably produce a wiping action between the contact portions 421a of the contact pins 420 and the terminals 4 of the IC chip 1.

Further, when the sliders 430 are going to return to the open position from the clamp position, the bent portions 421e of the contact pins 420 abut against the engagement members 430d of the sliders 430, so act as a stopper with respect to that return motion, and therefore it is possible to prevent the IC chip 1 from carelessly being dropped from the socket body 411.

Figure 33:
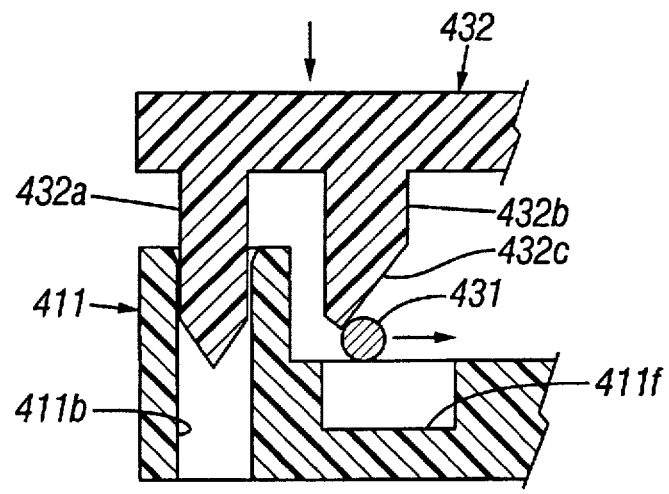
FIG. 33 is a cross-sectional view of a principal part showing an insertion jig for moving the slider of the eighth embodiment from an open position to a clamp position.

FIG. 33 shows an insertion jig 432 for moving the sliders 430 from the open position to the clamp position. When the guide posts 432a of the insertion jig 432 are inserted into the positioning hole 411b of the socket body 411, the inclined planes 432c provided in the leg portions 432b of the jig 432 abut against the shafts 431 projected from the opposite ends in the length direction of the sliders 430, and when the jig 432 is further pushed down, the shafts 431 are pressed to an inward side of the side portion of the socket body 411 by the inclined planes 432c of the leg portions 432b, and therefore the sliders 430 can be moved from the open position to the clamp position. Recesses 411f for accommodating the leg portions 432b are formed in the socket body 411.

Figure 34:
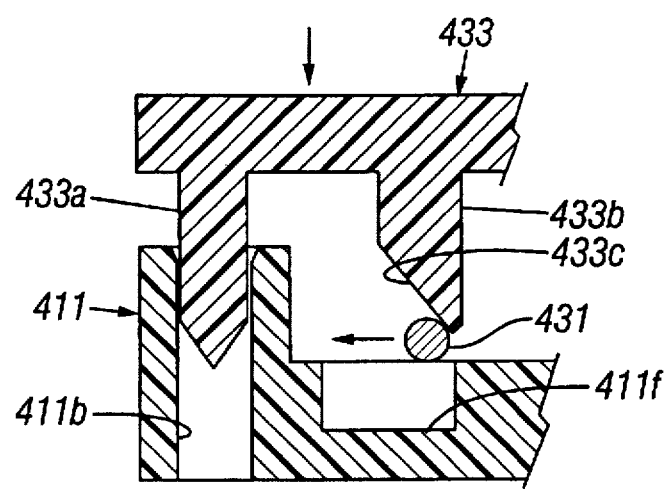
FIG. 34 is a cross-sectional view of a principal part showing a pull-out jig for moving the slider of the eighth embodiment from the clamp position to the open position.

FIG. 34 shows a pull-out jig 433 for moving the slider 430 from the clamp position to the open position. The pull-out jig 433 is formed so that the inclined planes 433c of the legs 433b abutting against the shafts 431 press against the shafts 431 in a reverse direction to that for the jig 432. The rest of the configuration is similar to the jig 432. The guide posts 433a are inserted into the positioning holes 411b of the socket body 411 and pushed down, whereby the sliders 430 can be easily moved from the clamp position to the open position.

Figure 35:
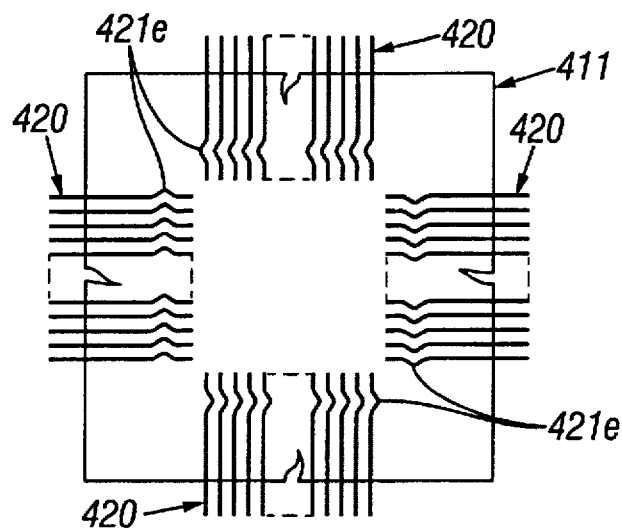
FIG. 35 is a schematic structural view of a principal part of the IC socket showing an example of a modification in which a change is added to the orientation of the bent portions of the contact pins of the eighth embodiment.
Figure 36:
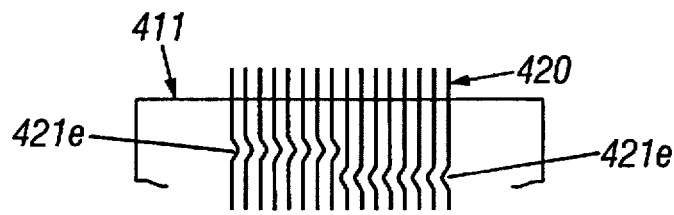
FIG. 36 is a schematic structural view of a principal part of the IC socket showing another example of a modification in which a change is added to the orientation of the bent portions of the contact pins of the eighth embodiment.

As mentioned before, it is preferred if the bent portions 421e of the contact pins 420 arranged at the respective side portions of the socket body 411 are provided so as to project alternately in reverse directions, but it is also possible to make the bent portions 421e of the contact pins 420 project in the same direction at every side portion. Note, in this case, if all of the bent portions 421e of the contact pins 420 on the side portions are projected in the same left and right direction with respect to the movement direction of the sliders 430, it becomes easy for the IC chip 1 to move in the clockwise direction or the counterclockwise direction by the warp elastic displacement of the contact pins 420, and therefore, as schematically shown in FIG. 35, preferably the projection directions of the bent portions 421e are reversed for every side portion.

Moreover, it is also possible even if the bent portions 421e of the contact pins 420 arranged on the respective side portions are reversed in their projection directions in units of groups comprising a plurality of bent portions. Note, in this case, where the interval between the contact pins is narrow, as shown in the same figure, preferably the positions of the bent portions having different directions are made different in the length direction of the contact pins 421.

Figure 37:
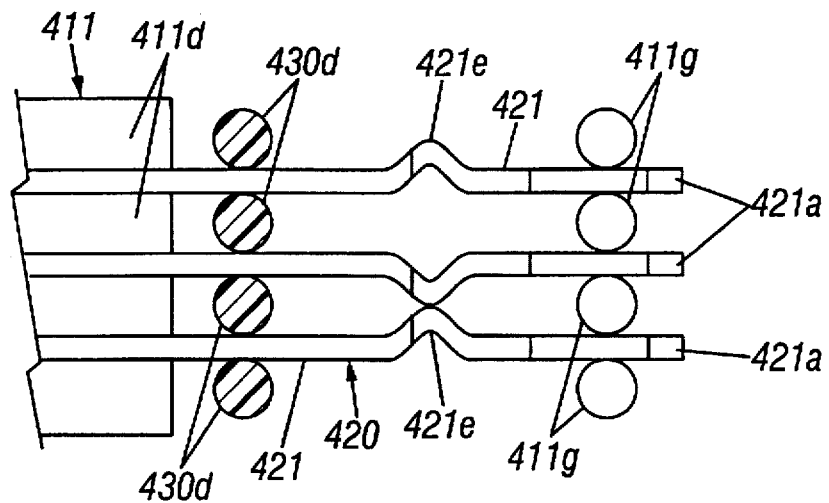
FIG. 37 is a plan view of the principal part showing an example of a modification of a support construction of the contact pins of the eighth embodiment.

Further, where the interval between the respective contact pins 420 is narrow and, the bending directions of the bent portions 421e of the adjoining contact pins 420 differ, when the engagement members 430d of the sliders 430 are engaged with the bent portions 421e, there is an apprehension that the contact portions 421a of the adjoining contact pins 420 will come into contact with each other and if a power were applied to the contact pins 420 at the time of movement of the sliders 430, a short-circuit would be caused. Therefore, as shown in FIG. 37, it is sufficient if fixing portions 411g sandwiching the base portions 421 of the contact pins 420 between the bent portions 421e and the contact portions 421 of the contact pin 420 be provided in the socket body 411. If such fixing portions 411g exist, the amount by which the contact portions 421a can resiliently displace in the thickness direction of the contact pins is restricted, and it is possible to prevent the contact portions 421a of adjoining contact pins 421 from coming into contact with each other.

Figure 38:
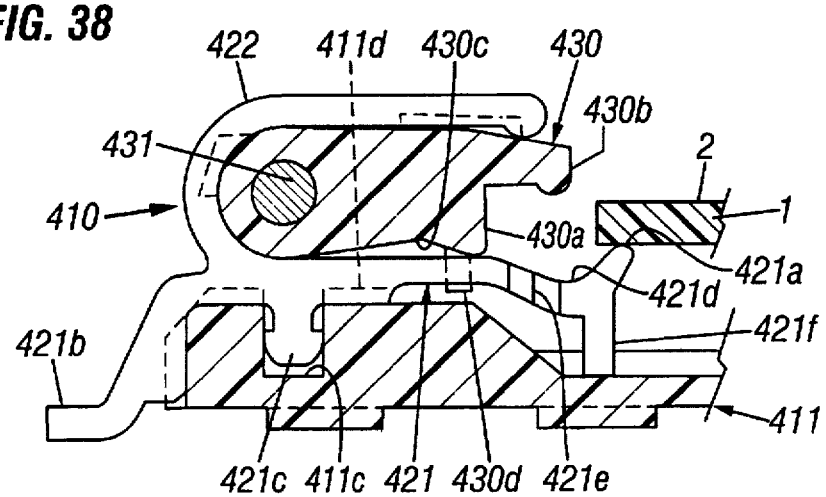
FIG. 38 is a vertical cross-sectional view of the principal part of the IC socket showing a ninth embodiment of the present invention resembling the eighth embodiment wherein the contact pins have support legs.

FIG. 38 shows a ninth embodiment of the present invention resembling the eighth embodiment. In the figure, constituent elements similar to those of the eighth embodiment are given the same references. In the IC socket of this ninth embodiment, a support leg 421f extended downward from between the contact portion 421a and the bent portion 421e and supported at the lower end portion by the socket body 411 is provided in the base portion 421 of each contact pin 420. In this embodiment, since the lower end portion of the support leg 421f positioned between a contact portion 421a and a bent portion 421e of the contact pin 420 is supported by the socket body 411, when an engagement member 430d of the slider 430 passes the bent portion 421e of the contact pin 420 and the base portion 421 of the contact pin 420 is resiliently displaced to the side, the contact portion 421a of the contact pin 420 can easily warp and resiliently displace to the side of the contact pin 420, that is, in the thickness direction with the lower end portion of the support leg 421f as the support point. Namely, where the support leg 421f does not exist, when the engagement member 430d of the slider 430 passes the bent portion 421e of the contact pin 420, it can be considered that the contact portion 421a of the contact pin 420 having come into press-contact with the bottom surface terminal 4 of the IC chip 1 acts as the support point and the base portion 421 of the contact pin 420 twists and resiliently displaces. Then, when such a twist elastic displacement occurs, it becomes impossible to obtain the wiping action in the contact portion 421a of the contact pin 420. Contrary to this, when the lower end portion of the support leg 421f positioned between the contact portion 421a of the contact pin 420 and the bent portion 421e is supported by the socket body 411, the above-described twist elastic displacement is suppressed, it is possible to easily make the contact portion 421a of the contact pin 420 warp and resiliently displace to the side, that is, in the thickness direction. Accordingly, it is possible to reliably produce a wiping action in a direction substantially orthogonal to the movement direction of the slider 430 (left and right direction) between the contact portion 421a of the contact pin 420 and a terminal 4 of the IC chip 1.

Figure 39:
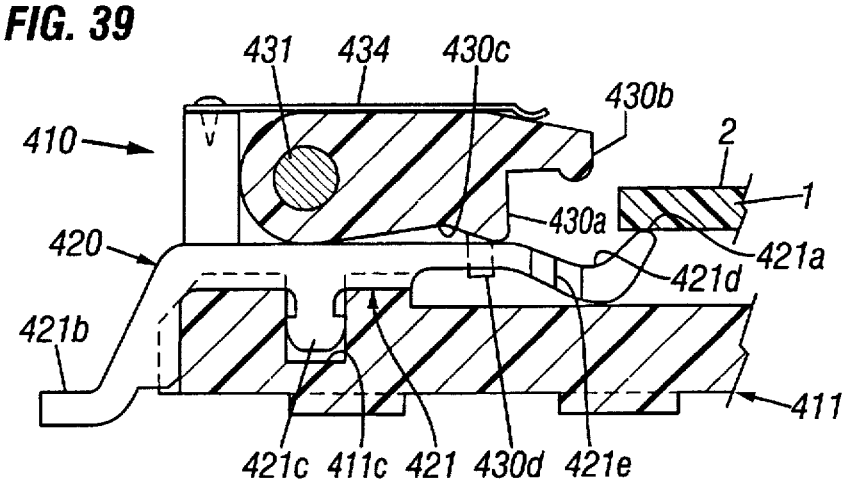
FIG. 39 is a vertical cross-sectional view of the principal part of the IC socket showing a 10th embodiment of the present invention resembling the eighth embodiment, wherein a spring means pressing against the slider is formed separately from the contact pin.

FIG. 39 shows a 10th embodiment of the present invention resembling the eighth embodiment. In the figure, constituent elements similar to those of the eighth embodiment are given the same references. In the IC socket of the eighth embodiment, the arm 422 of the contact pin 420 constitutes the spring means, but in the IC socket of the 10th embodiment, the spring plate 434 pressing against the upper surface of the slider 430 is formed separately from the contact pin 420 and fixed on the socket body 411. Where a spring plate 434 separately provided from the contact pin 420 is used in this way, it is possible to separate the spring plate 434 covering the upper surface of the slider 430 to a state nonconductive to the contact pin 420, and therefore it is possible to prevent the risk of short-circuiting of the contact pins 420 due to a dropped object, etc. Moreover, it is also possible to utilize the upper surface of the spring plate 434 as the display portion of the product name, mold number, etc., which is convenient.

Note that, the spring plate 434 of the illustrated embodiment is constituted by one plate, but it is also possible to arrange a plurality of plate materials in parallel in an arrangement direction of the contact pins 420 to constitute the spring plate 434. When the spring plate 434 is constituted by a plurality of plate materials, even if the slider 430 or the spring plate 434 has a corrugated shape, it is possible to prevent a situation wherein the slider 430 and the spring plate 434 come into contact only by one part. Also, even if the spring plate 430 is constituted by one plate, a plurality of notches are provided in the end portion on the pressing portion 430b side of the slider 430 to make a substantially comb-like shape, whereby it is possible to prevent a situation wherein the slider 430 and the spring plate 434 come into contact only by one part.

Figure 40:
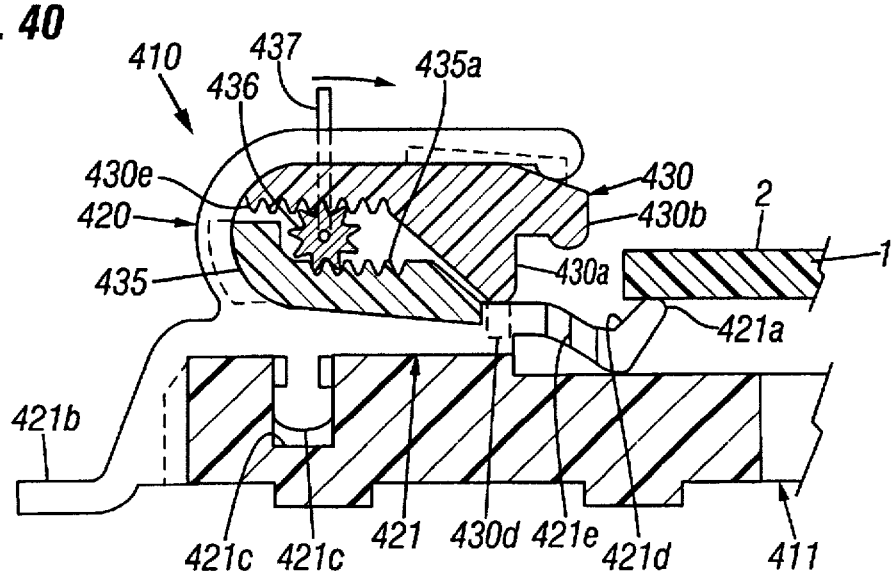
FIG. 40 is a vertical cross-sectional view of the principal part of the IC socket showing an 11th embodiment of the present invention resembling the eighth embodiment, providing a slider driving mechanism.

FIG. 40 shows an 11th embodiment of the present invention resembling the eighth embodiment. In the figure, constituent elements similar to those of the eighth embodiment are given the same references. In this embodiment, similar to the fourth embodiment of FIG. 10, a rack 430e is formed in the slider 430. At the same time, a rack 435a opposed to the rack 430e of the slider 430 is formed in the stationary member 435, and a pinion 436 engaged with the racks 430e and 435a is provided between the slider 430 and the rack 430e. A lever 437 for operation is fixed on one end portion or both end portions of the pinion 436. When the pinion 436 is rotated by operating this lever 437, the pinion 436 moves the slider 430 while pivoting on the rack 435a of the stationary member 435. Accordingly, in this embodiment, the slider 430 can be easily moved without the use of a jig as shown in FIG. 33 and FIG. 34.

Figure 41A:
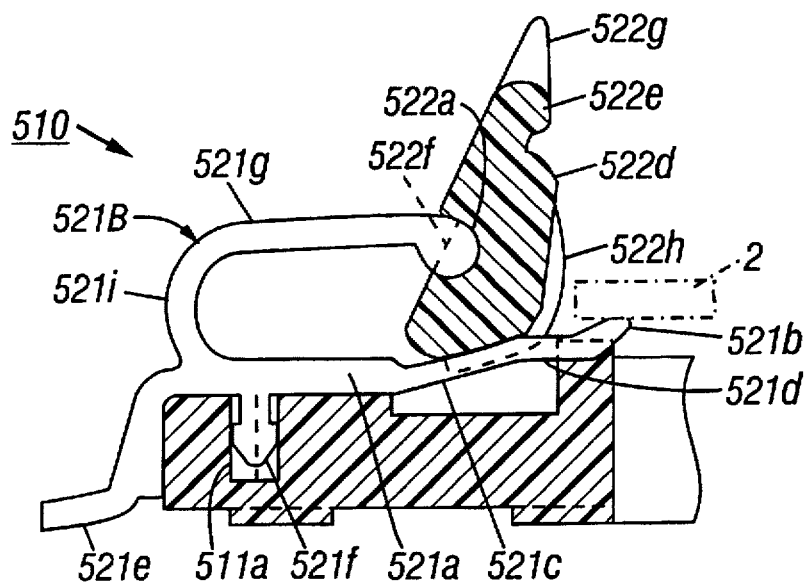
FIG. 41 shows a part of the IC socket according to a 12th embodiment of the present invention, in which (a) is a vertical cross-sectional view in a state where the IC chip is not mounted and (b) is a vertical cross-sectional view in a state where the IC chip is mounted.
Figure 41B:
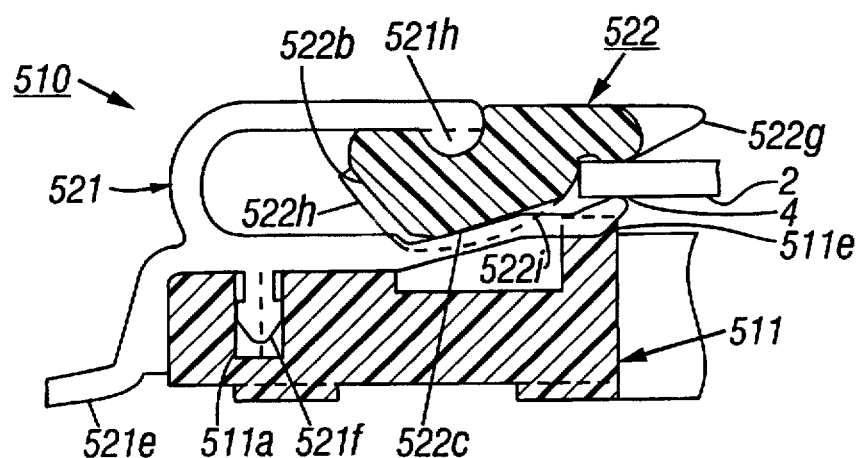
Figure 42:
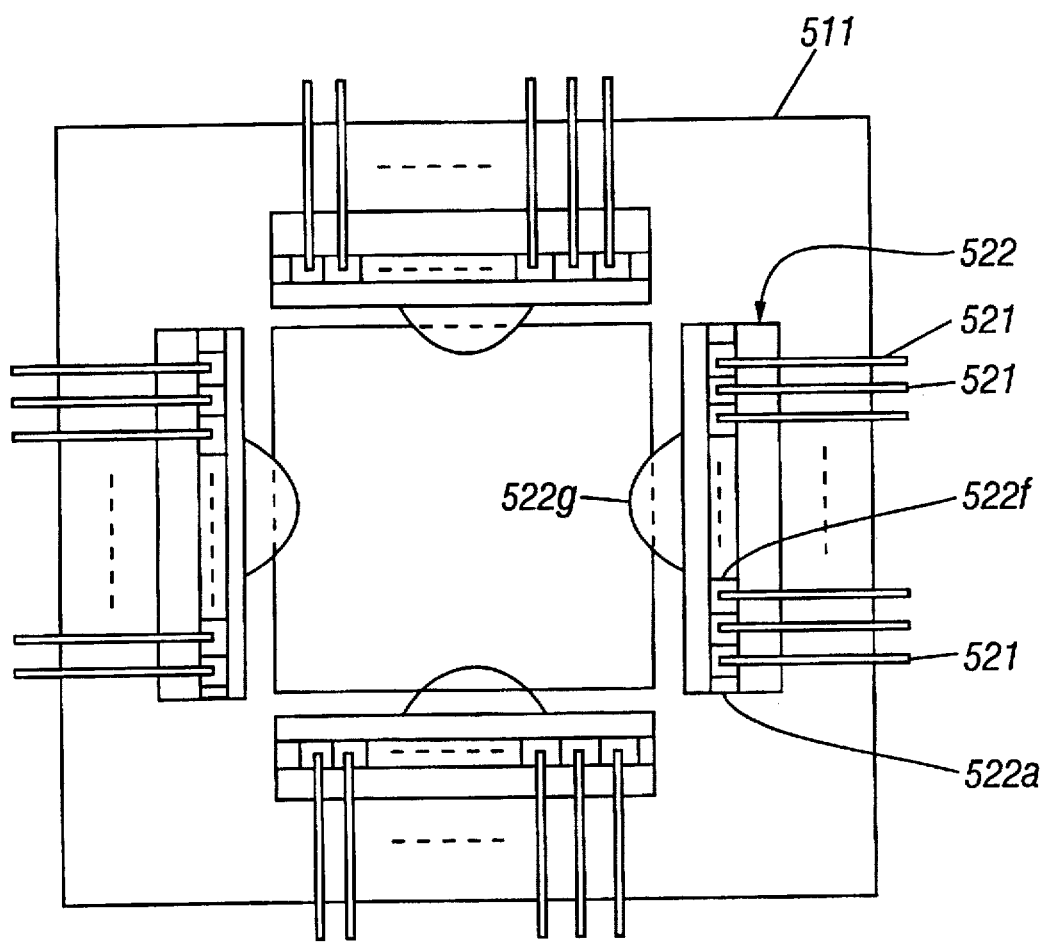
FIG. 42 is a schematic plan view of the IC socket showing the arrangement of the pivoting cam of the 12th embodiment.
Figure 43:
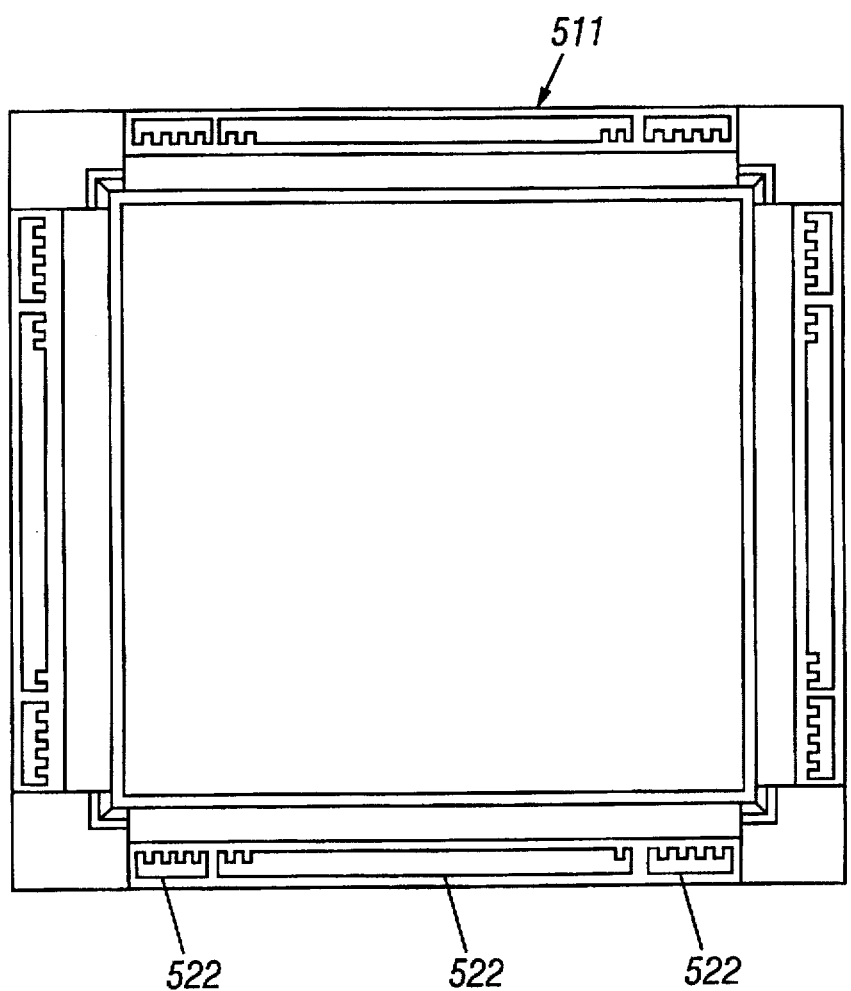
FIG. 43 is a schematic plan view of the socket body of the 12th embodiment.

FIG. 41 through FIG. 43 show a 12th embodiment of the IC socket according to the present invention.

Referring to these figures, the IC socket 510 of the 12th embodiment is provided with a frame-shaped socket body 511 having a generally rectangular configuration, a plurality of contact pins 521 which are arranged in parallel to each other along the sides of this socket body 511 so as to form rows, and pivot cams 522 a half of which being inserted into an internal space of a substantially horizontal U-shape formed by the contact pins 521 arranged along the respective sides of the socket body 511 and forming rows.

Each contact pin 521 has a base portion 521A and an arm 521B. The base portion 521A of each contact pin 521 has a lower horizontal portion 521a extended substantially horizontally along the side of the socket body 511, an inclined portion 521c extended inclined upward toward the inside of the socket body 511 from one end of the lower horizontal portion 521a, and an upper horizontal portion 521d extended substantially horizontally toward the inside of the socket body 511 from an upper end of the inclined portion 521c. On one end of the base portion 521A of each contact pin 521, that is, on the tip of a second horizontal portion 521d, an upward contact portion 521b for coming into contact with a terminal arranged on the bottom surface of the IC chip substrate 2 (illustration is omitted) is formed. Also, an external connecting portion 521e for electrical connection to the external circuit board is formed on the other end of the base portion 521A of each contact pin 521, that is, on the other end of the lower horizontal portion 521a. Further, a leg portion 521f projected downward from the lower horizontal portion 521a is provided in the base portion 521A of each contact pin 521, and slits 511a into which leg portions 521f of contact pins in the rows 521 are inserted and grooves 511e into which the contact portions 521b of the contact pins 521 are inserted are respectively provided in parallel on each side of the socket body 511 so as to form rows. By engagement between these slits 511a and grooves 511e, contact pins in the rows 521 are defined in their position with respect to the socket body 511.

The arm 521B of each contact pin 521 has a curved portion 521i extended curved upward and outward from the first horizontal portion 521a of the base portion 521A, and a horizontal portion 521g extended almost in parallel to the first horizontal portion 521a of the base portion 521A from the upper end of the curved portion 521i. On the tip of the horizontal portion 521g, that is, on the tip of the arm 521B, a downward inclined almost circular engagement portion 521h positioned almost above the inclined portion 521c of the base portion 521A is formed. At the substantial center of the upper surface of the pivot cam 522, an engagement groove 522a which has a cross-sectional shape adapted to the engagement portion 521h of the arm 521B and extended along the whole length of the pivot cam 522 is formed. The engagement portions 521h of the arms 521B of the contact pins in the rows 521 are engaged with the engagement grooves 522a of the pivot cam 522, whereby the pivot cam 522 can pivot between an open position of a standing posture shown in FIG. 41(a) and a pressing position of substantially a horizontal posture shown in (b) of the same figure with the engagement portion 521h of the arm 521B as the pivot support point. At the open position, the pivot cam 522 has retracted from the insertion region of the IC chip substrate 2, and at the pressing position, the pivot cam 522 can press against the upper surface and side surface of the IC chip substrate 2.

Further, the pivot cam 522 has a first contact portion 522b which resiliently comes into contact with the inclined portion 521c of the contact pin 521 when the pivot cam 522 is located at the open position, a second contact portion 522c which resiliently comes into contact with the inclined portion 521c of the contact pin 521 when the pivot cam 522 is located at the pressing position, and an inclined portion 522i extended toward the tip of the pivot cam 522 from the second contact portion 522c. Further, on the tip of the pivot cam 522, a side surface abutment portion 522d for abutting against the side surface of the IC chip substrate 2 and an upper surface abutment portion 522e for abutting against the upper surface of the IC chip substrate 2 are formed.

A plurality of ribs 522f for limiting the arms 521B of the contact pins in the rows 521 to the same intervals are provided in the engagement grooves 522a of the pivot cams 522, and the ribs 522f are arranged between the engagement portions 521h of the adjoining contact pins 521. Also, a plurality of ribs 522h for limiting the base portions 521A of the contact pins in the rows 521 to the same intervals are provided in the pivot cams 522. Each rib 522h is arranged between the inclined portions 521c of the base portions 521A of the adjoining contact pins 521 and continuously extended to above the first contact portions 522b, second contact portions 522c and the inclined portions 522i of the pivot cams 522. Accordingly, some of the ribs 522h are always positioned between the inclined portions 521c of the adjoining contact pins 521 during the pivoting of the pivot cams 522. Since the ribs 522h are arranged at positions where the pivot cams 522 and the base portions 521A of the contact pins 521 come into elastic contact with each other, even ribs 522h having a low height can sufficiently act to define the intervals of the base portions 521A.

One or a plurality of projection pieces 522g projected from the tips of the pivot cams 522 are provided. The projection pieces 522g can be arranged at the centers or end portions of the lengths of the pivot cams 522. By operating the projection pieces 522 by a finger, it is possible to easily pivot the pivot cams 522.

Next, an operation of the IC socket of the 12th embodiment will be explained.

First, when the pivot cams 522 are pivoted to the standing open position as shown in FIG. 41(a), the first contact portions 522b of the pivot cams 522 comes into elastic contact with the inclined portions 521c of the contact pins 521, whereby the pivot cams 522 are stably held at the open position. At the open position, a part positioned on the inclined portions 522i among the ribs 522h of the pivot cams 522 is inclined and is useful as a guide facilitating the insertion of the IC chip substrate 2.

After the IC chip substrate 2 is placed on the contact portions 521b of the contact pins 521, the projection pieces 522g of the pivot cams 522 are operated by the finger, and as shown in FIG. 41(b), the pivot cams 522 is pivoted to substantially a horizontal pressing position. At the pressing position, the pivot cams 522 between the engagement grooves 522a and the second contact portions 522c are resiliently pressed and sandwiched between the engagement portions 521h and the inclined planes 521c of the contact pins 521. At this time, the second contact portions 522c are positioned on the outside of the engagement grooves 522a, and therefore the pivot cams 522 are urged by the arms 521B of the contact pins 521 so that the pressing portions 522e are pressed downward. Accordingly, the IC chip substrate 2 can be pressed downward.

Where the IC chip substrate 2 is to be removed from the socket body 511, it is sufficient if a reverse operation to that mentioned above is carried out, and therefore an explanation will be omitted.

In the 12th embodiment, as shown in FIG. 42, the pivot cams 522 have lengths up to the opposite ends of the rows of the contact pins 521. It is also possible to hold a plurality of divided pivot cams in the rows of the contact pin 521 as shown in FIG. 43 instead of the above. In this case, the pivoting operation of the divided pivot cams becomes further easy, and therefore it is preferred for a case where the number of the contact pins 521 forming the rows is large.

As mentioned above, in the IC socket 510 of the 12th embodiment, the projections 522g may be operated by the fingers to operate the contact pins 521, and therefore special additional equipment such as an insertion jig, a pull-out jig, etc. are unnecessary.

Also, it is possible for the pivot cams 522 to pivot over the whole lengths thereof exactly by the same angles, and therefore a twist does not occur, and accordingly the contact pins 521 change with completely the same shape at the opposite end portions and the center portions. Accordingly, it is possible to increase the number of the contact pins 521.

Further, the operation of the pivot cams 522 consists only of raising or lowering the extended pieces 522g, and therefore a pressing force from above is not given to the socket, and even in a case of mounting on a large size substrate or a thin substrate, there is no apprehension of warping or damage of the substrate.

FIG. 44 to FIG. 48 show a 13th embodiment of the socket assembly according to the present invention.

Figure 44:
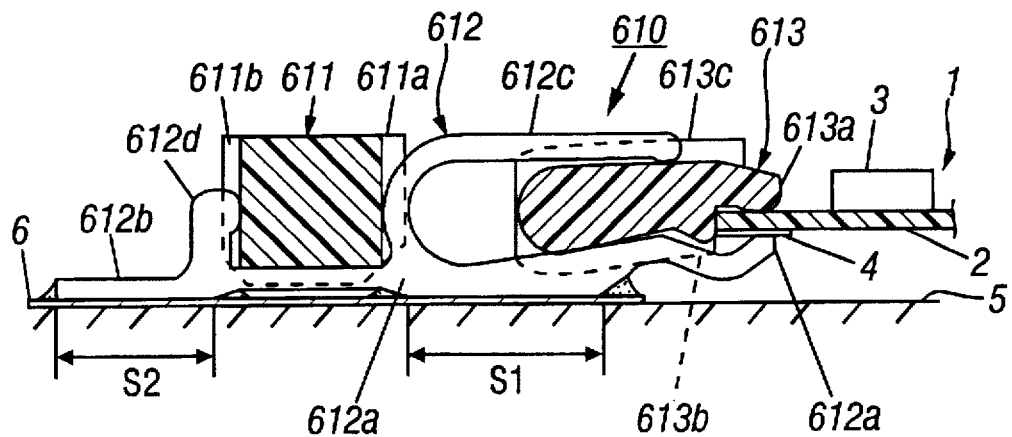
FIG. 44 is a cross-sectional view of the principal part showing a state where a chip-on-board module is mounted on the printed circuit board using the socket according to a 13th embodiment of the present invention.

Referring to these figures, a chip-on-board module 1 is provided with a substrate 2 and a circuit part 3 such as an IC chip etc. mounted on the substrate 2 (refer to FIG. 44 ). On the bottom surface of the substrate 2, a plurality of pads 4 acting as terminals are arranged at narrow intervals along four edges of the bottom surface so as to form rows. The socket, shown overall by the reference 610, is designed so as to electrically connect the module 1 to the circuit board 5.

The socket 610 is provided with a socket body or a support frame 611 made of an insulating material such as a plastic. The support frame 611 has a generally rectangular configuration so as to surround the periphery of the substrate 2 of the module 1, and a plurality of contact pins 612 made of metal are carried on the support frame 611 so as to form four rows in the form of a rectangle. Each contact pin 612 has an upward contact portion 612a for contact with a pad 4 of the module 1 on one end and has a base portion 612A having an external connecting portion for connection to the conductor pattern 6 of the printed circuit board 5 or lead portion 612b and an arm 612c having a spring property on the other end. The constitution is made so that the four edges of the bottom surface of the substrate 2 of the module 1 can be respectively supported by the contact portions 612a of the four rows of the contact pins 612. The lead portion 612b of each contact pin 612 is extended along the mounting surface of the circuit board 5, and as shown in FIG. 44 and FIG. 46, is soldered onto the conductor pattern 6 formed on the mounting surface by reflow in two sections S1 and S2. The arm 612c of each contact pin 612 is positioned inside the support frame 611 and comprises a curved part rising upward while curving to the inside of the support frame 611 from an intermediate portion of the lead portion 612b and a straight part substantially straightly extended from the upper end of this curved part toward the inside of the support frame 611. As seen from FIG. 44 and FIG. 45, a space for accommodating the module 1 is defined by the tip of the straight parts of the arms 612c of the four rows of contact pins 612. Each of the contact pins 612 further has a projection portion 612d projected upward from the lead portion 612b on the outside of the support frame 611. A plurality of ribs 611a and 611b respectively extended in a vertical direction are provided inside and outside of the support frame 611 so as to form rows. The curved parts and projection portions 612d of the arms 612c of the contact pins in the rows 612 are disengageably engaged between the respectively adjoining ribs 611a and 611b on the inside and outside of the support frame 611. As easily understood from FIG. 44, the support frame 611 can be removed upward from the contact pins 612 soldered to the circuit board 612.

Figure 45:
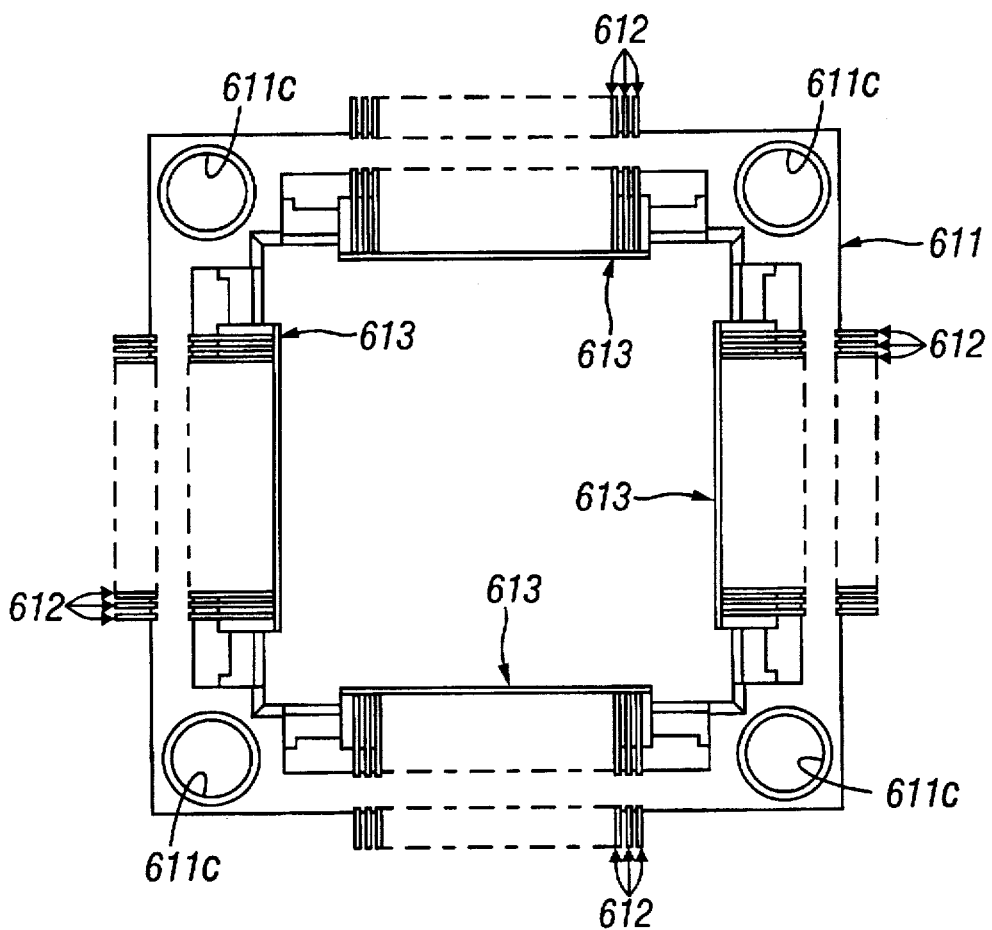
FIG. 45 is a schematic plan view of the socket shown in FIG. 44.
Figure 46:
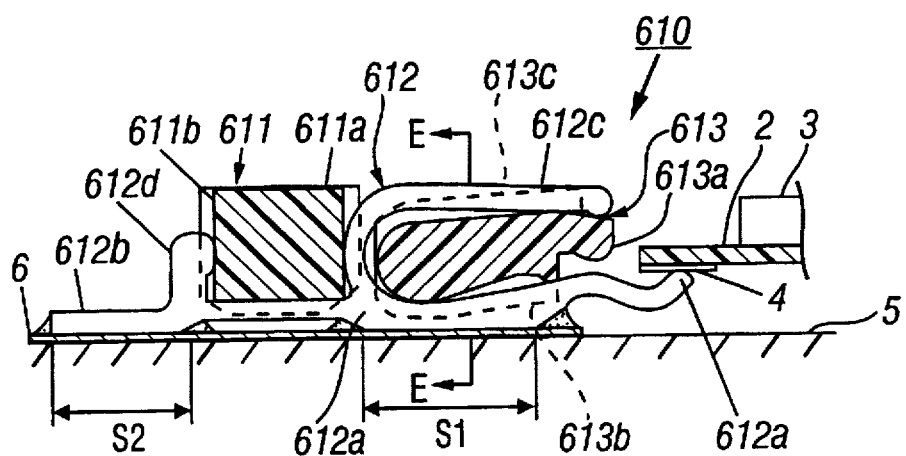
FIG. 46 is a cross-sectional view of the principal part showing a state where the module is released from the socket shown in FIG. 44.
Figure 47:
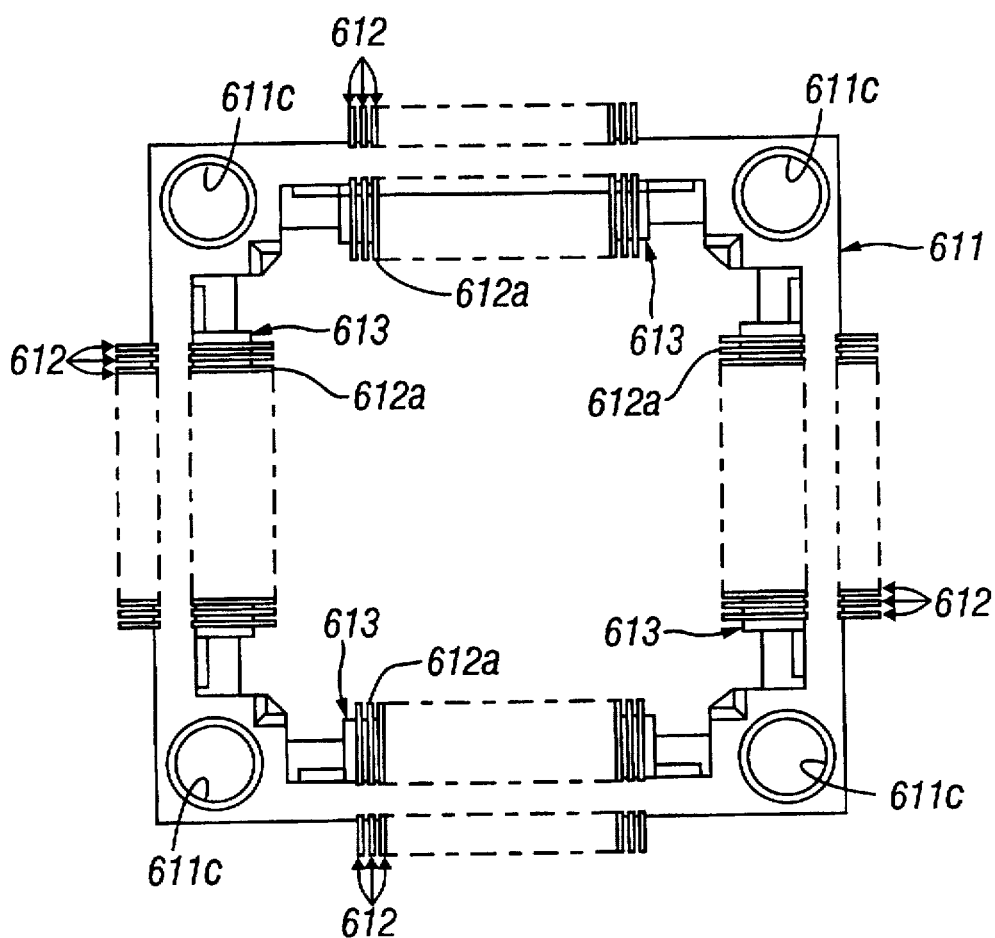
FIG. 47 is a schematic plan view of the socket shown in FIG. 46.
Figure 48:
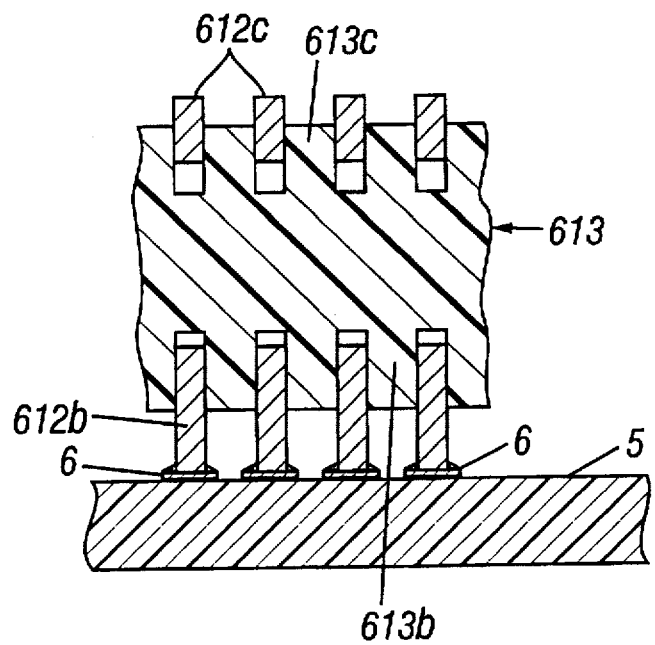
FIG. 48 is an enlarged cross-sectional view of the principal part of the socket taken along a line 48—48 in FIG. 46.

As shown in FIG. 45 and FIG. 47, at the four corner portions of the support frame 611, engagement holes 611c opened in the upper surface thereof are formed. After the contact pins 612 are soldered onto the circuit board 5, the module 1 is mounted on the contact portions 612a of the contact pins 612, but where the module 1 is mounted by an automatic feeder, the positioning pins provided in the automatic feeder are engaged with the engagement holes 611c of the support frame 611, whereby the positioning of the module 1 and the contact pins 612 can be easily carried out.

The socket 610 is further provided with four sliders 613 for individually pressing the edges of the upper surface of the substrate 2 of the module 1 against the contact portions 612a of the contact pins 612. The sliders 613 are held between the lead portions 612b and the arms 612c of the rows of contact pins 612 inside the support frame 611, and the opposite end portions of the slider 613 are projected from the opposite ends of the rows of the contact pins 612. The sliders 613 have pressing portions 613a pressing against the edges of the substrate 2 of the module 1. In further detail, the pressing portions 613a of the sliders 613 comprise upper surface pressing portions pressing against the upper surface of the substrate 2 of the module 1 and end surface pressing portions pressing against the end surfaces of the substrate 2 of the module 1. The slider 613 shown in FIG. 44 is at a pressing position for pressing the edge of the module 1 against the contact portions 612a of the contact pins 612 by the spring force of the arms 612c of the contact pins 612, and the slider 613 shown in FIG. 46 is located at the open position for releasing the module 1 from the contact pins 612. The sliders 613 can be moved between the pressing position shown in FIG. 44 and the open position shown in FIG. 46 along the upper surfaces of the lead portions 612b of the contact pins 612 by a jig engaged with the opposite ends thereof (not illustrated). When the sliders 613 move from the open position to the pressing position, the arms 612c are warped upward by the sliders 613 to generate the pressing force. During a period when the sliders 613 move from the open position to the pressing position, the spring force of the arms 612c is increased by the upper surface shape off the lead portions 612b and reaches a peak immediately before the sliders 613 reach the pressing position, and thereafter the spring force is slightly lowered from the peak value until the sliders 613 reach the pressing position.

The sliders 613 are provided with a plurality of lower partition walls 613b for engaging with the lead portions 612b of the rows of contact pins 612 and upper partition walls 613c engaging with the arms 612 of the contact pins 612. These partition walls 613b and 613c perform the role of holding the rows of contact pins 612 at predetermined intervals at all times. The sliders 613 preferably are formed by a substance with a poor wettability with respect to solder, for example, polyether imide, polyphenylene sulfide, polyester sulfone, etc. As will be understood from FIG. 46, the lower partition walls 13b of the sliders 613 extend so as to cover all of the portions located above the soldered sections S1 in the sliding sections between the lower partition walls 613b and the contact pins 612. Accordingly, when soldering the contact pins 612 on the circuit board 5, it is possible to prevent the melted solder from adhering to the sliding sections between the lower partition walls 613b and the contact pins 612.

In the socket 610 having the above configuration, after a module 1 is mounted on the contact portions 612a of the rows of contact pins 612, it is possible to move the sliders 613 from the open position to the pressing position so as to press the four edges of the substrate 2 of the module 1 individually against the contact portions 612a of the contact pins 612 by the four sliders 613. Accordingly, there is no need for ensuring a pressing force enough for enabling contact between all the pads 4 of the module 1 and the contact portions 612a of all the contact pins 612 in a single slider 613. It is sufficient so long as enough of a pressing force for enabling contact of one row of pads 4 and the contact portions 612a of one row of contact pins 612 by a required contact pressure can be ensured. Accordingly, it is possible to reduce the force required for the movement operation of the sliders 613, so attachment and detachment work of the modules becomes easy. Further, since the sliders 4 press the edges of the substrate 2 of the module 1 against the contact portions 612a of the rows of contact pins 612, for example, even if there is some variation in the spring force of the arms 612c of the contact pins 612, it is possible to make uniform the contact pressure between the contact portions 612a of the row of contact pins 612 and the row of pads 4 and thereby to improve the reliability of conduction. Further, it is possible to successively press the opposite edges of the substrate 2 of the module 1 by two opposing sliders 613, so it is possible to finely move the substrate in the direction of movement of the sliders 613 in a state where the sliders 613 press against the top surface of the substrate 2 of the module 1. Accordingly, it is possible to cause a wiping action between the pads 4 of the module 1 and the contact portions 612a of the contact pins 612 and possible to improve the reliability of electrical connection. Further, in the case of this embodiment, the sliders 613 move from the open position to the pressing position while pressing apart the ribs 612b and arms 612c of the contact pins 612, whereby the arms 612a of the contact pins 612 are made to move upward and an increased spring force is generated. Accordingly, by designing the contact pins 612 and the sliders 613 so as to increase the amount of movement of the sliders 613 from the open position to the pressing position, it is possible to move the sliders 613 from the open position to the pressing position with a light force while moving the arms 612c upward and therefore the operability of the sliders 613 can be improved.

Further, the support frame 611 is engaged with the contact pins 612 at the side of the contact pins 612 opposite to the portions soldered to the circuit board 5 to enable detachment from the contact pins 612 after the lead portions 612b of the contact pins 612 are affixed to the circuit board 5 by soldering, so the mounting height of the contact pins 2 themselves with respect to the circuit board 5 becomes smaller and it is possible to make the mounting height with respect to the circuit board 5 of the module 1 mounted on the contact pins 612 smaller.

Further, it is possible to solder the contact pins 612 on the circuit board 5 and then leave the support frame 611 on the contact pins 612, but the support frame 611 and the contact pins 612 are detachably engaged by the elasticity of the two, so it is possible to pull out the support frame 611 from the contact pins 612 in accordance with need. Accordingly, by soldering the contact pins 612 to the circuit board 5 and then pulling out the support frame 611 from the contact pins 612, the socket 610 can be made further lighter in weight. Preferably, the thickness of the support frame 611, as illustrated, is set so that the height from the circuit board 5 to the top surface of the support frame 611 becomes substantially equal to the height of the contact pins 612 or shorter than the height of the contact pins 612. By this, it is possible to prevent an increase in the mounting height of the socket 610 even if the support frame 611 remains on the contact pins 612.

Further,the rows of contact pins 612 are soldered to the circuit board 5 in the state supported by the support frame 611, so this prevents the reduction of the efficiency of soldering work and the precision of position of the contact pins 612 with respect to the circuit board 5.

Further, since the rows of contact pins 612 are detachably engaged between the adjoining ribs 611a and 611b at the inside and outside of the support frame 611, the rows of contact pins 612 can be held at predetermined intervals by the ribs 611a and 611b at the inside and outside of the support frame 611 and can be positioned and affixed in a direction cutting across the support frame 611. Accordingly, the rows of contact pins 612 can be soldered on the circuit board 5 with a high precision of positioning.

Figure 49:
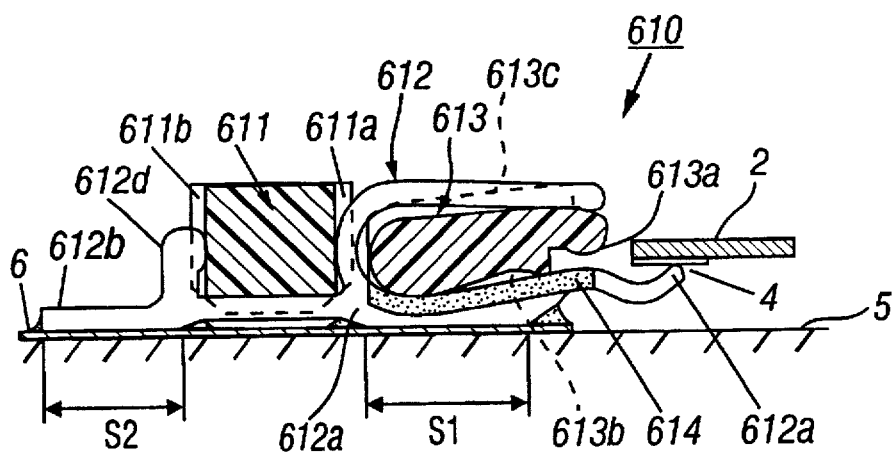
FIG. 49 is a cross-sectional view of the principal part of the socket according to a 14th embodiment of the present invention.

FIG. 49 shows the 14th embodiment of the socket assembly according to the present invention. In this 14th embodiment, the section positioned above the soldered section S1 in the sliding region of the contact pins 612 which slide with the lower partition wall 613b of the slider 613b is covered with a substance 614 with a poor wettability with solder, that is, resistant to deposition of solder. The rest of the configuration is similar to that of the above 13th embodiment. Accordingly, it is possible to prevent deposition of solder at the sliding region of the contact pins 612 with the lower partition wall 613b of the slider 613.

Figure 50:
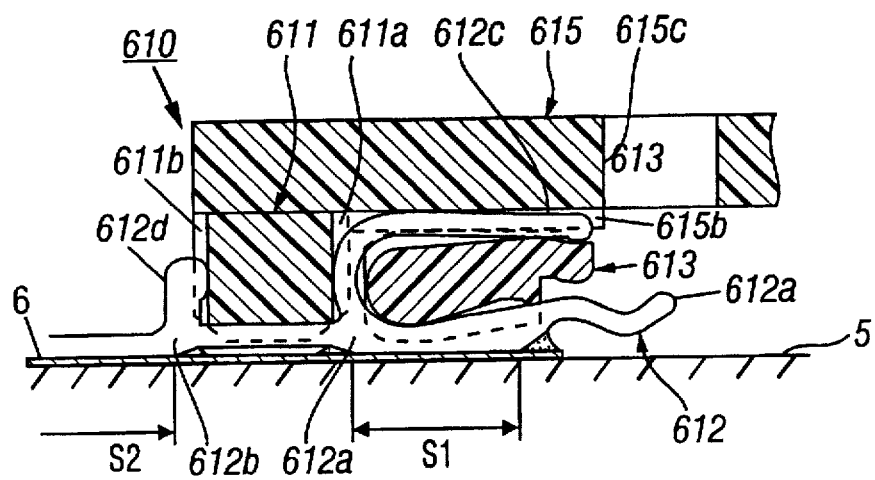
FIG. 50 is a cross-sectional view of the principal part of the socket showing a 15th embodiment of the present invention.
Figure 51A:
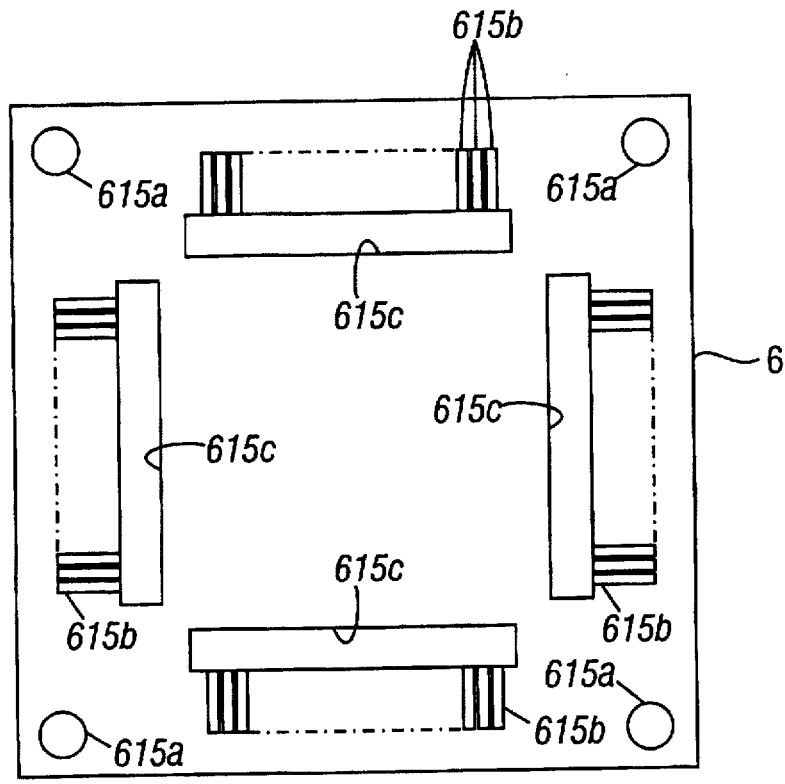
FIG. 51 shows an upper cap of the socket shown in FIG. 50, in which (a) is a plan view in a state where the lower surface of the upper cap is directed upward, and (b) is a side view of the upper cap.
Figure 51B:
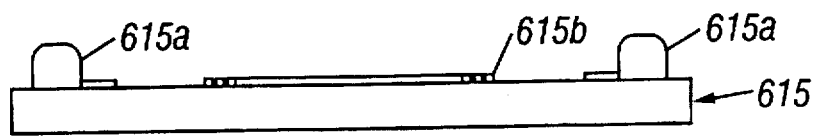

FIG. 50 and FIG. 51 show a 15th embodiment of a socket assembly according to the present invention.

Referring to these drawings, in the socket 610 of the 15th embodiment, the support frame has attached to it in a detachable manner a cap 615 of the module 1. Like with the support frame 611 of the 13th embodiment, engagement holes (not shown) opening to the top surface are formed at the four corner portions of the support frame 611 of the 15th embodiment. At the bottom of the cap 615, engagement pins 615a which engage detachably with the engagement holes of the support frame 611 are made. Further, the cap 615 has formed on it the ribs 615b for defining the intervals of the arms 612c of the rows of the contact pins 612 and the opening 615c for enabling visual observation of the contact portions 612a of the contact pins 612 from above. The rest of the configuration is similar to that in the 13th embodiment.

In the socket 610 of the 15th embodiment, the cap 615 covering the area above the module mounting region of the contact pins 612 is attached detachably to the support frame 611, so it is possible to ensure a wide suction surface for a suction type socket feeder at the top surface of the cap 615. Accordingly, the automatic feed of sockets 610 to the circuit board 5 by a socket feeder can be easily and swiftly performed. Furthers, the the cap 615 can be removed from the support frame 611 after the contact pins 612 are soldered to the circuit board 5, so it is possible to mount the module 1 on the contact portions 612a of the contact pins 612 without problem. Further the support frame 611 can be left on the circuit board 5, so it is possible to use the support frame 611 to easily and quickly position the module 1 and contact pins 612 by a part feeder.

Further, it is possible to solder the contact pins 612 on the circuit board 5 in a state where the contact pins in the rows 612 are more reliably defined in position by the ribs 611a and 611b of the support frame 611 and the ribs 615b of the cap 615. Further, the cap 615 is formed with an opening 615c for enabling visual observation of the contact portions 612a of the contact pins 612 from above, so when mounting the socket 610 on the circuit board 5 by an automatic feeder, it is possible to easily and quickly position the contact pins 612 and the circuit board 5 while observing the positions of the contact pins 612 and circuit board 5 by a CCD camera etc. through the opening 615c of the cap 615.

Figure 52:
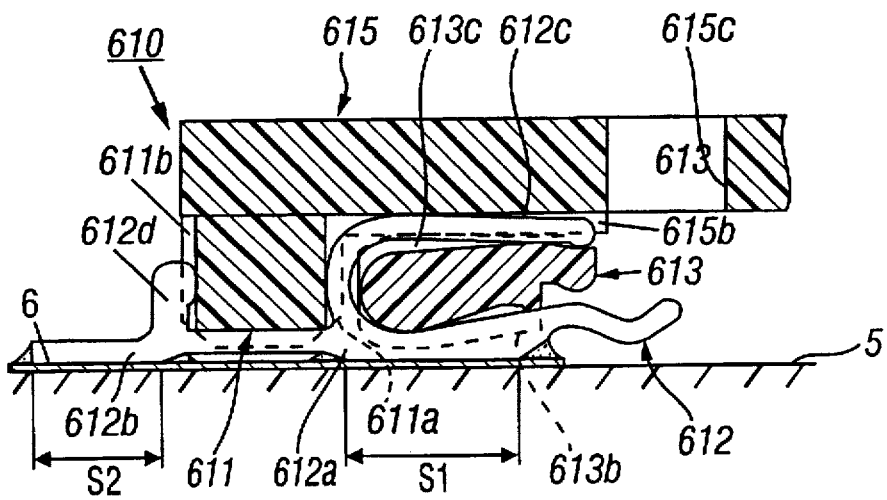
FIG. 52 is a cross-sectional view of the principal part of the socket showing a 16th embodiment of the present invention.

FIG. 52 shows a 16th embodiment of a socket assembly according to the present invention. The socket of the 16th embodiment differs from that of the 15th embodiment in the point that the cap 615 for covering the top surface of the module 1 is provided integrally with the support frame 611. In the 16th embodiment, the support frame 611 can be pulled out from the contact pins 612 together with the cap 615 after the contact pins 612 have been soldered to the circuit board 5.

Figure 53:
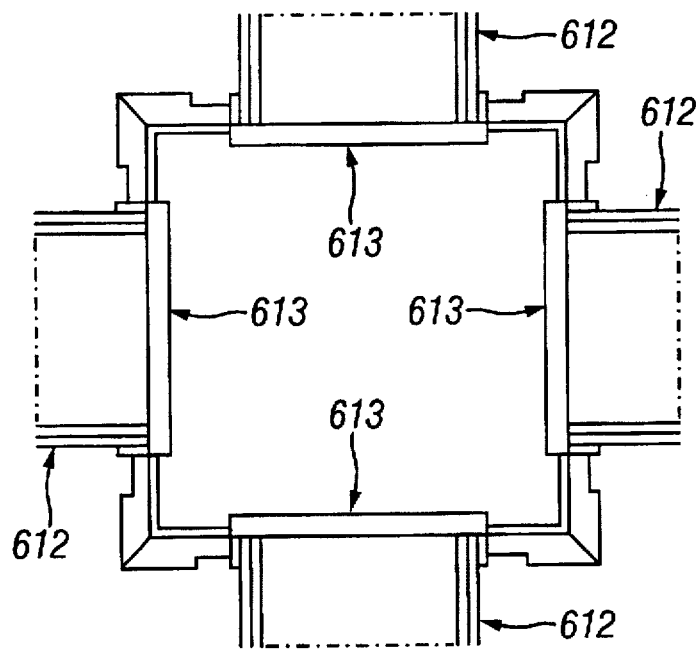
FIG. 53 is a schematic plan view showing a relationship with the contact pins of the respective rows of the socket and the sliders according to a 17th embodiment of the present invention.

FIG. 53 shows a 17th embodiment of the present invention in which a change is made to the sliders 613 held by the rows of contact pins 612. Note that the illustration of the support frame is omitted in FIG. 53. The four sliders 613 in the 17th embodiment are formed so that the ends abut against each other in the pressing position. Accordingly, it is possible to prevent the sliders 613 from moving excessively over the pressing position from the open position. The rest of the configuration is similar to that of the 13th embodiment, but the support frame of the 17th embodiment is formed so as to surround the vicinity of the four sliders 613. Note that the support frame of the 17th embodiment, like the above 13th embodiment, can be pulled out from the contact pins 612 after soldering the contact pins 612 to the circuit board 5 or attaching the module 1 on the contact portions 612a of the contact pins 612 by the sliders 613, but may also be left on the contact pins 612.

Figure 54:
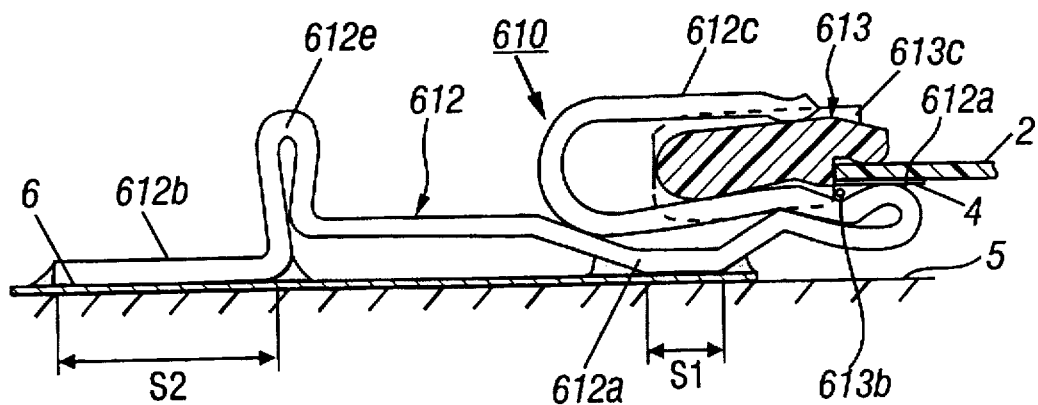
FIG. 54 is a cross-sectional view of the principal part showing a state where the module is mounted on the circuit board by the socket according to the 18th embodiment of the present invention.
Figure 55:
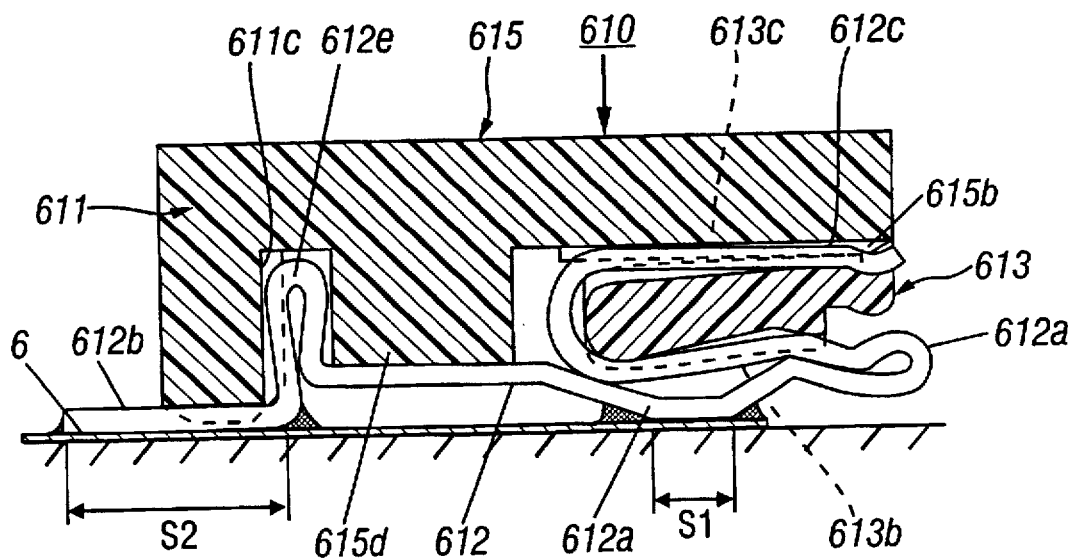
FIG. 55 is a cross-sectional view of the principal part showing a stage in which the contact pins of the socket are soldered onto the circuit board according to the 18th embodiment.
Figure 56:
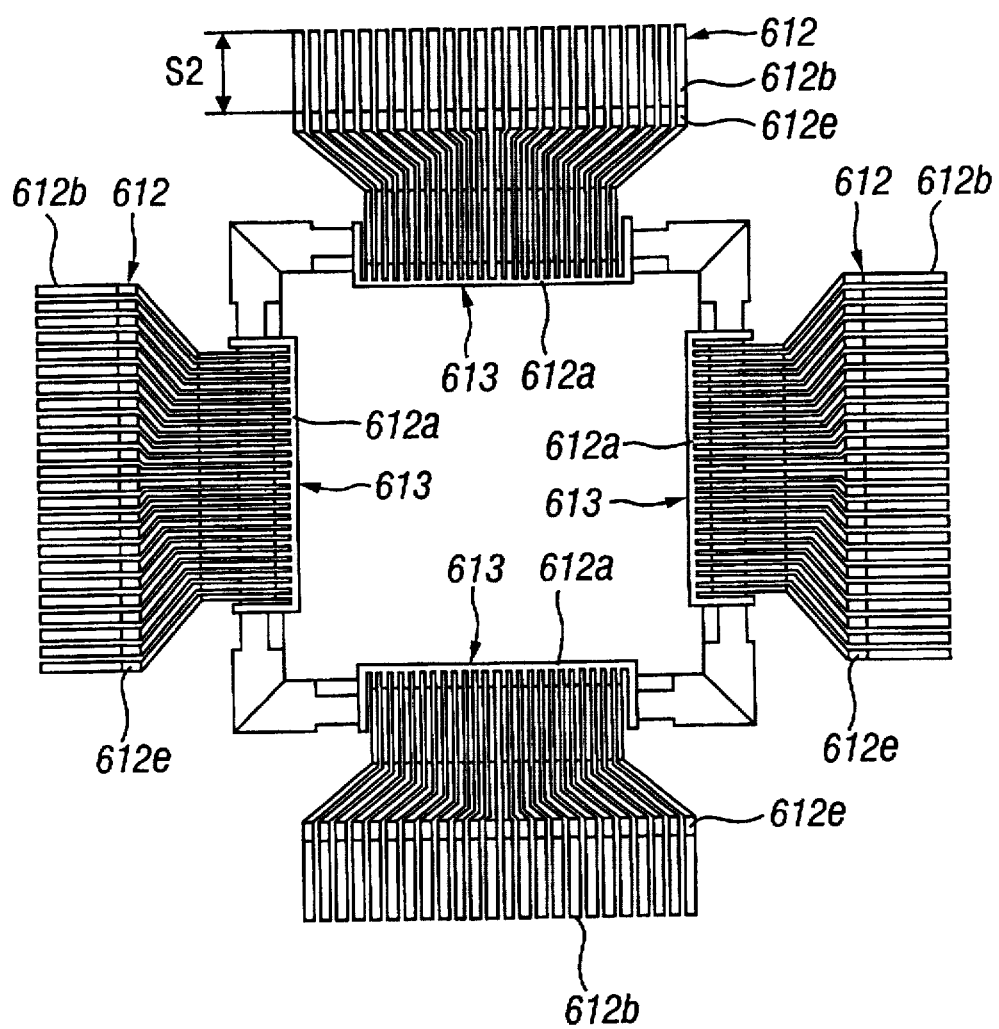
FIG. 56 is a plan view showing the relationship between the contact pins of the respective rows and sliders when the sliders of the 18th embodiment are located at the pressing position.
Figure 57:
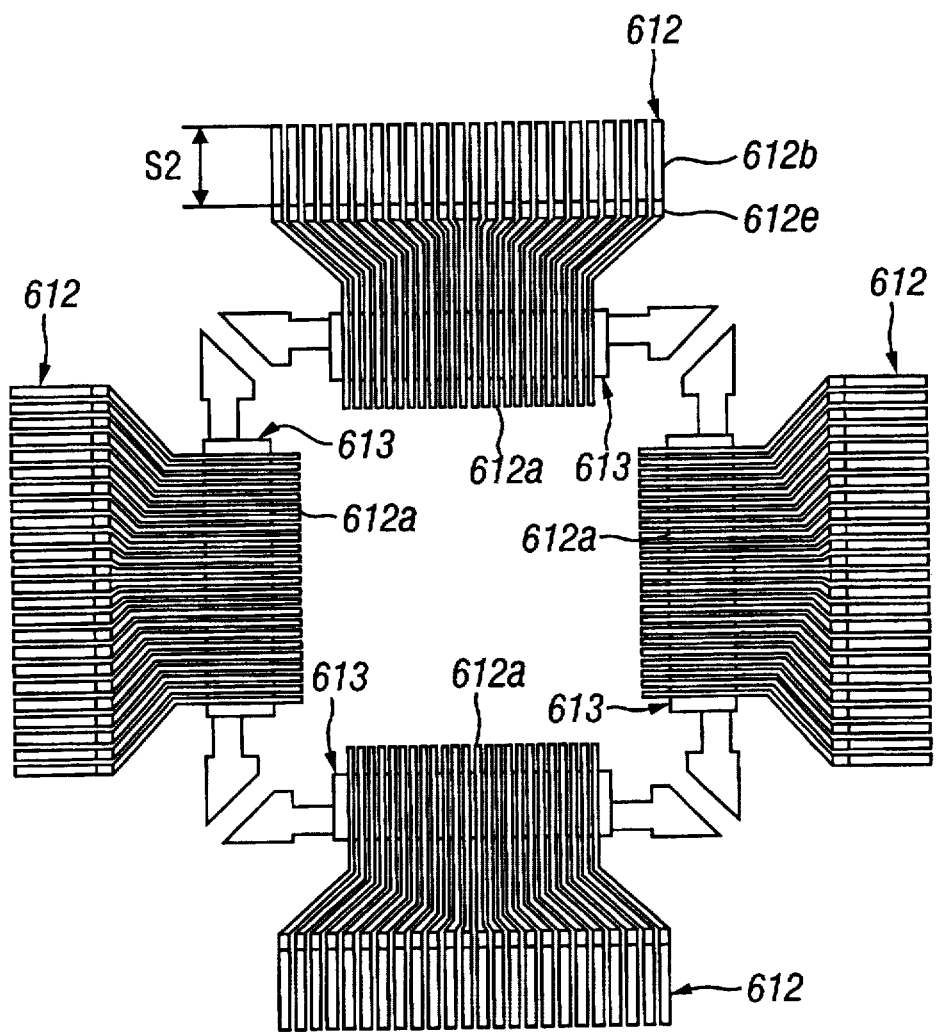
FIG. 57 is a plan view showing the relationship between the contact pins of the respective rows and the sliders when the sliders of the 18th embodiment are located at the open position.
Figure 58:
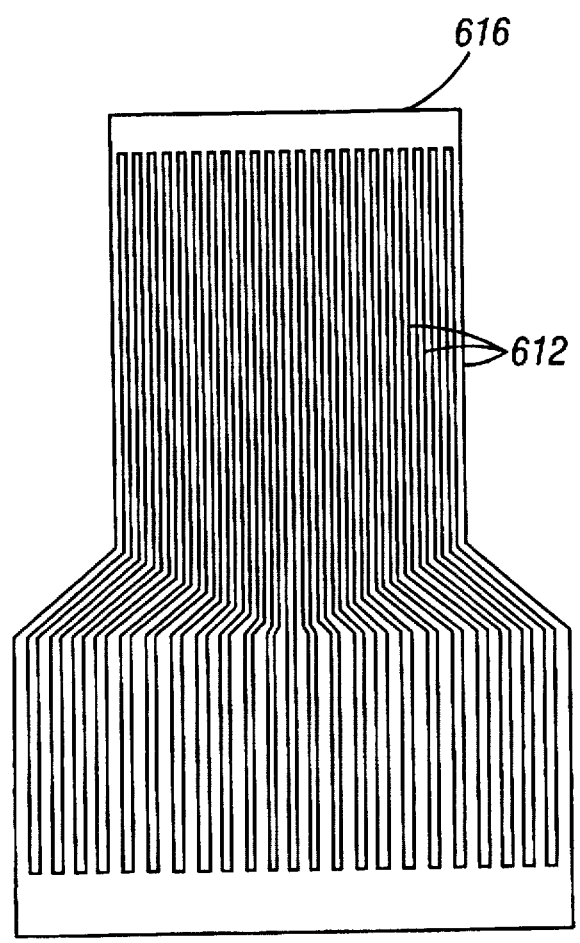
FIG. 58 is a plan view showing a metal plate for manufacturing the contact pins of the respective rows of the 18th embodiment.

FIG. 54 to FIG. 57 show an 18th embodiment of a socket for an electrical component according to the present invention, which is suitable for the case of pulling out the support frame from the contact pins after soldering of the contact pins. FIG. 54 shows the state of mounting of the module 1 on the circuit board 5 through the socket 610 attached to the circuit board 5, while FIG. 55 shows the step of attaching the contact pins 612 to the circuit substrate 5 by soldering. Further, FIG. 56 shows the arrangement of the contact pins 612 and sliders 613 when the sliders 613 are in the pressing position. FIG. 57 shows the arrangement of the contact pins 612 and sliders 613 when the sliders 613 are in the open position. FIG. 58 shows the metal plate 616 for producing the contact pins in the rows 612. By punching the metal plate 616, contact pins 612 connected to each other at the opposite ends are formed.

The rows of contact pins 612 in the 18th embodiment, like in the 13th embodiment, are soldered on the circuit board 5 in the inside soldering section S1 and the outside soldering section S2, but the pitch and width of the portion of the outside soldering section S2 of the lead portions 612b are larger than the pitch and width of the contact portions 612a. Further, the rows of contact pins 612, as will be understood from FIG. 54 and FIG. 55, are formed by simultaneous punching and simultaneous bending of a single sheet of metal plate 616 shown in FIG. 58. Accordingly, the arms 612c of the contact pins are extended connected from the contact portions 612a. Further, in the vicinity of the outside soldering section S2 of the lead portions 612b, resilient portions 612e are formed projecting upward. At the inside surface of the support frame 611 integral with the cap 615, ribs 611c engaging detachably with the resilient portions 612e of the rows of contact pins 612 in the vertical direction. Further, the cap 615 is formed with a wall 615d which cooperates with the support frame 611 to grip the resilient portions 612e of the contact pins 612. The sliders 613 held by the rows of contact pins 612, like the sliders of the 17th embodiment, are formed so that the opposite ends abut against other ends at the pressing position shown in FIG. 56.

Note that the cap 615 of the 18th embodiment is formed integrally with the support frame 611, so it is necessary to withdraw the support frame 611 from the contact pins 612 after soldering the contact pins 612 on the circuit substrate 5, but it is also possible to allow the support frame 611 to remain on the contact pins 612 by forming the cap 615 separate from the support frame 611 and attaching it detachably to the support frame 611 or omitting the cap.

In the socket 610 of the 18th embodiment, the pitch and width of the portion of the external soldered section S2 of the lead portions 612b of the row of contact pins 612 are larger than the pitch and width of the contact portions 612a, so contact and conduction with the module pads 4 with their fine pitches are possible without detracting from the bonding strength of the rows of contact pins 612 and the circuit substrate 5.

Further, since the rows of contact pins 612 are formed by simultaneously punching and simultaneous bending of a single sheet of metal plate 616, contact pins 612 partially different in pitch and pin width can be easily obtained. Still further, it is possible to hold the rows of contact pins 612 formed by the simultaneous bending of a single metal sheet 616 simultaneously by a support frame 611 and then cut the rows of contact points 612 completely from each other, so the socket becomes extremely easy to manufacture.

The sockets of the 13th to 18th embodiments may be used for electrical connection between lead-less IC packages or lead IC packages and other electrical components with the circuit substrate.

FIG. 59 to FIG. 66 explain the 19th embodiment of the IC socket assembly according to the present invention.

Figure 59:
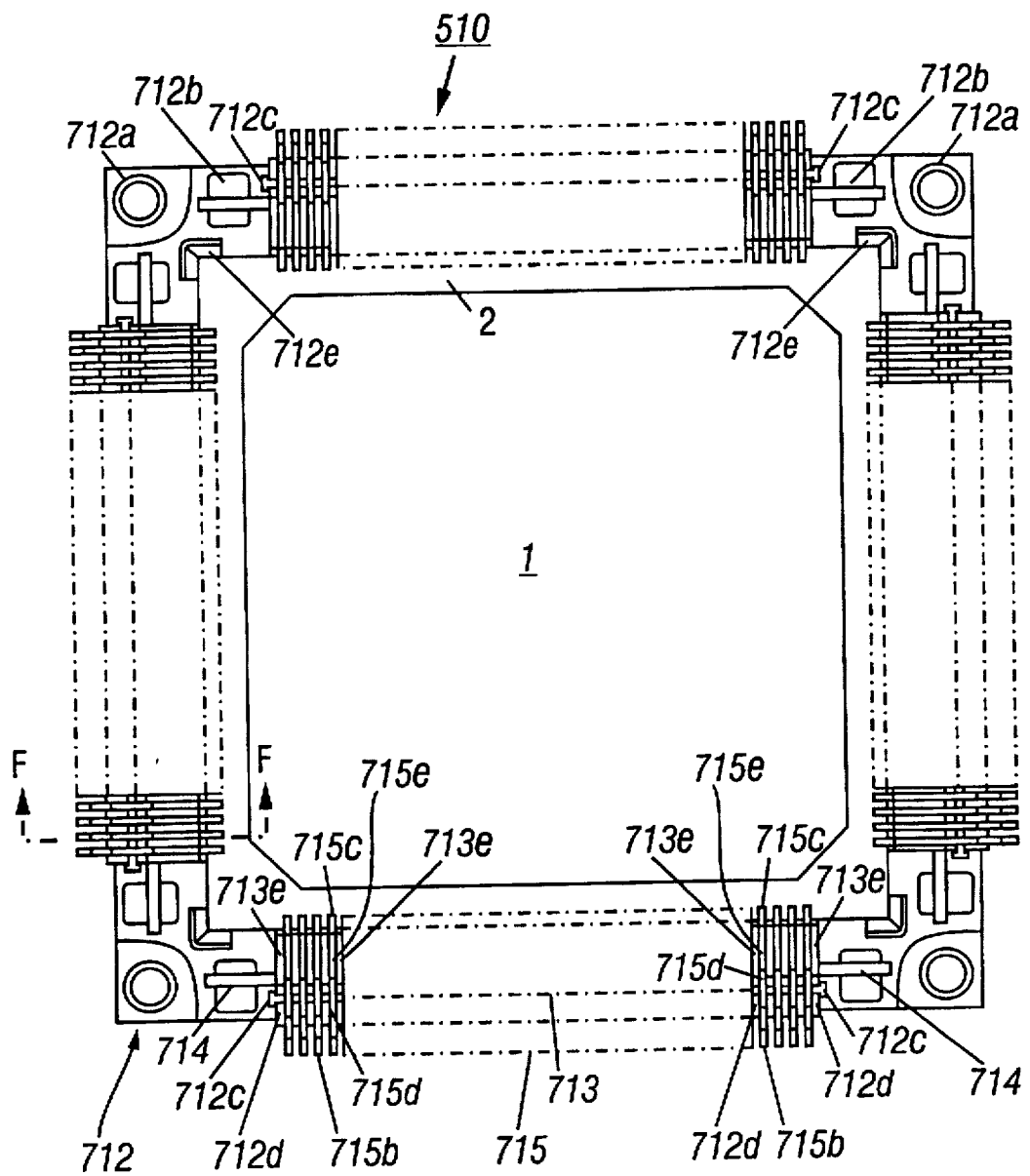
FIG. 59 is a plan view of the IC socket according to a 19th embodiment of the present invention showing a state where the IC package is attached.
Figure 60:
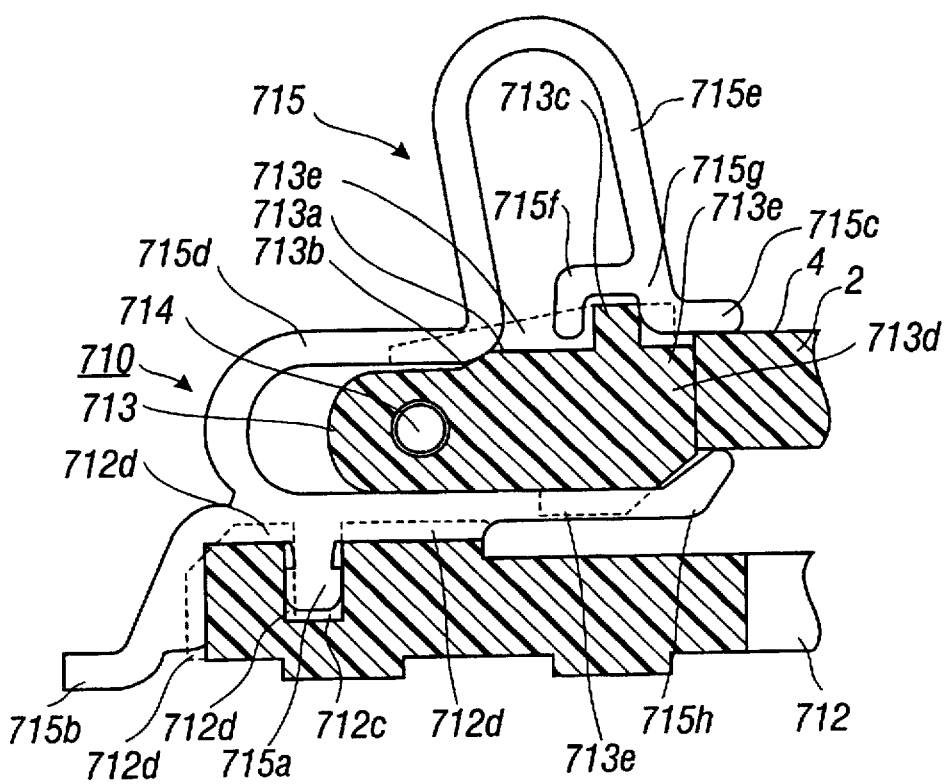
FIG. 60 is a vertical cross-sectional view taken along a line 60—60 in FIG. 59 showing a state where a slider is located at the pressing position.
Figure 61:
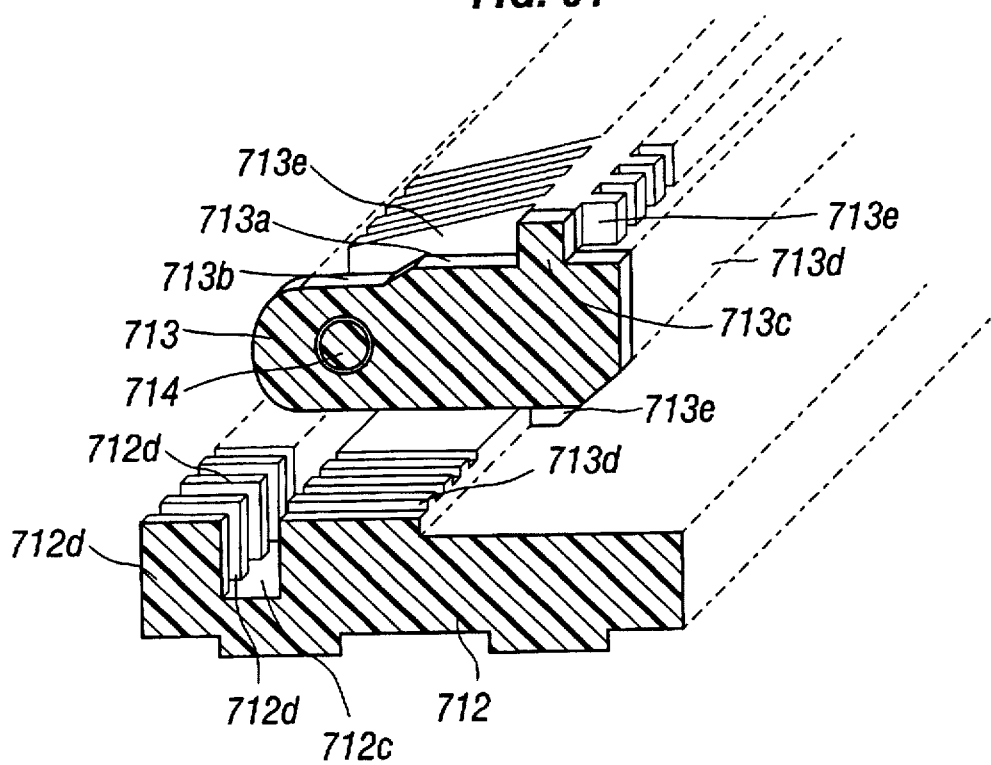
FIG. 61 is a perspective view of the base plate and a slider cut along a line 61—61 in FIG. 59.

First, referring to FIG. 59 to FIG. 61, the socket body or base plate 712 of the IC socket 710 is made of plastic and has a generally rectangular configuration. The base plate 712 is provided with guide cylinders 712a at the four corners. Further, each side of the base plate 712 is provided with two through holes 712b and a groove 712. The IC package 1 mounted in the IC socket 710 has terminals (lands or pads) arranged forming rows on the top surface of the substrate 2 along the sides of the substrate 2. At the sides of the substrate 2 of the IC package 1, the terminals 4 may be extended connected along the top surface, side surface, and bottom surface of the substrate 2. Some IC packages have terminals arranged only at two opposite sides. When using an IC socket exclusively for such IC packages, it is sufficient to provide the configuration explained below at just the two opposite sides.

The base plate 712 is formed with ribs 712d sandwiching the grooves 712c at its two sides at the top surface as will be understood from FIG. 60 and FIG. 61. The ribs 712d may be formed further at just the inside side of the grooves 712c or at the side of the base plate 712. One more set of the ribs 713d than the number of contact pins is provided and the sets are arranged in parallel at predetermined intervals from each other along the sides of the base plate 712. Further, the base plate 712 is provided with receiving portions 712e defining the four corners of the substrate 2 of the IC package 1 as shown in FIG. 59.

The plastic sliders 713 are attached to the base plate 712 through the later mentioned contact pins. The sliders 713 have attached to them metal shafts 714, but if there is no concern over wear or deformation due to temperature, then the shafts 714 may be made of a plastic and formed integrally with the sliders 713. The sliders 713, as will be understood in FIG. 60 and FIG. 61, are formed with the step portions 713a as the first position restricting portions, the inclined portions 713b as the second position restricting portions, and the engagement portions 713c. Further, they have flat side surfaces 713d.

Further, the sliders 713, as shown in FIG. 60, are formed with the ribs 713e at the top surface. Further, they are formed with ribs 713e at the same cross-sectional positions at the bottom surface. One more set of the ribs 713e than the number of contact pins is provided and the sets are arranged in parallel at predetermined intervals from each other along the sides of the base plate 712.

The configuration of the contact pins 715 in this embodiment will be explained using mainly FIG. 60. The attachment portions 715a of the contact pins 715 are press-fit between two adjoining ribs 712d in the grooves 712c of the base plate 712. At one end of each of the contact pins 715, an external connection terminal 715b for connection with the printed circuit board is formed. At the other end, a contact portion 715c for pushing the substrate 2 of the IC package 1 upward and contacting a terminal 4 of the IC package 1 is formed. Between these are formed a first spring portion 715d and a second spring portion 715e. Further, the tip of an extension portion 715h extending from between the external connection terminal 715b and the first spring portion 715d contacts the bottom of the substrate 2 and supports the IC package 1. Further, between the contact portion 715c and the second spring portion 715e, there are formed abutting portions 715f and 715g which are pressed by the engagement portion 713c of the slider 713.

The first spring portion 715d is given a substantially downward bias force, while the second spring portion 715e can be given a bias force substantially in the left-right direction. Accordingly, in FIG. 60, the first spring portion 715d presses against the inclined portion 713b of the slider 713. In so far as no special strong force is applied from the outside, this limits the movement of the slider 713 in the left-right direction. In this embodiment, a plurality of contact pins 715 of this configuration are provided between two ribs 712d provided on the base plate 712 and two adjoining ribs 713e provided on the slider 713 and attach the slider 713 with respect to the base plate 712 movable in the horizontal direction.

Figure 62:
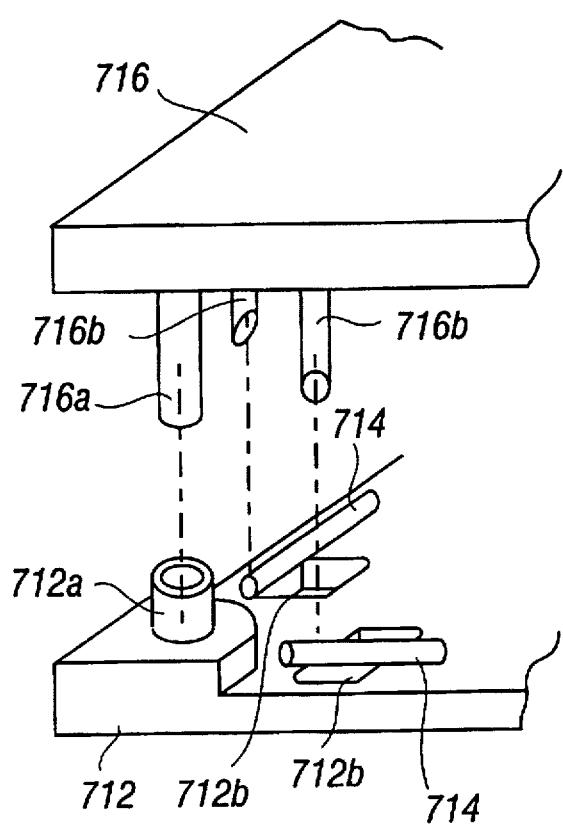
FIG. 62 is a perspective explanatory view of the principal parts showing the relationship between the jig for attachment of the IC package and the IC socket of the 19th embodiment.

Next, an explanation will be made of an example of a jig for moving the sliders 713 by outside force using FIG. 62 and FIG. 63. The jig 716 shown in FIG. 62 is rectangular overall in the same way as the base plate 712. Its important parts are at the four corners. Further, each corner has the same configuration. Therefore, the relationship with the base plate 712 will be clarified and shown for just one corner. The jig 716 is comprised of guide pins 716a which fit with the guide cylinders 712 and actuating pins 716b formed with inclined cut portions at their tips.

Figure 63:
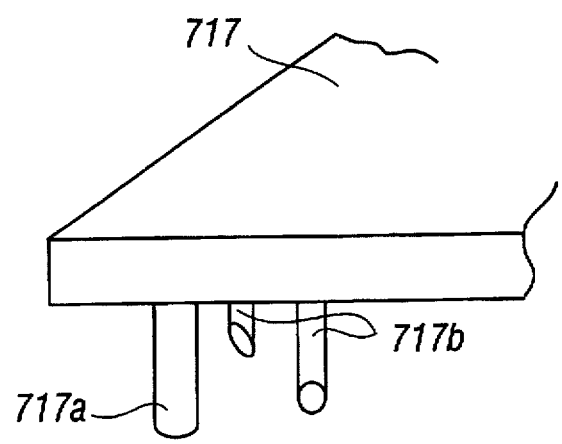
FIG. 63 is a perspective view of the principal parts of the jig used when taking the IC package out of the IC socket of the 19th embodiment.

FIG. 63 similarly shows another jig 717. This is comprised of guide pins 717a which fit with the guide cylinders 712a and actuating pins 717b formed with inclined cut portions at their tips. The point of difference of the two jigs 716 and 717 is that the directions of inclination of the cut portions formed at the tips of the actuating pins 716b and 717b are reverse in direction. That is, the actuating pin 716b shown in FIG. 62 moves downward and engages with the shaft 714 at its tip, whereby it moves the shaft 714, that is, the slider 713, in the inward direction of the base plate 712, while the actuating pin 717b shown in FIG. 63 conversely moves the shaft 714 in the outward direction of the base plate 712.

Figure 64:
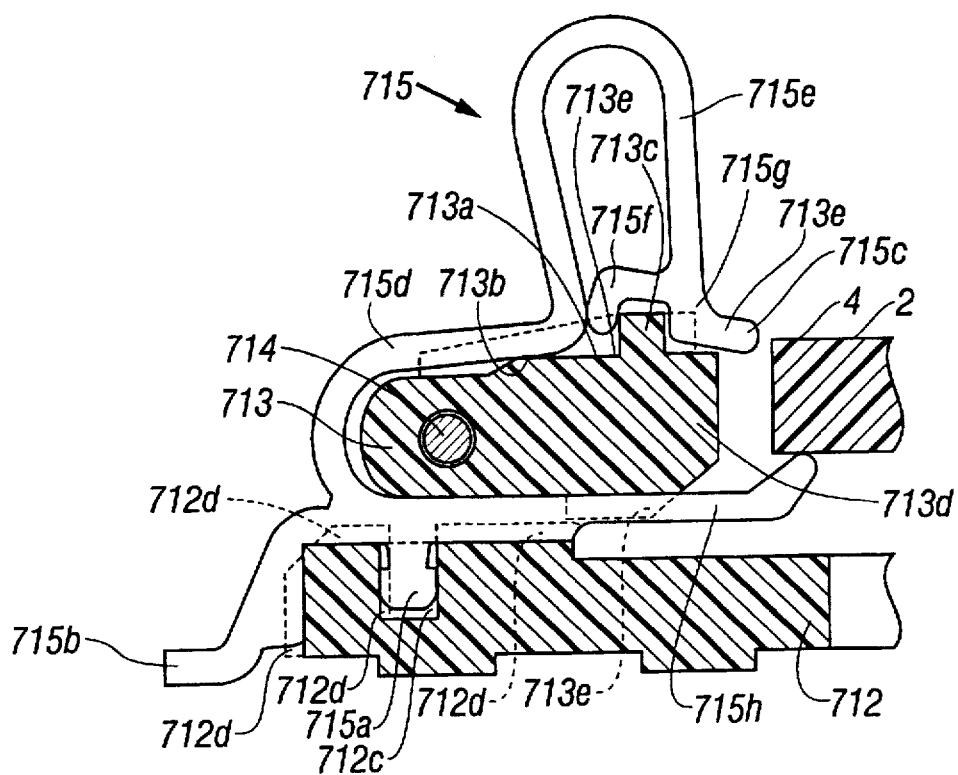
FIG. 64 is a vertical cross-sectional view of a part of the socket taken along a line 64—64 in FIG. 59 showing a state where the slider is located at the open position and the IC package is inserted.
Figure 65:
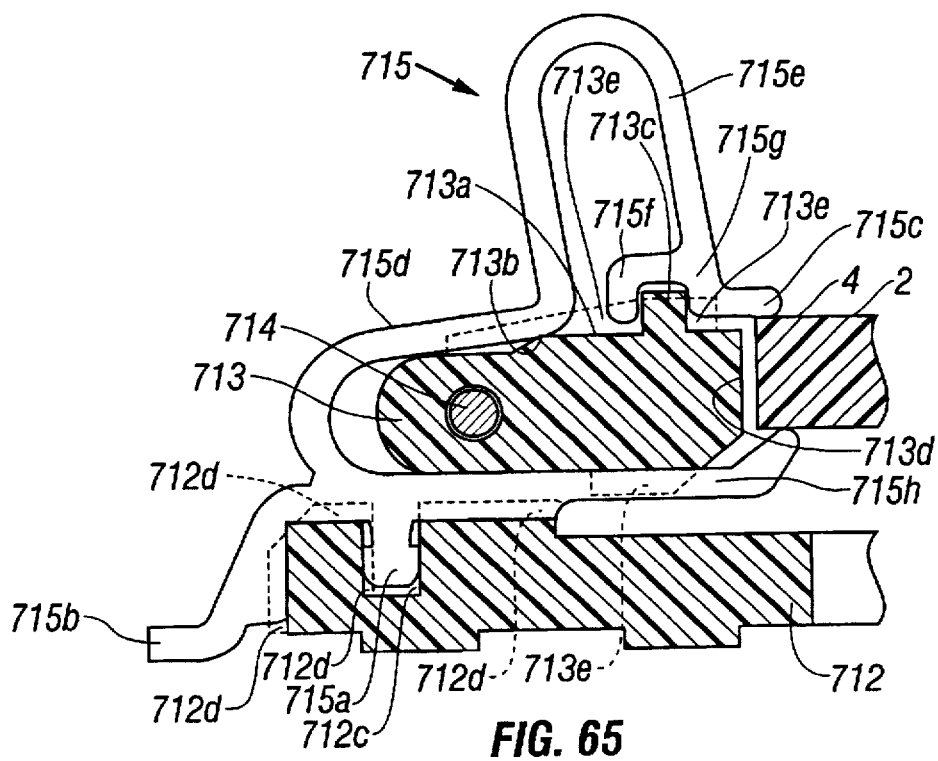
FIG. 65 is a vertical cross-sectional view taken along the line 65—65 of FIG. 59 showing a state where a contact portion of a contact pin is positioned above the IC package.
Figure 66:
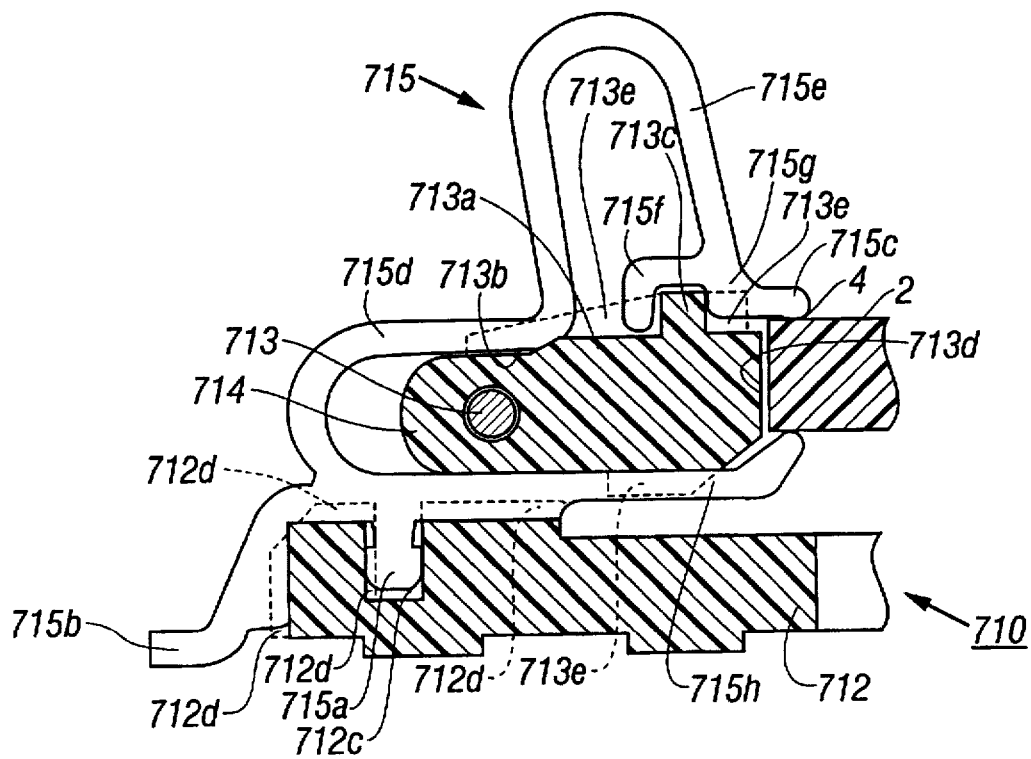
FIG. 66 is a vertical cross-sectional view taken along the line 66—66 of FIG. 59 in a state where a contact portion of a contact pin abuts against the upper surface of the IC package.

Next, the operation for mounting the IC package 1 will be explained using FIG. 64, FIG. 65, and FIG. 66. FIG. 64 shows the state of attachment or detachment of the IC package. It shows the state of insertion of the IC module 1 into the accommodating space of the IC socket and mounting there. FIG. 60 shows the state of completion of mounting, while FIG. 65 and FIG. 66 show the states in the middle of the process from the state of FIG. 64 to the state of FIG. 60.

First, FIG. 64 shows the state of movement of a slider 713 to the left. The engagement portion 713c pushes the abutting portion 715f to flex the second spring portion 715e from the neutral position to the left and cause the contact portions 715c to retract to the left to give the state where the IC package 1 can be freely attached and detached. The slider 713 is defined in position by friction by the first spring portion 715d engaging with the step portion 713a and being pushed downward. Accordingly, the slider 713 never moves in the horizontal direction due to normal vibration etc., but if if necessary, it is possible to form a projection at one of the first spring portion 715d and the step portion 713a and a recess at the other to form a so-called clip-stopping arrangement. FIG. 64 shows the state in which the slider 713 is limited in position in this manner. The IC package 1 is inserted into the accommodating space from above by hand or an automatic machine and is placed on the extension portions 715h of the contact pins 715 in the state shown.

In the state of FIG. 64, if the insertion jig 716 shown in FIG. 62 is pushed down manually or by an automatic machine while the guide pins are being guided 716a by the guide cylinders 712a, the actuating pins 716b push the shafts 714 projecting out from the opposite ends of the sliders 713 to the side directions. Due to this, the sliders 713 are moved to the inside, that is, to the IC package 1, and reach the position of FIG. 65. At the position of FIG. 65, the engagement portions 713c of the sliders 713 are in a non-pressing state with respect to the second spring portions 715e and the second spring portions 715e return to the neutral position. Further, the contact portions 715c of the contact pins 715 are at a position up away from the top surface of the substrate 2 of the IC package 1.

If the sliders 713 are further moved, the first spring portions 715d engage with the inclined portions 713b from the step portions 713a due to the spring force. FIG. 66 shows the initial state at which the first spring portions 715d engage with the inclined portions 713d. In the state of FIG. 66, the first spring portions 715d move downward from even the position show in FIG. 65, so the contact portions 715c contact the terminals 4 disposed at the side of the top surface of the substrate 2 of the IC package 1. On the other hand, the engagement portions 713c of the sliders 713 are at positions contacting the abutting portions 715g, the second spring portions 715e are at neutral positions, and the side surfaces 713c of the sliders 713 still do not abut against the side surfaces of the substrate 2 of the IC package 1.

Figure 67:
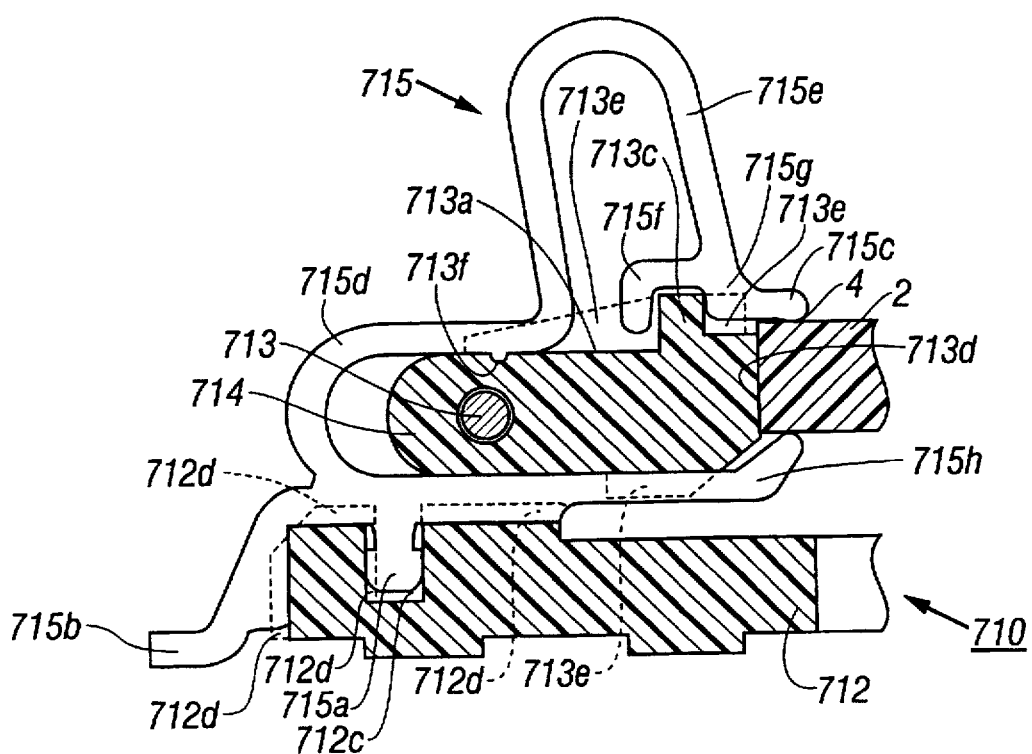
FIG. 67 is a vertical cross-sectional view of a part of the socket showing an example of a modification of the slider of the 19th embodiment.

At the position shown in FIG. 66, the contact portions 715c and the extension portions 715h grip the substrate 2 of the IC package in the vertical direction and the contact portions 715c contact the terminals 4 provided on the substrate 2 of the IC package, so the IC package 1 and the contact pins 715 are electrically connected in state. Accordingly at this time, the first spring portions 715d may be made to engage with the flat portions at the bottom steps after the inclined portions 713b of the sliders 713. In this case, the flat portions of the bottom steps become the second position controlling portions. If there is apprehension over the ability to control the position, as mentioned early, clipping is possible. Further, in the 19th embodiment, the top surfaces of the sliders 713 are formed with two steps at the top and bottom through a step difference, but it is not absolutely necessary to provide such a step difference. For example, the shape of the top surfaces of the sliders 713 and the shape of the first spring portions 715d may be made as shown in FIG. 67. In this case the recesses 713f of the sliders 713 become the second position defining portions.

Further, in the 19th embodiment, the sliders 713 are moved further to the right from the position of FIG. 66. The position shown in FIG. 60 is made the pressing position of the sliders 713, that is, the position of completion of mounting of the IC package 1. In this way, if the sliders 713 are moved from the position of FIG. 66 further to the right, the first spring portions 715d of the contact pins 715 will descend along the inclined portions 713b of the sliders 713. Accordingly, the contact pressure of the contact portions 715c on the terminals 4 at the top surface of the substrate 2 of the IC package 1 will increase. Further, since the engagement portions 713c of the sliders 713 press against the abutting portions 715g of the contact pins 715, the second spring portions 715e are moved from the neutral position against the elasticity. Therefore, the contact portions 715c of the contact pins 715 slide with respect to the surfaces of the terminals 4 of the top surface of the substrate 2 and cause so-called wiping action. Accordingly, even if an oxide film is formed on the surfaces of the terminals 4 or dust or other dirt is deposited on the same, it is possible to remove these and achieve a reliable state of conduction.

Further, the socket 710 of the 19th embodiment is provided with a separate means for creating the wiping effect. That is, as shown in FIG. 64, when the IC package 1 is inserted in an accommodating space of the socket 710, the IC package 1 seldom is placed accurately at the center of the accommodating space. When all the four sliders 713 are moved from the open position to the pressing position shown in FIG. 60, the IC package 1 is positioned accurately at the center of the accommodating space. Accordingly, while moving the sliders 713 from the open position to the pressing position, the side surfaces of the substrate 2 of the IC package 1 are pressed by the sliders 713 and move slightly. This creates a relative displacement of position between the contact portions 715c of the contact pins 715 and the terminals 4 of the IC package 1, so a wiping effect is caused.

After the slider 713 moves to the pressing position shown in FIG. 60 in this way, the jig 716 is pulled upward. This ends the work for mounting the IC package 1. In this mounted state, the sliders 713 are biased to the left in FIG. 60 due to the second spring portions 715e, but the force defining the position caused by the first spring portions 715d engaged with the inclined portions 713b of the sliders 713 is stronger, so in normal conditions there will be no movement to the left in the figure, that is, to the open position.

Next, an explanation will be made of the case of taking out the IC package 1 from the mounted state shown in FIG. 60.

For taking out the IC package 1, use is made of the pull-out jig 717 shown in FIG. 63. If the guide pins 717a are pressed down manually or by an automatic machine guided by the guide cylinders 712, the actuating pins 717b will press the shafts 714 and move the shafts 714 to the outside of the horizontal direction. Accordingly, the sliders 713 are moved to the left in FIG. 60. The second spring portions 715e follow the engagement portions 713c until the neutral position shown in FIG. 66. After this, the first spring portions 715d rise along the inclined portions 713b and push up the step portions 713a so the contact portions 715c separate from the substrate 2 and give the state shown in FIG. 65. From this state, the engagement portions 713c press the abutting portions 715f and cause the contact portions 715c to retract from the region where the IC package is mounted while giving tension to the second spring portions 715e. After the sliders 713 reach the open position shown in FIG. 64, the jig 717 is pushed up from the IC socket 1. Next, the position of the slider 713 is held by the bias force of the first spring portions 715d downward. Accordingly, the IC package 1 can be taken out by hand or by automatic machine.

Figure 68:
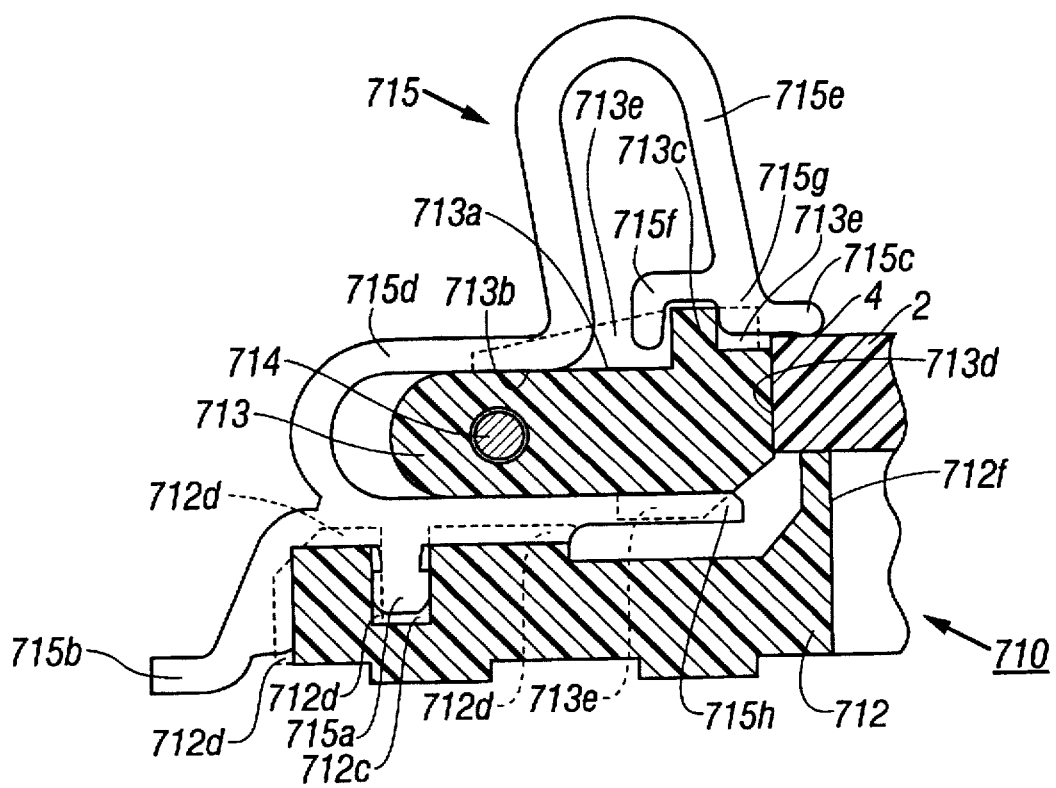
FIG. 68 is a vertical cross-sectional view of a part of the socket showing an example of a modification of the contact pin of the 19th embodiment.

As explained above, in the 19th embodiment, the IC package 1 is gripped by the contact portions 715c and extension portions 715h of the contact pins 715 at the time of mounting of the IC package 1, so when the terminals 4 of the IC package 1 extend from the top surface of the substrate 2 through the side surface to the bottom, the tips of the extension portions 715 may be made to contact the terminals 4 at the bottom surface of the substrate 2 of the IC package 1. Accordingly, the socket 710 of the 19th embodiment may be applied to any type of IC package of the surface mounting type. Alternatively, as shown in FIG. 68, the bottom surface of the IC package may be received by the base portion 712f provided at the base plate 712. Further, the contact pins 715 may be constituted by two independent portions, that is, first contact pins having the external connection terminals 715b, the first spring portions 715d, the second spring portions 715e, and the contact portions 715 and second contact pins having the external connection terminals 715b and the extension portions 715h. Further, in the 19th embodiment, the sliders 713 are supported by only the contact pins 715, but it is also possible to remove the extension portions 715h and have the bottom surfaces of the sliders 713 contact the base plate 712. Further, there is no need to provide a large clearance as illustrated between the engagement portions 713c of the sliders 713 and the abutting portions 715f and 715g of the contact pins 715. Further, the relationship of engagement may be made one in which the engagement portions 713c are made recesses and parts of the contact pins 715 enter in them. Further, in the 19th embodiment, all of the contact pins 715 in the rows are separated from each other by ribs, but it is possible to form an insulating layer on part of the side surface of the contact pins and provide ribs for every certain number of contact pins or eliminate them all together. However, in this case, the sliders 713 can move in the horizontal direction, but are preferably made to not be able to move in the axial direction, that is, the longitudinal direction, by providing bearing portions for the shafts 714.

Next, an explanation will be made of a 20th embodiment of an IC socket assembly according to the present invention using FIG. 69 to FIG. 74

Figure 69:
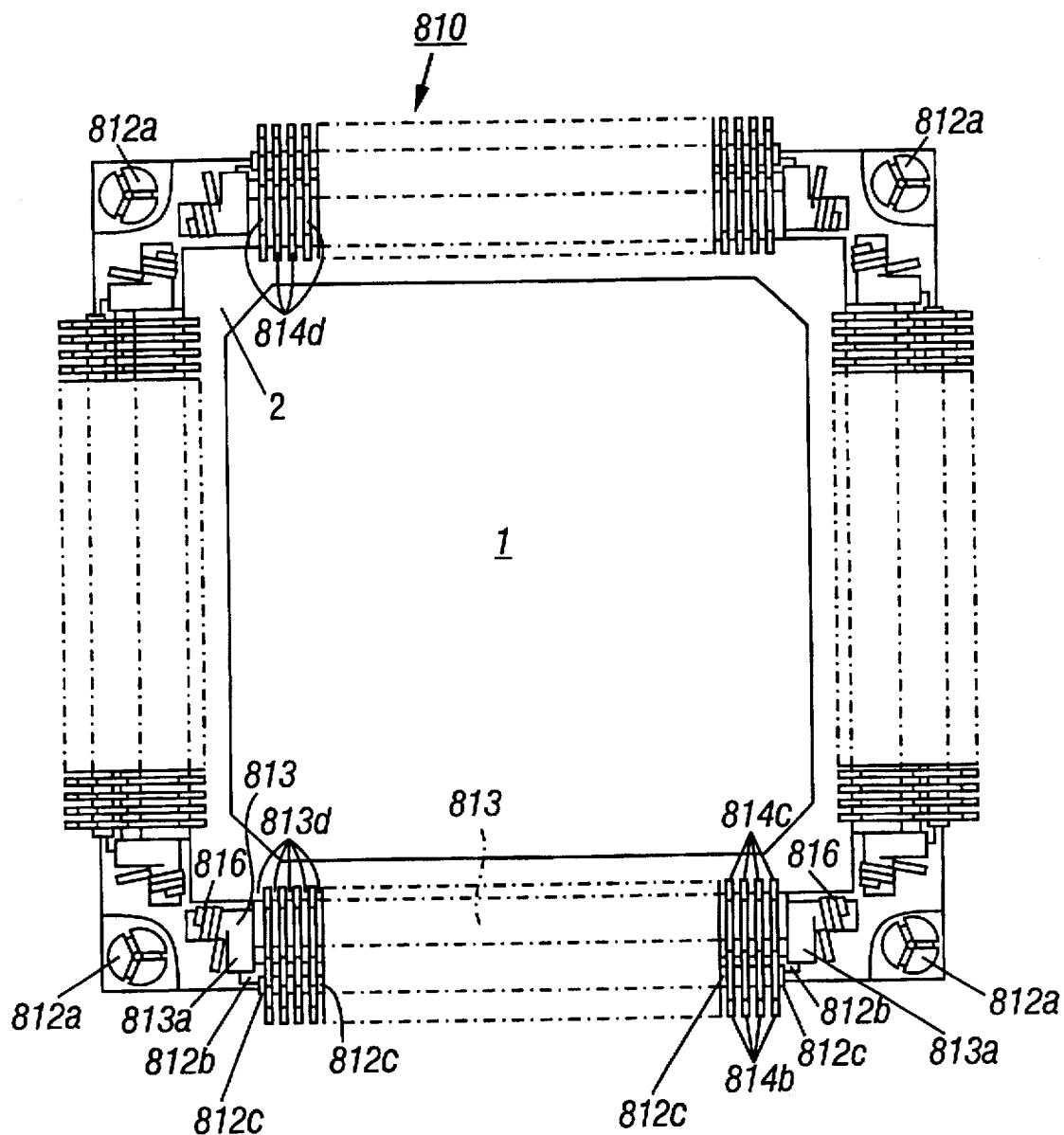
FIG. 69 is a plan view of the IC socket according to the 20th embodiment of the present invention showing a state where the cover is removed at the time of attachment of the IC package.

In FIG. 69, the substrate 2 of the IC package 1 has a rectangular configuration. Terminals (lands or pads) are arranged along the four sides of the same, but illustration of these is omitted. The socket body of the IC socket 810 and the base plate 812 also have rectangular configurations. The configurations along the four sides are the same. The base plate 812 is comprised of a plastic. At the four corners of the base plate 812 are implanted shafts 812a with cuts in three directions. Some IC packages have terminals arranged only at two opposite sides. When using an IC socket exclusively for such IC packages, it is sufficient to provide the configuration explained below at just the two opposite sides.

Figure 71:
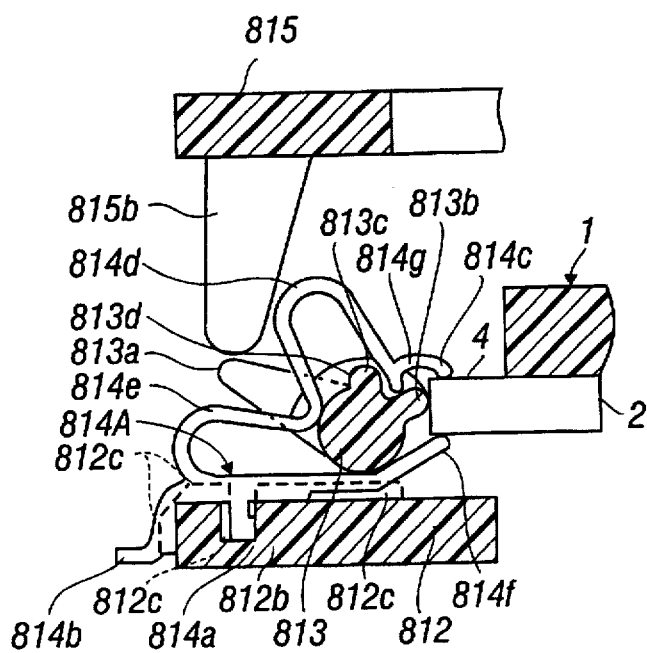
FIG. 71 is a vertical cross-sectional view of a part of the socket taken along a line 71—71 in FIG. 70 in a state where the IC package is attached.
Figure 72:
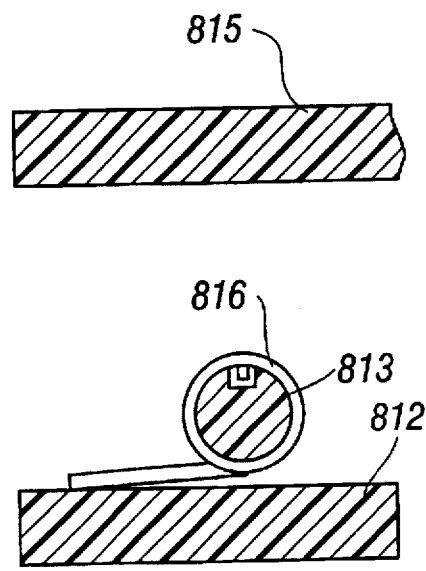
FIG. 72 is a schematic vertical cross-sectional view of a part of the socket taken along a line 72—72 in FIG. 70.
Figure 73:
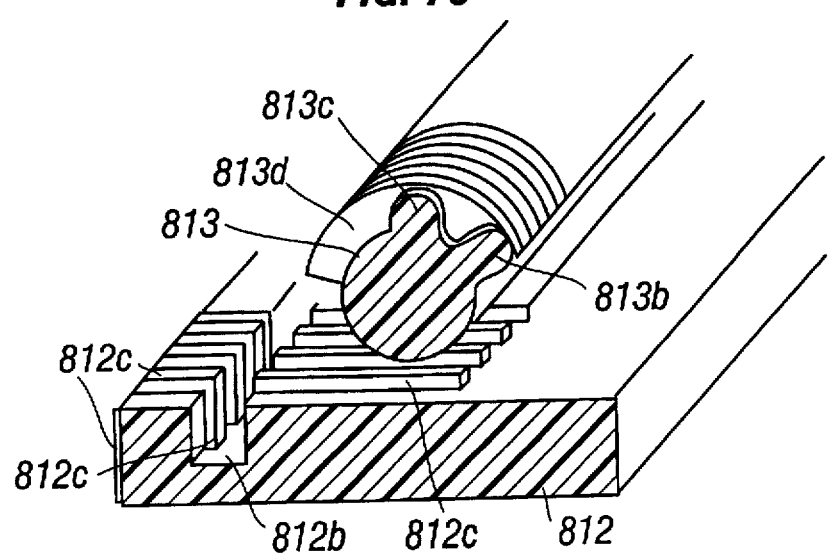
FIG. 73 is a partial perspective view showing a base plate and an actuation shaft member cut along a line 73—73 in FIG. 70.
Figure 74:
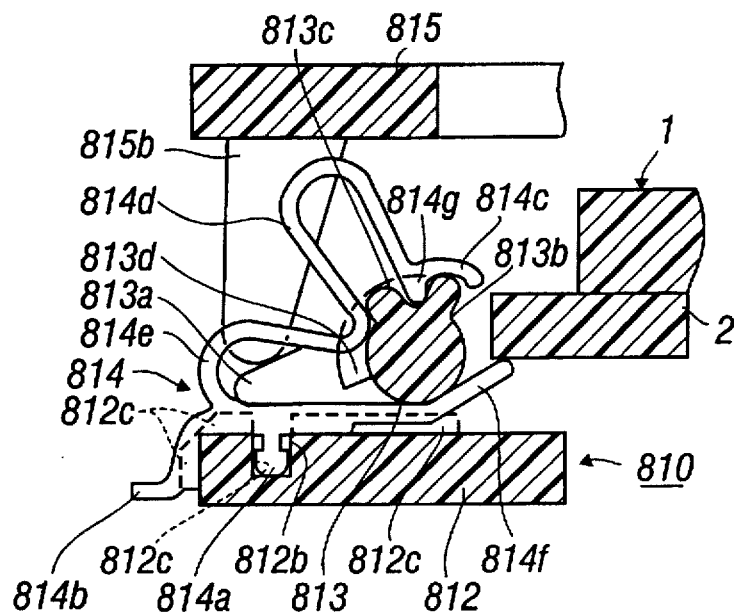
FIG. 74 is a vertical cross-sectional view similar to FIG. 71 in which the socket of the 20th embodiment is in an opening state.

The base plate 812 is provided with elongated grooves 812b as will be understood from FIG. 71, FIG. 73, and FIG. 74. At the top surfaces are formed ribs 812c sandwiching the elongated grooves 812b at the opposite sides. The ribs 812c are also formed at the side surfaces of the elongated grooves 812b or at the side surfaces of the base plate 812. Further, there are one more of these sets of ribs 812c than the number of contact pins, explained later. These are arranged in parallel at predetermined intervals from each other along the side surfaces of the base plate 812.

Plastic actuation shaft members 813 are attached through the later explained plurality of contact pins to the base plate 812. Bearing portions may be provided at the base plate 812. At the opposite ends of the actuation shaft members are provided arms 813a. Further, two projections 813b and 813c are provided at the peripheral surfaces, which constitute the engagement portions. The recesses formed between the same are made able to engage with the contact pins so as to move the contact pins as mentioned later. Further, the actuation shaft member s813 have formed at part of their vicinity a number of ribs 813d one greater than the number of contact pins along the axial direction.

The contact pins 814 are press-fit so that the mounting portions 814a enter between the adjoining ribs 812c provided at the side surfaces of the elongated grooves 812b and thereby are attached to the base plate 812. Each contact pin 814 has a base portion 814A, one end of the base portion 814A having formed on it a contact portion 814c for pressing the substrate 2 of the IC package 1 from above and contacting with a not shown terminal and the other end of the base portion 814A having formed on it an external connection terminal 814b for connection to the printed circuit board. Further, each of the the contact pins 814 has a first spring portion 814d and second spring portion 814e constituting an arm formed continuously with the base portion 814A. The second spring portion 814e biases the contact portion 814c in the downward direction. Further, the extension portion 814f extending from between the external connection terminal 814b and the contact portion 814c contacts an actuation shaft member 813 from below. The tip comes in contact with the bottom of the substrate 2 in FIG. 71 to support the IC package 1.

Further, a projection 814g serving as an engagement portion is formed between the contact portion 814c and the first spring portion 814d and can engage at the recess between the projections 813b and 813c formed as the engagement portions of the actuation shaft member 813. In this embodiment, a plurality of contact pins with such a configuration are provided between the adjoining ribs 812c provided on the base plate 812 and between the adjoining ribs 813d provided on the actuation shaft members 813 and attach the actuation shaft members 813 rotatably to the base plate 812.

Figure 70:
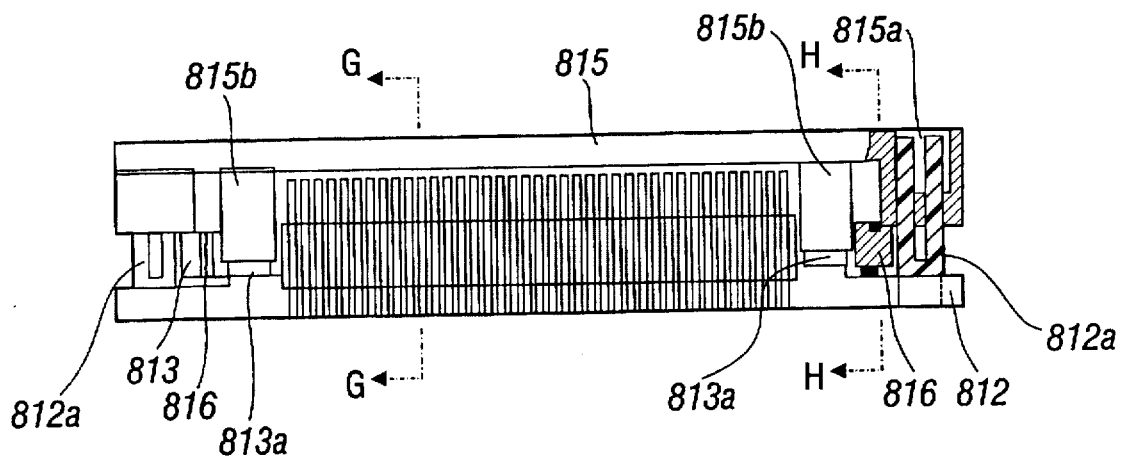
FIG. 70 is a cross-sectional side view of a part of the socket of the 20th embodiment.

As will be understood from FIG. 70, the cover 815 has through holes 815a connecting the large diameter portion and small diameter portion. By press-fitting the shafts 812a from the small diameter portion through the cover, they are attached to be movable vertically at the base plate 812. Further, the cover 815 is provided with operating portions 815b for pressing the arms 813a and turning the actuation shaft members 813. The actuation shaft members 813, further, have wound around them coil springs 816 with one ends supported at the base plate 812 and the other ends at the actuation shaft members 813, which bias the actuation shaft members 813 in FIG. 71 to turn in the clockwise direction. In FIG. 70, the state is shown where the cover 815 is pressed down against the force of the coil springs 816.

Next, an explanation will be given of the operation for mounting the IC package 1 in this embodiment. FIG. 74 shows the open state where the IC package can be attached and detached. This open state is the state where by pressing down the cover 815 and using the operating portions 815b to press the arms 813a, the actuation shaft members 813 are turned against the force of the coil springs 816. At this time, the projections 814g of the first spring portions 814d of the contact pins 814 are pushed in the left direction by the projections 813b and are pushed upward at the root portion of the projections 813b, that is, the bottom of the recesses formed between the projections 813b and 813c. Accordingly, the contact portions 814c are retracted to a position enabling attachment and detachment of the IC package 1.

To place the IC package 1 in the mounted state from this state, it is sufficient to release the pressing force of the cover 815. Due to this, the actuation shaft members 813 turn in the clockwise direction due to the restoration force of the coil springs 816 and first spring portions 814d of the contact pins and the projections 813b of the actuation shaft members move in the bottom right direction. In this process, the second spring portions 814e move the projections 814g in the downward direction. When the first spring portions 814d reach the substantially neutral position where the elasticity is lost, the contact portions 814c reach the terminal surface, not shown, provided on the substrate 2 of the IC package 1 and come into contact with the terminal surface due to the action of the second spring portions 814e.

The actuation shaft members 813 turn further clockwise from this state. By this, next, the projections 813c engage with the projections 814g and the first spring portions 814d are tensed and pushed in the opposite direction from the neutral position. Accordingly, in the process, the contact portions 814c slide on the terminal surface of the substrate 2. If an oxide film is formed or dirt is adhered, this is rubbed off, thereby improving the conductivity. This action is usually referred to as wiping. The projections 813b engage with the side surface of the substrate 2 to result in the state of mounting shown in FIG. 71.

However, when placing the IC package 1 on the extension portions 814f of the contact pins 814 as shown in FIG. 74, the IC package 1 never is placed at the ideal position. Therefore, when the projections 813b are engaged with the side surfaces of the substrate 2, one of the actuation shaft members positioned at the four sides of the IC socket will press against the IC package 1. Accordingly, the projections 813b will restrict the position of the IC package 1 in the horizontal direction and at the same time contribute to the wiping.

When replacing the IC package from the state of FIG. 71, it is sufficient to press the cover 815. In this case, in an action opposite to the above explanation, the projections 814g first follow the projections 813c to the center positions of the first spring portions 814d. After this, due to engagement by the projections 813b, the first spring portions 814d are tensed and moved to the top left to reach the position of FIG. 74. The IC package 1 is taken from the accommodating space to the outside from this state by hand or using some device. When not mounting a next IC package, if the force pressing on the cover 815 is released, the arms 813a turn further from the position of FIG. 71 and stop at the position obstructed by the operating portions 815b.

In the 20th embodiment, a cover 815 was provided, but as will be understood from FIG. 71, the existence of the cover 815 considerably enlarges the height dimension of the IC socket 810 as a whole. This causes considerable loss spacewise when a plurality of printed circuit boards with the IC sockets 810 connected are superposed in various devices. Therefore, it is possible to remove the cover 815. In this case, it is sufficient to provide a suppressing means for restricting the rotation of the actuation shaft members 813 by the coil springs 816 at the base plate 812 so that the angular position of the arms 813a in FIG. 71 becomes preferably less than 30 degrees. Accordingly, in this case, the IC package can be attached and detached using a corresponding jig without depending on the cover 815.

Further, if the distance in the horizontal direction from the position of contact of the operating portions 815b of the cover with the arms 813a to the centers of rotation of the actuation shaft members 813 is lengthened, the force pressing down the cover 815 can be made smaller due to the lever principle. Further, in the 20th embodiment, the position of contact of the operating portions 815b of the cover with the arms 813a is in the upward direction of the position where the top surface of the base plate 812 and the contact pins 814 contact and on the plane parallel to the plane orthogonal to the top surface of the base plate 812, so the cover 815 is guided by the shafts 812a and if the top surface of the base plate 812 is pressed down vertically, the contact pins 814 will be subjected to only a force pressing the top surface of the base plate 812 orthogonally. There is no force in any other direction. Therefore, compared with disposing the position of contact of the operating portion 815b of the cover with the arms 813 elsewhere, the strength of the base plate 12 and the force supporting the contact pins 814 do not need to be that great and the base plate 812 can be made thinner. In particular, at the portion of the bottom of the elongated grooves 812b, the base plate 812 is thinner and the strength is lower, so it is preferable to set the position of contact between the operating portions 815b of the cover and the arms 813a as shown in the 20th embodiment.

Further, in the 20th embodiment, the actuation shaft members 813 are provided with a large number of ribs 813d one greater than the number of contact pins 814, but it is also possible to form an insulating coating on part of the side surfaces of the contact pins 814 etc. and provide ribs 813d for every certain number of contact pins 814 and sometimes even to completely eliminate them. In these cases, however, bearings for the actuation shaft members 813 are necessary at the base plate 812. Further, the contact pins 814 may be constituted by two independent parts, i.e., first contact pins having external connection terminals 814b, first spring portions 814d, second spring portions 814e, and contact portions 814c and second contact pins having external connection terminals 814b and extension portions 814f.

Figure 75:
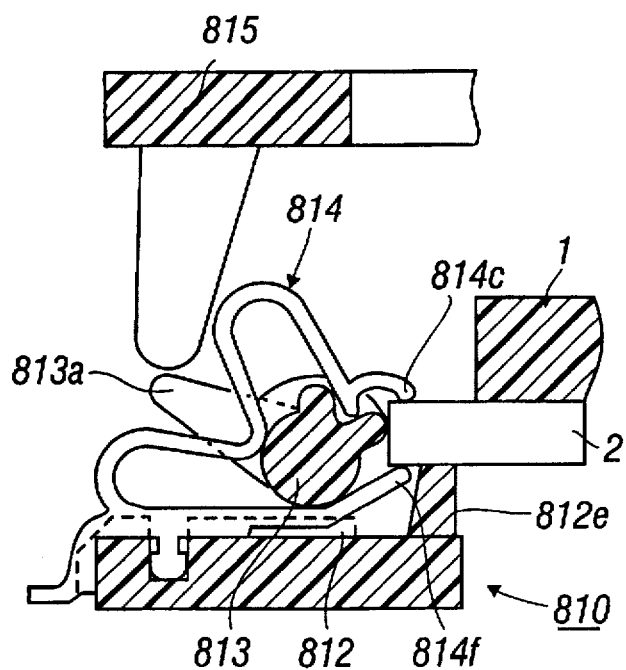
FIG. 75 is a vertical cross-sectional view similar to FIG. 71 showing an example of a modification of the contact pin and base plate of the 20th embodiment.

Further, in the 20th embodiment, the IC package 1 is sandwiched between the contact pins 814c and the tips of the extension portions 814f, so the embodiment can be used even in cases where there is a terminal surface on the bottom of the IC package 1 or where the terminal surface is made the bottom side for mounting, it is possible to apply the embodiment to IC packages with both sides as conduction planes of course, and it is possible apply the embodiment to all types of IC packages of the surface mounting type. The wiping by the tips of the extension portions 814f in this case is performed by having the projection 813c of the actuation shaft members 813c mentioned above move the IC package 1 in the horizontal direction. The present invention, however, is not limited to this configuration. The IC package 1 may be sandwiched between the base portion 812e and contact portions 814c provided on the base plate 812 as shown in FIG. 75. Further, in the 20th embodiment, the contact pins 814 are provided with first spring portions 814d and second spring portions 814e differing in directions of bias, but it is also possible to form a single spring portion for causing a bias force in the substantially bottom right direction in FIG. 71.

Figure 76:
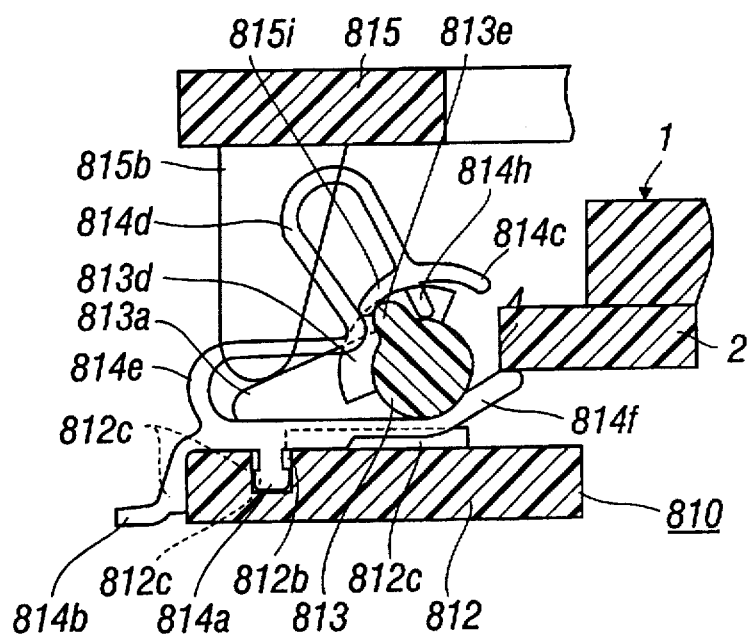
FIG. 76 is a vertical cross-sectional view showing an IC socket according to the 21st embodiment of the present invention.
Figure 77:
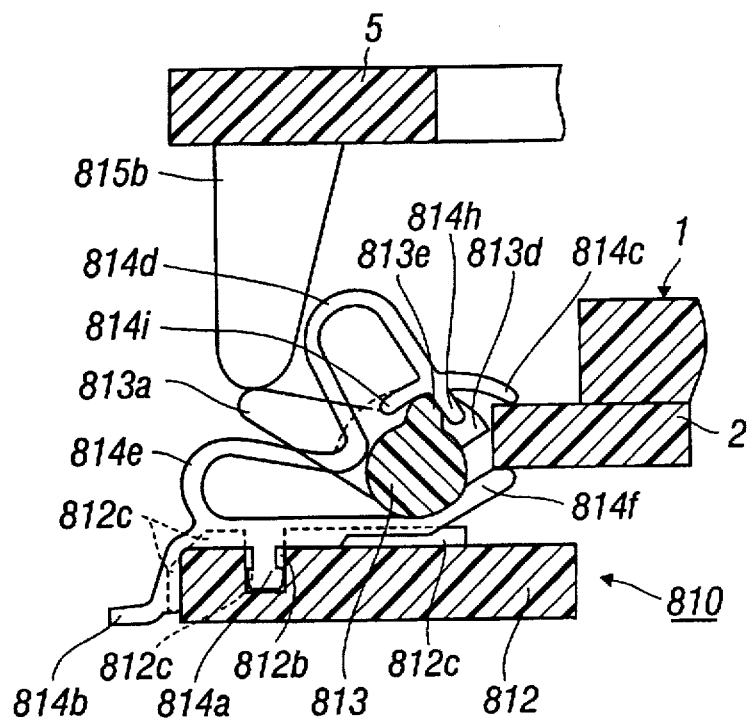
FIG. 77 is a vertical cross-sectional view of a part of the IC socket of the 21st embodiment in a state where the IC package is attached.

Next, an explanation will be made of the IC socket according to a 21st embodiment of the present invention using FIG. 76 and FIG. 77. FIG. 76 is a cross-sectional view showing the open state where the IC package can be detached in the same way as FIG. 74 used for explaining the 20th embodiment. FIG. 77 is a cross-sectional view showing the state of completion of mounting of the IC package in the same way as FIG. 71. In these figures, constituent elements similar to those of the 20th embodiment are given the same references. According, explanations of the configuration of the same will be omitted.

The point of difference from the 20th embodiment in the 21st embodiment is that the engagement portions formed between the actuation shaft members 813 and contact pins 814 are formed in a reverse relationship. That is, the actuation shaft members 813 are provided with single projections 813e and the contact pins are provided with two projections 814h and 814i. The relationships of convexity and concavity are reversed.

As shown in FIG. 76, when the IC package 810 is in the open state, the projections 814i of the first spring portions 814d of the contact pins 814 are pressed by the projections 813e in the counterclockwise direction and the projections 814h are pressed upward by the peripheral surface of the actuation shaft members 813. In this state, the pressing force of the cover 815 is released. If the actuation shaft members 813 are turned in the clockwise direction, the projections 814i follow the same while engaged with the projections 813e. Further, the contact portions 814c contact the terminal surface provided on the substrate 2 of the IC package 1 at substantially the neutral position of elasticity of the first spring portions 814d. The actuation shaft members 813 turn further in the clockwise direction from this state. Due to this, the projections 813e engage with the projections 814h and the first spring portions 814d press the projections 814h while being tensed. Accordingly, the above-mentioned wiping is performed, then the state of FIG. 77 is reached and the motion stops and the contact portions 814c are pressed against the IC package 1 by the action of the second spring portions 814e.

In the completed state of mounting of the IC package shown in FIG. 77, the arms 813a are positioned to block rotation by the operating portions 815b, but this would never occur. Accordingly, in the case of this embodiment, it is best that the position where the ribs 813d engage with the side surfaces of the substrate 2 be made the position of completion of mounting, but it is not particularly necessary to do this. It is also possible to provide a restraining means on the base plate 812 as mentioned above. Further, the operation at the time of replacing an IC package is performed by pressing down the cover 815, but as will be understood from the explanation of the 20th embodiment, this operation is performed in the reverse order as the case of the mounting operation and therefore an explanation will be omitted. Further, the configurations and actions other than those explained above for the 21st embodiment are similar to those of the 20th embodiment.

As explained above, in the 20th and 21st embodiments, one of the engagement portions of the actuation shaft members and the contact pins was made convex and the other made concave and engagement was made to be performed twice in succession by rotation of the actuation shaft members in one direction, so with one engagement the contact portions will detach from the IC package and with the other engagement wiping will be performed by the contact portions. Accordingly, it is possible to mount an IC package in a state with a good conduction.

I claim:

1. A socket assembly for accommodating an electrical component having a generally rectangular configuration and for electrically connecting a plurality of terminals arranged forming a row in parallel along each of at least opposite sides of said electrical component to a printed circuit board, comprising:

a socket body having a generally rectangular configuration;

a plurality of flat plate-like contact pins which are arranged forming a row in parallel along each of at least opposite sides of said socket body, each of said contact pins having a base portion and an arm which extends curved upward from said base portion, each said base portion having at one end thereof an upward contact portion for contact to one of said terminals of said electrical component and at the other end thereof a connecting portion for connection to said printed circuit board; and a plurality of sliders each of which is supported by said base portions and said arms of said contact pins in said row and is movable between an open position at which said electrical component can be loaded onto or unloaded from said contact portions of said contact pins in a direction perpendicular to the moving direction of said slider and a pressing position at which said slider is pressed against said electrical component by an elastic force of each of said arms so as to bring the terminals of said electrical component into press-contact with said contact portions of said contact pins in the row of said contact pins.

2. A socket assembly as set forth in claim 1, wherein said slider has an upper pressing portion for pressing against an upper surface of said electrical component and a lower abutment portion for pressing against a side surface of said electrical component.

3. A socket assembly as set forth in claim 1, wherein said slider has an upper surface for coming into sliding contact with said arms in said row of said contact pins and a lower surface for coming into sliding contact with said base portions in said row of said contact pins, and a plurality of ribs slidably fitted between said arms and said base portions in said row of said contact pins are formed on the upper surface and lower surface of said slider so as to form a row.

4. A socket assembly as set forth in claim 1, wherein each of said sliders has opposite end portions projecting longitudinally outward beyond said row of said contact pins and being engageable with a jig for moving each of said sliders between said open position and said pressing position, and wherein said socket body has a jig guide means for guiding said jig in a vertical direction perpendicular to the movement direction of said slider.

5. A socket assembly as set forth in claim 4, wherein said jig guide means has guide holes formed at four corners of said socket body and guide groove holes which adjoin said guide holes and are formed along opposite ends of the respective rows of said contact pins; pins positioned above said guide groove holes are provided on opposite ends of said sliders; said jig has guide posts for insertion into said guide holes and leg portions for insertion into said guide groove holes; and inward or outward inclined surfaces are formed at respective tips of said leg portions.

6. A socket assembly as set forth in claim 1, wherein a plurality of ribs respectively fitted between said base portions in said row of said contact pins are formed on said at least opposite sides of said socket body.

7. A socket assembly as set forth in claim 1 or 6, wherein engagement grooves extending along the row of said contact pins are formed on said at least opposite sides of said socket body, and projection portions for engagement with said engagement grooves are formed on said base portions of said row-forming contact pins.

8. A socket assembly for accommodating an electrical component having a plurality of terminals and for electrically connecting the electrical component to a printed circuit board, comprising:

a socket body;

a plurality of contact pins which are implanted on said socket body and arranged forming a row in parallel along at least one side of said socket body, each of said contact pins having a base portion and a contact portion formed at one end of said base portion for contact with one of said terminals of said electrical component;

a slider which is arranged along at least one side of said socket body and movable between an open position at which said electrical component can be loaded onto or unloaded from said contact portions of said contact pins in a direction perpendicular to the moving direction of said slider and a pressing position at which said slider can press against said electrical component to bring the terminals of said electrical component into press-contact with said contact portions of said contact pins; and a spring means which is arranged along at least one side of said socket body and gives a pressing force with respect to said electrical component to said slider, wherein each of said contact pins has a bent portion projected to one side of of said base portion, and said slider has a pressing portion for pressing against an upper surface of said electrical component and a plurality of engagement members engageable with said bent portions of said contact pins, and wherein said engagement members are adapted to pass said bent portions of said contact pins while resiliently displacing said contact pins laterally during a period when the pressing portion of said slider further advances along the upper surface of the electrical component after reaching the upper surface of the electrical component from the open position at which it retracts from the upper surface of the electrical component and thereby to rub each of said contact portions of said contact pins with one of said terminals of said electrical component.

9. A socket assembly as set forth in claim 8, wherein said engagement members of said slider are arranged on both side surfaces of said contact pins.

10. A socket assembly as set forth in claim 8, wherein bent portions of said contact pins are alternately projected in opposing directions in an order of arrangement of said contact pins.

11. A socket assembly as set forth in claim 8, wherein each of said contact pins is provided with a support portion extending downward from said base portion between said contact portion and said bent portion and having a lower end portion supported by said socket body.

\* \* \* \* \*